United States Patent [19]

Nakata et al.

[11] Patent Number: 6,005,401

[45] Date of Patent: *Dec. 21, 1999

[54] SEMICONDUCTOR WAFER PACKAGE, METHOD AND APPARATUS FOR CONNECTING TESTING IC TERMINALS OF SEMICONDUCTOR WAFER AND PROBE TERMINALS, TESTING METHOD OF A SEMICONDUCTOR INTEGRATED CIRCUIT, PROBE CARD AND ITS MANUFACTURING METHOD

[75] Inventors: Yoshirou Nakata, Nara; Toshio Yamada, Osaka; Atsushi Fujiwara, Kyoto; Isao Miyanaga; Shin Hashimoto, both of Osaka; Yukiharu Uraoka, Nara; Yasushi Okuda; Kenzou Hatada, both of Osaka, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/837,954

[22] Filed: Apr. 14, 1997

Related U.S. Application Data

[63] Continuation of application No. 08/358,609, Dec. 14, 1994, abandoned.

[30] Foreign Application Priority Data

| Dec. 16, 1993 | [JP] | Japan | 5-316293 |
| Dec. 21, 1993 | [JP] | Japan | 5-321663 |
| Apr. 21, 1994 | [JP] | Japan | 6-083108 |

[51] Int. Cl.[6] ............................................. G01R 1/073
[52] U.S. Cl. ........................ 324/754; 324/758; 324/760
[58] Field of Search .................................. 324/754, 758, 324/760, 765, 757

[56] References Cited

U.S. PATENT DOCUMENTS

| 3,405,361 | 10/1968 | Kattner et al. | 324/754 |
| 4,906,920 | 3/1990 | Huff et al. | 324/754 |
| 4,980,637 | 12/1990 | Huff et al. | 324/754 |
| 5,012,187 | 4/1991 | Littlebury | 324/754 |
| 5,225,037 | 7/1993 | Elder et al. | 324/754 |
| 5,461,326 | 10/1995 | Woith | 324/758 |
| 5,500,604 | 3/1996 | Swarbrick et al. | 324/754 |

FOREIGN PATENT DOCUMENTS

| 1-227467 | 9/1989 | Japan . |
| 3-102848 | 4/1991 | Japan . |
| 3-120742 | 5/1991 | Japan . |
| 4-151845 | 5/1992 | Japan . |
| 4-290244 | 10/1992 | Japan . |

*Primary Examiner*—Ernest Karlsen
*Attorney, Agent, or Firm*—McDermott, Will & Emery

[57] ABSTRACT

A retainer board, holding a semiconductor wafer having a plurality of integrated circuit terminals for testing a semiconductor chip, is provided in confronting relation to a probe sheet having a plurality of probe terminals electrically connected to their corresponding integrated circuit terminals. An insulating substrate, having wiring electrically connected to the plural probe terminals, is provided on the probe sheet in opposed relation to the retainer board. An elastic member is interposed between the probe sheet and the insulating substrate. The retainer board and the probe sheet are brought into so closer relationship that each integrated circuit terminal of the semiconductor wafer held by the retainer board is electrically connected to its corresponding probe terminal of the probe sheet.

8 Claims, 31 Drawing Sheets

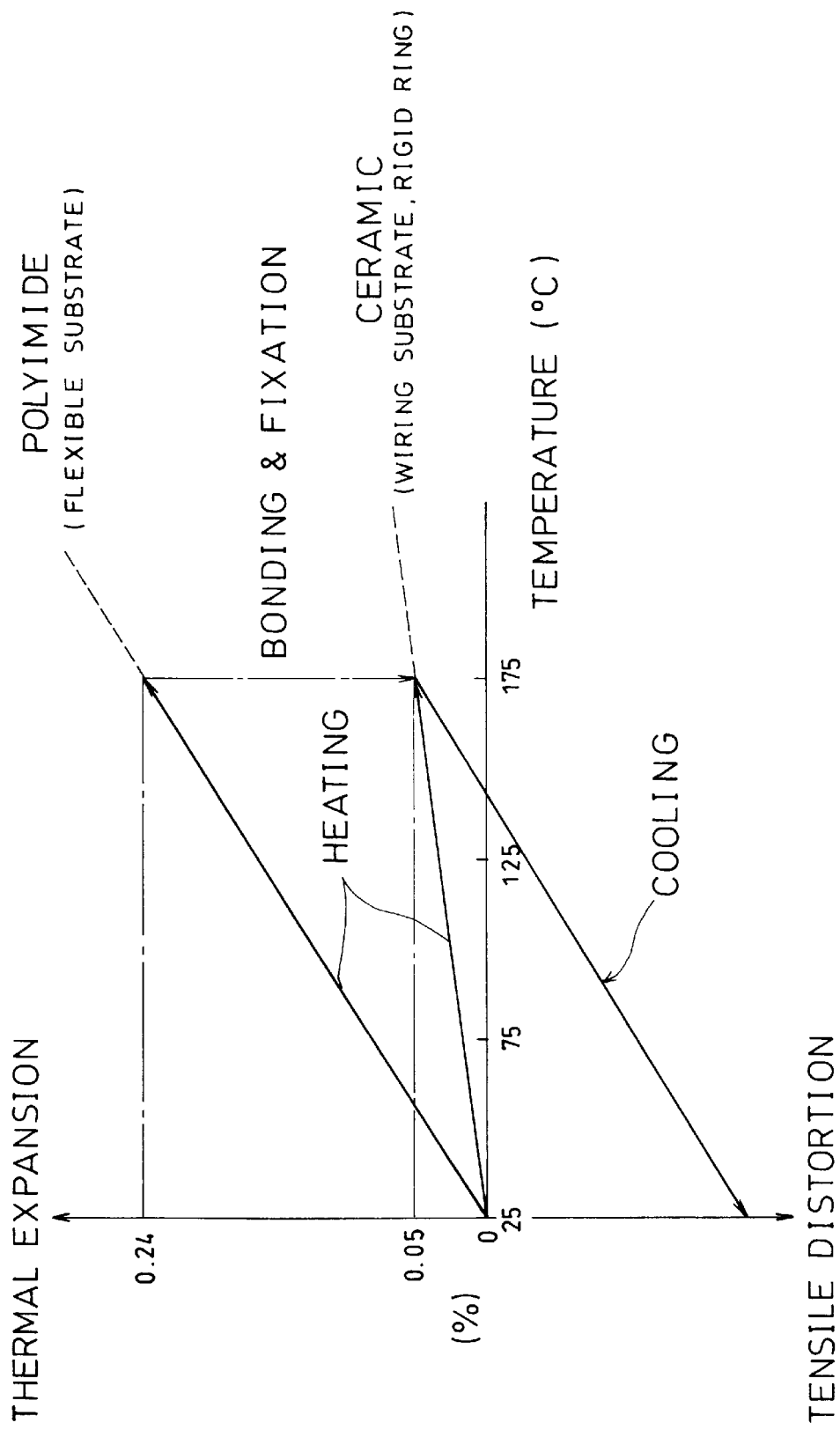

SEMICONDUCTOR WAFER PACKAGE, METHOD AND APPARATUS FOR CONNECTING TESTING IC TERMINALS OF SEMICONDUCTOR WAFER AND PROBE TERMINALS, TESTING METHOD OF A SEMICONDUCTOR INTEGRATED CIRCUIT, PROBE CARD AND ITS MANUFACTURING METHOD

This is a continuation application of application Ser. No. 08/358,609 filed Dec. 14, 1994, abandoned.

BACKGROUND OF THE INVENTION

The present invention relates to a technology for simultaneously testing a plurality of integrated circuits formed on a semiconductor wafer in a wafer condition.

Advances in size reduction and cost reduction of recent electronic components incorporating semiconductor IC (integrated circuit) devices are so remarkable that requirements to the size reduction and cost reduction of the semiconductor IC devices are becoming more severe.

In general, a manufacturing of a semiconductor IC device is as follows. First of all, a semiconductor chip and a lead frame are electrically connected with each other by means of a bonding wire. Thereafter, the semiconductor chip is sealed by resin or ceramic and then mounted on a printed board. However, the requirements of reducing the size of an electronic component have introduced a method of directly mounting on a circuit board a semiconductor IC device in a bare chip or chip condition to guarantee quality at low cost. The bare chip or chip condition generally represents a condition of semiconductor IC device which is just cut off a semiconductor wafer.

In order to guarantee quality of bare chips, it is necessary to execute a burn-in screening of a semiconductor IC device in the wafer condition.

However, the burn-in screening of the semiconductor wafer is complicated in handling the semiconductor wafer; thus, the requirement to low cost could not be satisfied. Furthermore, executing the burn-in screening of the plural bare chips on a semiconductor wafer is time-consuming since it requires to execute the burn-in screening separately and repeatedly one by ene or group by group. Thus, in view of time and cost, it does not bring practical merits.

Accordingly, it is earnestly required to realize a simultaneous execution of the burn-in screening of all the bare chips in the wafer condition.

FIG. 32 is a schematic view showing a testing method of a semiconductor wafer using a conventional prober. As shown in FIG. 32, a semiconductor wafer 202 is fixed on a wafer stage 201 provided in the prober. A probe card 204, having probe needles 203, . . . ,203 made of for example tungsten, is disposed above the semiconductor wafer 202. These probe needles 203, . . . ,203 are brought into contact with IC terminals on the semiconductor wafer 202, so that an electric power voltage or signal can be supplied to the integrated circuit by means of a tester or the like to detect an output signal from the integrated circuit chip by chip. For testing the same kind of integrated circuits in a short time, a full automatic prober is normally used since it has an alignment function and is capable of automatically executing a measurement of chip one by one. In FIG. 32, a reference numeral 205 represents a wiring pattern and a reference numeral 206 represents an external electrode terminal.

Hereinafter, a conventional testing method of a semiconductor wafer using a full automatic prober will be explained with reference to FIGS. 32 and 33.

First of all, in a step SB1, the semiconductor wafer 202 is automatically transported from a wafer carrier onto the wafer stage 201. Next, in a step SB2, positioning of the semiconductor wafer 202 is carried out using a CCD camera or the like so that IC terminals on the semiconductor wafer 202 can be brought into contact with the probe needles 203, . . . 203. Then, in a step SB3, the wafer stage 201 is shifted below the probe card 204 so that the semiconductor wafer 202 is placed below the probe card 204.

Subsequently, in a step SB4, the probe needles 203, . . . ,203 are brought into contact with the IC terminals on the semiconductor wafer 202. An electric power voltage or signal is applied to the integrated circuit to measure an output signal from the integrated circuit, thereby executing a test of the integrated circuit. After finishing the test of one integrated circuit, the wafer stage 201 is shifted to the next integrated circuit. Then, the probe needles 203, . . . ,203 are brought into contact with the terminals of the next integrated circuit to execute a measurement of the next integrated circuit.

According to the conventional testing method of a semiconductor wafer using a full automatic prober, a plurality of integrated circuits on the semiconductor wafer 202 are successively measured in the manner above-described. When the test of all the integrated circuits is completed, the semiconductor wafer 202 is returned from the wafer stage 201 to the wafer carrier in a step SB5. For a plurality of semiconductor wafers 202, . . . ,202, above-described steps are repeatedly executed to accomplish a measurement of each semiconductor wafer 202. When the measurement of all the semiconductor wafers 202 is finished, operation of the full automatic prober ends.

A method of shortening a test time per chip would be, for example, to provide a self test circuit (i.e. BIST circuit) to execute the burn-in screening (high-speed operation) of memories such as DRAM by means of a prober.

Executing the burn-in screening processing in the wafer condition according to the previously-described testing method of a semiconductor wafer using a prober would require a time not longer than 1 minute in total for the shifting of the semiconductor wafer 202 in the procedures of the steps SB1, SB3 and SB5 and the positioning of the semiconductor wafer 202 in the step SB2. However, the burn-in screening in the step SB4 usually requires several to several tens hours. The conventional testing method of a semiconductor wafer using a prober is disadvantageous in that it necessitates to test semiconductor wafers one by one. Accordingly, it takes an extremely long time to test a great amount of semiconductor wafers. This will results in a huge increase of cost for manufacturing an LSI chip.

Another disadvantage of the testing operation using an automatic prober is an exclusive usage of the probe during tests, because the alignment function cannot be used for tests for other kinds of semiconductor wafers or other purposes.

Providing a BIST circuit for shortening a test time per chip, applied to DRAM or the like, leads to an increase of a chip area and reduces the number of chips per wafer, thus causing a problem of increasing chip cost.

To execute the burn-in screening of bare chips at a time in the wafer condition, it is necessary to simultaneously apply an electric power voltage or signal to a plurality of chips formed on the same wafer, to operate all of these plural chips. To this end, it will be necessary to prepare a probe card having numerous probe needles (e.g. several thousands or more). However, the conventional needle type probe card cannot meet such a need in view of great number of pins and cost increase.

Proposed to solve such a problem is a thin film type probe card having bumps on a flexible substrate (Refer to Nitto Technical Reports Vol. 28, No. 2 (October 1990) PP. 57–62)

Hereinafter, the burn-in screening using a flexible substrate with bumps will be explained.

FIGS. 34(a) and 34(b) are cross-sectional views illustrating the probing condition when a flexible substrate with bumps is used. In FIGS. 34 (a) and 34(b), a reference numeral 211 represents a probe card which comprises a polyimide substrate 218, a wiring layer 217 formed on the polyimide substrate 218, bump electrodes 216, . . . ,216, and a through hole wiring connecting the wiring layer 217 and the bump electrodes 216, . . . ,216.

As illustrated in FIG. 34(a), the probe card 211 is pushed against a semiconductor wafer 212 serving as a tested substrate so that a pad 215 on the semiconductor wafer 212 is electrically connected to a corresponding bump 216 of the probe card 211. If testing condition is in a room temperature, a test will be feasible in this condition by simply applying an electric power voltage or signal to the bump 216 via the wiring layer 217.

However, a diameter of the semiconductor wafer 212 possibly increases up to, foe example, 6 inches in the probing using the conventional probe card 211, causing deflection of the semiconductor wafer 212 and/or unevenness in height of the bump 216 which lead to a first problem of making some of electrical connections useless between the bumps 216, . . . ,216 and the pads 215, . . . ,215.

The burn-in screening generally requires a step of increasing the temperature of the semiconductor wafer 212 to execute temperature acceleration. FIG. 34(b) shows a cross-sectional structure of the semiconductor wafer 212 heated from the room temperature 25° C. to 125° C. In FIG. 34(b), the left-hand portion shows condition of a center of the semiconductor wafer 212, while the right-hand portion shows condition of a periphery of the semiconductor wafer 212.

Polyimide constituting the polyimide substrate 218 has a thermal expansion coefficient larger than that of silicon constituting the semiconductor wafer 212. (More specifically, the thermal expansion coefficient of polyimide is $16 \times 10^{-6}$/° C., while the thermal expansion coefficient of silicon is $3.5 \times 10^{-6}$/° C.) Thus, dislocation between the bump 216 and its corresponding pad 215 is found at the peripheral portion of the semiconductor wafer 212. More specifically, if the semiconductor wafer 212 of 6 inches and the probe card 211 are aligned in position at a room temperature and then heated to 100° C., the probe card 211 will cause a thermal expansion of 160 $\mu$m while the semiconductor wafer 212 will cause a thermal expansion of 35 $\mu$m. In other words, a dislocation between the pad 215 and the bump 216 will increase up to an approximately 125 $\mu$m at the outermost periphery of the semiconductor wafer 212. Such a dislocation due to difference of thermal expansion is so serious that electrical connection between the pad 215 and its corresponding bump 216 cannot be maintained in the peripheral region of the semiconductor wafer 212.

As explained above, according to the conventional burn-in screening, the semiconductor wafer is heated during the burn-in screening. The probe card brought into contact with the semiconductor wafer is also heated. Thus, difference of thermal expansion coefficients between the semiconductor wafer and the probe card causes a serious dislocation therebetween, resulting in a second problem that electrical connection between a pad and its corresponding bump cannot be maintained at the periphery of the semiconductor wafer.

To execute the burn-in screening of bare chips in the wafer condition, it is necessary to operate each bare chip by simultaneously applying an electric power voltage or signal to a plurality of bare chips formed on a single semiconductor wafer. However, supplying an electric power voltage or signal to each bare chip independently is not practical in view of cost since the number of wiring patterns exclusively formed on the semiconductor wafer increases up to several thousands or several tens thousands. To reduce the number of independently or exclusively provided wiring patterns, it is necessary to commonly use the wiring patterns as many as possible.

However, if extraordinary current flows through one bare chip connected to such a common wiring pattern, adverse effect of extraordinary current will spread to other bare chips associated. Thus, it becomes impossible to execute an ordinary burn-in screening.

Accordingly, in executing the burn-in screening, it is necessary to electrically remove such an extraordinary bare chip from the common wiring pattern.

Hereinafter, a method disclosed in the Unexamined Japanese Patent Application No. HEI 1-227467/1989 will be explained as one example of the burn-in screening of bare chips in the wafer condition.

FIG. 35 shows one of plural bare chips formed on a semiconductor wafer. In FIG. 35, a reference numeral 240 represents a bare chip, a reference numeral 243 represents an electric power source pad of the bare chip 240, a reference numeral 244 represents a GND pad of the bare chip 240, a reference numeral 241 represents a burn-in electric power source pad, and a reference numeral 242 represents a P-channel type transistor. The transistor 242 has a drain connected to the burn-in electric power source pad 241 and a source connected to the electric power source pad 243. Furthermore, in FIG. 35, a reference numeral 245a represents a first pad connected to the gate of transistor 242, and reference numerals 245b and 245c represent second and third pads respectively connected to the first pad 245a via a thin aluminum pattern of, for example, 3 um width. A first resistance 246a is interposed between the GND pad 244 and the second pad 245b. This first resistance 246a has a relatively low resistant value (e.g. 10 k$\Omega$). A second resistance 246b is interposed between the burn-in electric power source pad 241 and the third pad 245c. This second resistance 246b has a relatively high resistant value (e.g. 100 k$\Omega$).

First of all, before a burn-in screening, a wafer test is executed by probing electric power source pad 243, GND pad 244, first to third pads 245a–245c using a stationary probe needle (not shown) connected to an external measurement device (not shown). The external measurement device applies an electric power voltage to the electric power source pad 243 and applies a GND voltage to the GND pad 244. Furthermore, the first pad 245a is given an "H" level signal. As the transistor 242 is in an OFF condition under such a condition, no current flows between the electric power source pad 243 and the burn-in pad 241. Thus, a test of the bare chip 240 is feasible.

When the bare chip 240 is found to be a non-defective as a result of the test of the bare chip 240, the next bare chip is subsequently tested. On the contrary, if the bare chip 240 is found to be a defective, the external measurement device supplies large current (e.g. 100 mA) between the first pad 245a and the second pad 245b to fuse the shin aluminum pattern interposed between the first pad 245a and the second pad 245b before going on a test of the next bare chip.

By doing the wafer test in this manner before the burn-in screening, the burn-in screening can be effectively carried out. More specifically, when the burn-in electric power source pad 241 is applied an electric voltage in the burn-in screening, the transistor 242 is turned on in the case the bare chip 240 is found a non-defective in the wafer test because the gate voltage of the transistor 242 becomes an "L" level due to existence of the second resistance 246b having a resistant value larger than that of the first resistance 246a. Thus, the burn-in voltage is supplied to the electric power source pad 243 through the transistor 242. On the other hand, the thin aluminum pattern between the first pad 245a and the second pad 245b is fused off in a case the bare chip 240 is found a defective in the wafer test. Therefore, the gate voltage of the transistor 242 becomes an "H" level, and the transistor 242 is turned off. Thus, the burn-in voltage is not supplied to the electric power source pad 243, preventing electric current from flowing through the defective bare chip 240.

As described above, electric power source current is surely prevented from flowing through the defective chip even if an electric voltage is applied to the burn-in electric power source pad 241. Hence, adverse effect is not given to the non-defective chips in the burn-in screening.

However, above-described arrangement requires to form on each bare chip 240 excessive elements such as transistor 242, first and second resistances 246a, 246b, burn-in electric power source pad 241, first to third pads 245a–245c and aluminum pattern acting as a fuse. Furthermore, an electric voltage is applied through the transistor 242 in the burn-in screening and, therefore, an electric voltage applied to the burn-in electric power source pad 241 is not directly applied to the internal electric power source. Thus, a third problem arises in that a significant voltage drop is induced in the bare chip 240.

SUMMARY OF THE INVENTION

Accordingly, in view of above-described problems encountered in the prior art, a first object of the present invention is to surely bring all the probe terminals of a probe sheet into contact with all the testing terminals of a semiconductor wafer even if a diameter of the semiconductor wafer is increased, and to simultaneously execute a burn-in screening with respect to a plurality of semiconductor wafer.

A second object of the present invention is to surely bring the bump of the probe sheet into contact with the testing terminal of the semiconductor wafer even in the periphery of a large-diameter semiconductor wafer in the burn-in screening.

A third object of the present invention is to surely prevent a defective chip from being supplied with electric power voltage in the burn-in screening.

A technology for accomplishing the first object will be hereinafter described.

The present invention provides a first semiconductor wafer package comprising: a retainer board for holding a semiconductor wafer having a plurality of integrated circuit terminals for testing a semiconductor chip; a probe sheet confronting with the retainer board and having a plurality of probe terminals to be electrically connected to the integrated circuit terminals corresponding thereto; an insulating substrate provided on the probe sheet in opposed relation to the retainer board and having a wiring electrically connected to the plural probe terminals; an external electrode electrically connected to the wiring for receiving an electric power voltage or signal for test; an elastic member interposed between the probe sheet and the insulating substrate; and pressing means for pressing at least either of the retainer board and the insulating substrate in such a manner that the retainer board and the probe sheet are brought into so closer relationship that each integrated circuit terminal of the semiconductor wafer held by the retainer board is electrically connected to the probe terminals of the probe sheet which correspond thereto.

According to the first semiconductor wafer package, when the pressing means presses at least either of the retainer board and the insulating substrate, the retainer board and the probe sheet are brought into so closer relationship that each integrated circuit terminal of the semiconductor wafer held by the retainer board is electrically connected to its corresponding probe terminal of the probe sheet. In this case, the probe sheet is pressed via the elastic member; therefore, the elastic member absorbs unevenness of probe terminal height of probe sheet. With this arrangement, each integrated circuit terminal of the semiconductor wafer is surely connected to each probe terminal of the probe sheet, and a pressing force is uniformly applied on each probe terminal. Thus, a contact resistance between the integrated circuit terminal and the probe terminal can be reduced, and a uniform input waveform can be supplied to each integrated circuit terminal of the semiconductor wafer, thus improving detecting accuracy.

The elastic member, interposed between the probe sheet and the insulating substrate, acts as cushioning member preventing the semiconductor wafer from being damaged when the insulating substrate is disposed on the semiconductor wafer or when the semiconductor wafer package is transported.

By controlling the temperature of the semiconductor wafer package, the temperature of the semiconductor wafer can be controlled. When an electric power voltage or signal is input to the external electrode for testing, the testing electric power voltage or signal is supplied to the probe terminal via the wiring of the insulating substrate, and subsequently supplied to the integrated circuit terminal of the semiconductor wafer. Accordingly, it becomes possible to separate an alignment step of aligning the semiconductor wafer and the probe sheet, an temperature control step of controlling the temperature of the semiconductor wafer, and an input step of inputting the electric power voltage or signal to the integrated circuit of the semiconductor wafer from each other. Thus, numerous semiconductor wafers can be tested at the same time.

It is preferable that the first semiconductor wafer package further comprises a seal member disposed between the retainer board and the insulating substrate for forming a hermetical space defined between the retainer board and the insulating substrate. And, the pressing means is high-pressure fluid of gas or liquid supplied to the hermetical space.

With this arrangement, when the high-pressure fluid of gas or liquid is supplied to the hermetical space, the insulating substrate presses the probe sheet toward the semiconductor wafer and, therefore, each integrated circuit terminal of the semiconductor wafer can be surely connected to its corresponding probe terminal.

It is further preferable that in the first semiconductor wafer package that the retainer board has means for sucking the semiconductor wafer and fixing the semiconductor wafer to the retainer board.

With this arrangement, the semiconductor wafer can be surely fixed to the retainer board.

The present invention provides a second semiconductor wafer package comprising: a retainer board for holding a semiconductor wafer having a plurality of integrated circuit terminals for testing a semiconductor chip; a probe sheet confronting with the retainer board and having a plurality of probe terminals to be electrically connected to the integrated circuit terminals corresponding thereto; an insulating substrate provided on the probe sheet in opposed relation to the retainer board and having a wiring electrically connected to the plural probe terminals; an external electrode electrically connected to the wiring for receiving an electric power voltage or signal for test; and temperature detecting means for detecting temperature of the semiconductor wafer held by the retainer board.

According to the second semiconductor wafer package, in the same manner as in the first semiconductor wafer package, not only numerous semiconductor wafers can be simultaneously tested but the temperature of each semiconductor wafer can be detected by the temperature detecting means when the numerous semiconductor wafers are simultaneously tested, thereby assuring temperature control of the semiconductor wafer.

The present invention provides a third semiconductor wafer package comprising: a retainer board for holding a semiconductor wafer having a plurality of integrated circuit terminals for testing a semiconductor chip; a probe sheet confronting with the retainer board and having a plurality of probe terminals electrically connected to their corresponding integrated circuit terminals; an insulating substrate provided on the probe sheet in opposed relation to the retainer board and having a first wiring electrically connected to the plural probe terminals; a pressing board provided on the probe sheet in opposed relation to the retainer board and having a second wiring electrically connected to the first wiring; a seal member disposed between the retainer board and the pressing board for forming a hermetical space defined between the retainer board and the pressing board; pressure reducing means for reducing pressure of the hermetical space in such a manner that the retainer board and the probe sheet are brought into so closer relationship that each integrated circuit terminal of the semiconductor wafer held by the retainer board is electrically connected to the probe terminal of the probe sheet which corresponds thereto; and an external electrode electrically connected to the second wiring for receiving an electric power voltage or signal for test.

According to the third semiconductor wafer package, numerous semiconductor wafers can be simultaneously tested in the same manner as in the first semiconductor wafer package. Furthermore, when the pressure of the hermetical space formed between the retainer board and the pressing board is reduced, the retainer board and the probe sheet are brought into so closer relationship that each integrated circuit terminal of the semiconductor wafer is electrically connected to its corresponding probe terminal of the probe sheet.

The present invention provides a fourth semiconductor wafer package comprising: a retainer board for holding a semiconductor wafer having a plurality of integrated circuit terminals for testing a semiconductor chip; a probe sheet confronting with the retainer board and having a plurality of probe terminals to be electrically connected to the integrated circuit terminals corresponding thereto; an insulating substrate provided on the probe sheet in opposed relation to the retainer board and having a wiring electrically connected to the plural probe terminals; a rigid board provided on the insulating substrate in opposed relation to the retainer board; a pressing bag made of elastic member interposed between the insulating substrate and the rigid member; fixing means for fixing the insulating substrate and the rigid board in such a manner that the pressing bag is interposed between the insulating substrate and the rigid board; a casing accommodating the retainer board, the probe sheet, the insulating substrate, the rigid board, the pressing bag and the fixing means; pressure reducing means for reducing pressure of gas in the casing in such a manner that the retainer board and the probe sheet are brought into so closer relationship that each integrated circuit terminal of the semiconductor wafer held by the retainer board is to be electrically connected to the probe terminals of the probe sheet which are corresponding thereto; and an external electrode electrically connected to the wiring for receiving an electric power voltage or signal for test.

According to the fourth semiconductor wafer package, numerous semiconductor wafers can be simultaneously tested in the same manner as in the first semiconductor wafer package.

When the inside pressure of the casing is reduced, the pressing bag interposed between the insulating substrate and the rigid member inflates. An inflation of the pressing bag is converted into a pressing force transmitted to the probe sheet via the insulating substrate. Thus, the probe sheet and the semiconductor wafer are brought into so closer relationship that each probe terminal of the probe sheet can be surely electrically connected to its corresponding integrated circuit terminal of the semiconductor wafer.

It is preferable that the fourth semiconductor wafer package further comprises communicating means for communicating the inside of the pressing bag to the outside of the casing. With this arrangement, even if the inside pressure of the casing is increased by air introduced into the casing, it is possible to increase the pressure of the pressing bag so as to constantly maintain a pressing force applied from the pressing bag to the probe sheet via the insulating substrate. Hence, an electrical connection between each probe terminal of the probe sheet and each integrated circuit terminal of the semiconductor wafer can be electrically maintained.

It is further preferable that the first to fourth semiconductor wafer packages comprise temperature control means for controlling the temperature of the semiconductor wafer held by the retainer board.

The present invention provides an apparatus for connecting a plurality of testing integrated circuit terminals of a semiconductor wafer and a plurality of probe terminals, comprising: a casing; a partition board slidably housed in the casing for separating an inside space of the casing into first and second regions; a retainer board, provided in the first region, for holding the semiconductor wafer; an insulating substrate provided in the first region so as to confront with the retainer board and having a plurality of probe terminals; and pressure control means for increasing pressure of the second region compared with pressure of the first region so that the partition board shifts toward the first region until each probe terminal of the insulating substrate is electrically connected to its corresponding testing integrated circuit terminal of the semiconductor wafer held by the retainer board.

According to this connecting apparatus, when the pressure of the second region becomes higher than that of the first region, the diaphragm shifts toward the first region. Thus, each probe terminal of the insulating substrate is electrically connected to each testing integrated circuit terminal of the semiconductor wafer held by the retainer board.

In other words, this connecting device requires the semiconductor wafer package to have no pressing means for bringing the probe sheet into closer relationship to the semiconductor wafer, for electrically connecting each probe terminal of the insulating substrate to each testing integrated circuit terminal of the semiconductor wafer.

The present invention provides a method for connecting a plurality of testing integrated circuit terminals of a semiconductor wafer and a plurality of probe terminals of a probe sheet, comprising: a first step of holding the semiconductor wafer at a central region of a retainer board having an elastic seal member along a periphery thereof; a second step of disposing the probe sheet on the semiconductor wafer in such a manner each probe terminal confront with its corresponding testing integrated circuit terminal; a third step of disposing a pressing board on the elastic seal member of the retainer board to form a hermetical space defined by the retainer board, the elastic seal member and the pressing board; and a fourth step of reducing pressure of the hermetical space in such a manner that the retainer board and the pressing board are brought into so closer relationship that each probe terminal is electrically connected to its corresponding testing integrated circuit terminal.

According to this connecting method, when the pressure of the hermetical space is reduced, the retainer board and the pressing board are brought into so closer relationship that each probe terminal of the probe sheet is electrically connected to its corresponding testing integrated circuit terminal of the semiconductor wafer held by the retainer board.

It is preferable that the above-described connecting method further comprises a pressing step, between the second step and the third step, for pressing at least either of the retainer board and the pressing board in advance so that each testing integrated circuit terminal is electrically connected to its corresponding probe terminal.

With this arrangement, the pressure of the hermetical space can be reduced in a condition that each testing integrated circuit terminal is brought into contact with each probe terminal. Thus, no positional dislocation is caused between the testing integrated circuit terminal and the probe terminal.

The present invention provides a testing method of a semiconductor integrated circuit comprising: a first step of holding a semiconductor wafer by a retainer board, the semiconductor wafer having a plurality of integrated circuit terminals for testing a semiconductor chip; a second step of disposing a probe sheet having a plurality of probe terminals on the semiconductor wafer in such a manner that each probe terminal is electrically connected to its corresponding integrated circuit terminal; a third step of disposing an insulating substrate having wiring electrically connected to each probe terminal and an external electrode receiving an electric power voltage or signal for test in such a manner that each probe terminal is electrically connected to its corresponding external electrode by way of the wiring; and a fourth step of inputting an electric power voltage or signal to the external electrode to input the electric power voltage or signal to the integrated circuit terminal by way of the wiring and the plural probe terminals.

According to the testing method of the semiconductor integrated circuit, when an electric power voltage or signal is input to the external electrode, the electric power voltage or signal is input to the integrated circuit terminal of the semiconductor wafer by way of the wiring of the insulating substrate and the probe terminal of the probe sheet. Therefore, it becomes possible to separate the alignment step of aligning the semiconductor wafer and the probe sheet from the input step of inputting the electric power voltage or signal to the integrated circuit of the semiconductor wafer. Hence, numerous semiconductor wafers can be simultaneously tested.

In the testing method of the semiconductor integrated circuit, it is preferable that the first step comprises a step of heating the semiconductor wafer held by the retainer board to a predetermined temperature, or there is further provided a fifth step of heating the semiconductor wafer held by the retainer board to a predetermined temperature.

By doing so, the burn-in screening of the semiconductor wafer can be executed.

Hereinafter, a probe card accomplishing the above-described second object and its manufacturing method will be explained.

The present invention provides a first probe card testing electric characteristics of a chip formed on a semiconductor wafer, comprising: a flexible substrate made of elastic member having a probe terminal on one main surface thereof; and a rigid member fixing the periphery of the flexible substrate, wherein the flexible substrate is fixed by the rigid member in a condition that always maintains tensile distortion within a temperature range from the room temperature to a testing temperature.

According to the first probe card, the flexible substrate is fixed by the rigid member in a condition that always maintains tensile distortion within a temperature range from the room temperature to a testing temperature. Therefore, when the probe card is heated in the test, relaxation of tensile distortion is found and expansion in the flexible substrate follows to expansion in the rigid member. Hence, when a expansion rate of the rigid member is equal to that of the semiconductor wafer, no dislocation occurs between the probe terminal and the integrated circuit terminal of the semiconductor wafer to be tested even in the periphery of the semiconductor wafer.

It is preferable in the first probe card that the rigid member has a first terminal formed on one main surface of the rigid member and a wiring layer electrically connected to the first terminal, the flexible substrate has a second terminal formed on the other main surface thereof and electrically connected to the probe terminal, and the flexible substrate is fixed to the rigid member in such a manner that the first terminal confronts with the second terminal and is electrically connected with each other.

With this arrangement, when the electric power voltage or signal is input to the wiring layer of the rigid member, this electric power voltage or signal is transmitted to the probe terminal by way of the first terminal of the rigid member and the second terminal of the flexible substrate. Thus, the electric power voltage or signal is surely input to the integrated circuit terminal of the semiconductor wafer to be tested.

It is preferable that the first probe card further satisfies a relation N1<L2/(L1×T1), where N1 represents a difference between a thermal expansion coefficient of a semiconductor wafer to be tested and a thermal expansion coefficient of the rigid member, L1 represents a diameter of the semiconductor wafer, L2 represents a short diameter of a testing electrode terminal provided on the semiconductor wafer, and T1 represents a difference between a testing temperature and an alignment temperature.

With this arrangement, the difference between the thermal expansion coefficient of the semiconductor wafer and the thermal expansion coefficient of the rigid member does not become large. Therefore, the positional displacement between the outermost integrated circuit terminal of the semiconductor wafer and the outermost probe terminal of the probe card can be surely prevented.

It is further preferable in the first probe card that a thermal expansion coefficient of the flexible substrate is larger than a thermal expansion coefficient of the rigid member, and the tensile distortion of the flexible substrate is uniformly distributed along the surface of the flexible substrate at an alignment temperature and is not smaller than T×N, where N represents a difference between the thermal expansion coefficient of the flexible substrate and the thermal expansion coefficient of the rigid member white T represents a difference between an alignment temperature for aligning the probe card with respect to the semiconductor wafer to be tested and the testing temperature for testing the semiconductor wafer.

With this arrangement, even if the flexible substrate is heated up to the burn-in screening temperature, the flexible substrate always maintains a tensile distortion. When the expansion rate of the rigid member is equal to that of the semiconductor wafer, expansion in the flexible substrate follows to expansion in the semiconductor wafer. Thus, thermal expansion of the flexible substrate is so suppressed that no positional displacement is caused between the probe terminal of the flexible substrate and the integrated circuit terminal of the semiconductor wafer in both the alignment and the test.

It is further preferable in the first probe card that the flexible substrate is fixed to the rigid member at a ring-shaped bonding region of the rigid member, and the bonding region has an inner periphery of circle.

With this arrangement, when the rigid member is expanded by heat, the forces applied to the rigid member and the ring-shaped bonding region are uniform in all points of the circle. Accordingly, the distortion in the rigid member does not occur and the adhesive intensity becomes maximum.

The present invention provides a second probe card testing electric characteristics of a chip formed on a semiconductor wafer, comprising: a flexible substrate made of elastic member having a probe terminal on one main surface thereof; a rigid member fixing the periphery of the flexible substrate; and temperature control means for uniformly increasing temperature of the rigid member, wherein the rigid member has a thermal expansion coefficient equal to or larger than a thermal expansion coefficient of the flexible substrate.

As the rigid member has the thermal expansion coefficient equal to or larger than that of the flexible substrate, it is possible to expand the flexible substrate according to the thermal expansion of the rigid member by controlling the temperature of the rigid member using the temperature control means in the test. Hence, no positional dislocation occurs between the probe terminal of the flexible substrate and the and the integrated circuit terminal of the semiconductor wafer even in the periphery of the semiconductor wafer.

It is preferable in the second probe card that the temperature control means comprises a thermocouple detecting the temperature of the rigid member and a heater heating the rigid member, in order to surely execute the temperature control if the rigid member.

The present invention provides a first manufacturing method of a probe card testing electric characteristics of a chip constituting a semiconductor wafer, comprising: a step of thermally expanding a flexible substrate made of elastic member having a probe terminal on one main surface thereof by heating the flexible substrate; and a step of fixing the periphery of the flexible substrate by a rigid member under a condition that the flexible substrate is thermally expanded.

According to the first manufacturing method, the rigid member fixes the periphery of the flexible substrate in a thermally expanded condition. Thus, it becomes possible that the flexible substrate can simply and surely maintain a uniform tensile distortion.

The present invention provides a second manufacturing method of a probe card testing electric characteristics of a chip constituting a semiconductor wafer, comprising: a step of fixing a periphery of a flexible substrate made of elastic member having a probe terminal on one main surface thereof by a rigid member at a room temperature; and a step of heating the flexible substrate fixed by the rigid member and then cooling down the flexible substrate to the room temperature to cause heating contraction on the flexible substrate, thereby generating a tension on the flexible substrate.

According to the second manufacturing method, the flexible substrate fixed by the rigid member is cooled down to the room temperature after being heated so as to cause the heating contraction on the flexible substrate. Therefore, it becomes possible to make the flexible substrate maintain the tensile distortion without generation size shift.

Accordingly, the first or second manufacturing method makes it possible to simply and accurately manufacture the first probe card.

The present invention provides a third probe card testing electric characteristics of a chip formed on a semiconductor wafer, comprising: an insulating substrate having a first terminal formed on one main surface and a wiring electrically connected to the first terminal; a flexible substrate having a second terminal formed on one main surface and a probe terminal formed on the other main surface and electrically connected to the second terminal, the one main surface confronting with one main surface of the insulating substrate; an anisotropic conductive film interposed between the insulating substrate and the flexible substrate, the anisotropic conductive film being made of elastic member and having conductivity only in a direction perpendicular to a main surface thereof, wherein the flexible substrate is fixed to the insulating substrate laying the anisotropic conductive film between the flexible substrate and the insulating substrate, and the first terminal is electrically connected to the second terminal via the anisotropic conductive film.

According to the third probe card, when an electric power voltage or signal is input to the wiring of the insulating substrate, this electric power voltage or signal is transmitted to the probe terminal via the first terminal of the insulating substrate and the second terminal of the flexible substrate. Thus, the electric power voltage or signal is surely input to the integrated circuit terminal of the semiconductor wafer to be tested.

Even if the semiconductor wafer is thermally expanded in the test and there is a difference between the flexible substrate and the semiconductor wafer in the thermal expansion coefficient, such a difference in the thermal expansion coefficient can be absorbed by the deflection between bumps on the flexible substrate since the bumps of the flexible substrate are brought into contact with the semiconductor wafer in the test. Furthermore, the anisotropic conductive film is fixed to the insulating substrate having a significant rigidity. Hence, the deformation caused by thermal expansion of the anisotropic conductive film is suppressed by the insulating substrate. Therefore, even in the periphery of the semiconductor wafer, no positional dislocation occurs between the probe terminal and the integrated circuit terminal of the semiconductor wafer.

Furthermore, the anisotropic conductive film, made of elastic member and interposed between the insulating substrate and the flexible substrate, can absorb irregularity of the semiconductor wafer and unevenness of probe terminal height of the flexible substrate.

It is preferable in the third probe card that the anisotropic conductive film has a region protruding toward the flexible substrate, the region connecting to the second terminal of the flexible substrate or that the anisotropic conductive film has a region electrically connecting the first terminal with the second terminal, the region being thicker than other region.

With this arrangement, the pushing force applied to the flexible substrate is concentrated to the probe terminal of the flexible substrate efficiently, therefore the pushing force applied to the flexible substrate becomes smaller and the structure of probing apparatus becomes simpler.

It is preferable that in the third probe card that an allowable current density at a first conductive region of the anisotropic conductive film conducting the first and second terminals is lower than an allowable current density at a second conductive region of the flexible substrate conducting the second terminal and the probe terminal, thereby enlarging a conductive cross section of the first conductive region compared with a conductive cross section of the second conductive region.

With this arrangement, a resistance of the anisotropic conductive film can be lowered.

The present invention provides a fourth probe card testing electric characteristics of a chip formed on a semiconductor wafer, comprising: a rigid insulating substrate having a terminal formed on one main surface and wiring electrically connected to the terminal; and an anisotropic conductive film having one main surface brought into contact with and fixed to the one main surface of the insulating substrate and the other main surface having a probe terminal at a portion corresponding to the terminal, the anisotropic conductive film being made of elastic member and having conductivity only in a direction perpendicular to a main surface thereof, wherein the terminal and the probe terminal are electrically connected via the anisotropic conductive film.

According to the fourth probe card, when an electric power source voltage or signal is input to the wiring of the insulating substrate, this electric power source voltage or signal is transmitted to the probe terminal of the anisotropic conductive film via the terminal of the insulating substrate. Therefore, the electric power source voltage or signal is surely input to the integrated circuit terminal of the semiconductor wafer to be tested.

According to the fourth probe card, the anisotropic conductive film is fixed to the insulating substrate having a significant rigidity. Therefore, thermal expansion of the anisotropic conductive film is suppressed by the insulating substrate. Hence, even in the periphery of the semiconductor wafer, no positional dislocation occurs between the probe terminal and the integrated circuit terminal of the semiconductor wafer.

According to the fourth probe card, the anisotropic conductive film made of elastic member can absorb irregularity of the semiconductor wafer and unevenness of probe terminal height of the flexible substrate. Moreover, the probe terminal directly formed on the anisotropic conductive film can easily break a surface protecting film formed on the integrated circuit terminal of the semiconductor wafer. Hence, a connection between the probe terminal and the integrated circuit terminal is ensured.

It is preferable that the third or fourth probe card further satisfies a relation N1<L2/(L1×T1), where N1 represents a difference between a thermal expansion coefficient of a semiconductor wafer to be tested and a thermal expansion coefficient of the insulating substrate, L1 represents a diameter of the semiconductor wafer, L2 represents a short diameter of a testing electrode terminal provided on the semiconductor wafer, and T1 represents a difference between a testing temperature and an alignment temperature.

With this arrangement, the difference between the thermal expansion coefficient of the semiconductor wafer and the thermal expansion coefficient of the insulating substrate does not become large. Therefore, the positional displacement between the outermost integrated circuit terminal of the semiconductor wafer and the outermost probe terminal of the probe card can be surely prevented.

A testing method of a semiconductor integrated circuit accomplishing the above-described third object will be explained.

The present invention provides a testing method of a semiconductor integrated circuit comprising: a first step of providing a testing integrated circuit terminal to each chip of a semiconductor wafer, the testing integrated circuit terminal to be connected to a corresponding probe terminal of a probe sheet in a burn-in screening, the probe sheet having a wiring including a common electric power line or signal line, the probe terminal to be electrically connected to the wiring; a second step of testing electric characteristics of each chip; a third step of forming a non-conductive layer covering a testing integrated circuit terminal of a defective chip found in the second step; and a fourth step of executing the burn-in screening by simultaneously bringing a plurality of testing integrated circuit terminals of chips on the semiconductor wafer into contact with corresponding probe terminals.

In the test prior to the burn-in screening, an electric power voltage or signal is not supplied to the testing integrated circuit terminal of the defective chip. Therefore, the electrical isolation of the defective chip is easily and surely done. Accordingly, the burn-in screening can be applied on non-defective chips only.

It is preferable in the above-described testing method of the semiconductor integrated circuit that the third step comprises a step of coating non-conductive liquid on the testing integrated circuit terminal of the defective chip and a step of curing the non-conductive liquid.

With this arrangement, the non-conductive layer can be easily and surely formed.

It is further preferable in the above-described testing method of the semiconductor integrated circuit that the probe terminal in the first step is a bump. The bump is different from a probe needle in that it does not break the non-conductive layer. Hence, the burn-in screening can be accurately carried out.

BRIEF DESCRIPTION OF THE DRAWINGS

The above and other objects, features and advantages of the present invention will become more apparent from the following detailed description which is to be read in conjunction with the accompanying drawings, in which:

FIGS. 18(a) and 18(b) are views showing an alignment device executing an alignment for the probe card and the semiconductor wafer, wherein FIG. 18(a) is a plan view and FIG. 18(b) is a cross-sectional view;

FIG. 22 is a graph showing temperature dependency of the thermal expansion coefficients of the flexible substrate and the rigid ring of the probe card in accordance with the tenth embodiment of the present invention;

FIGS. 27(a) and 27(b) are views showing a probe card in accordance with a fourteenth embodiment of the present invention, wherein FIG. 27(a) is an exploded perspective view and FIG. 27(b) is a cross-sectional view taken along a line A—A of FIG. 27(a);

FIGS. 31(a) and 31(b) are views showing a probe card used in the testing method of a semiconductor integrated circuit in accordance with the fifteenth embodiment of the present invention, wherein FIG. 31(a) is a plan view and FIG. 31(b) is a partially enlarged view;

DETAILED DESCRIPTION OF THE PREFERRED EMBODIMENTS

Hereinafter, preferred embodiments of the present invention will be explained in greater detail with reference to the accompanying drawings.

Figure 1A:
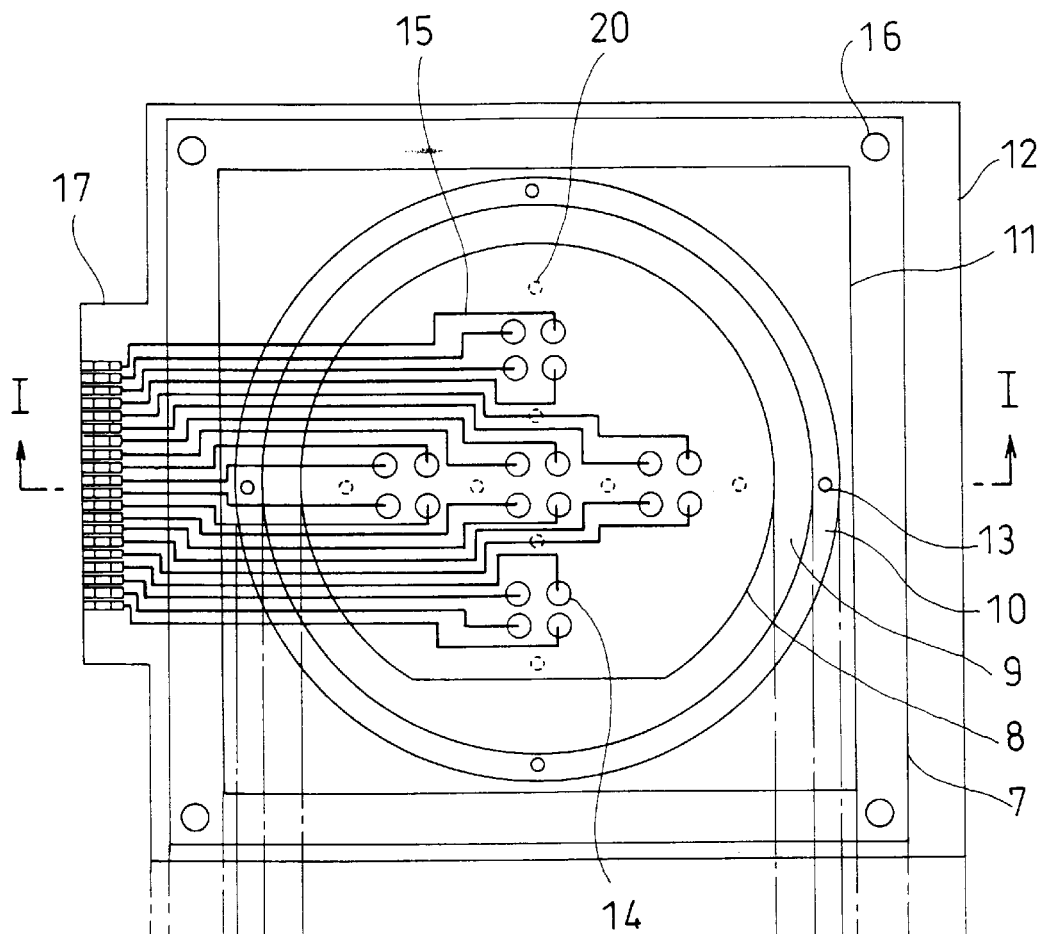
FIG. 1(a) is a plan view showing a semiconductor wafer package in accordance with a first embodiment of the present invention.
Figure 1B:
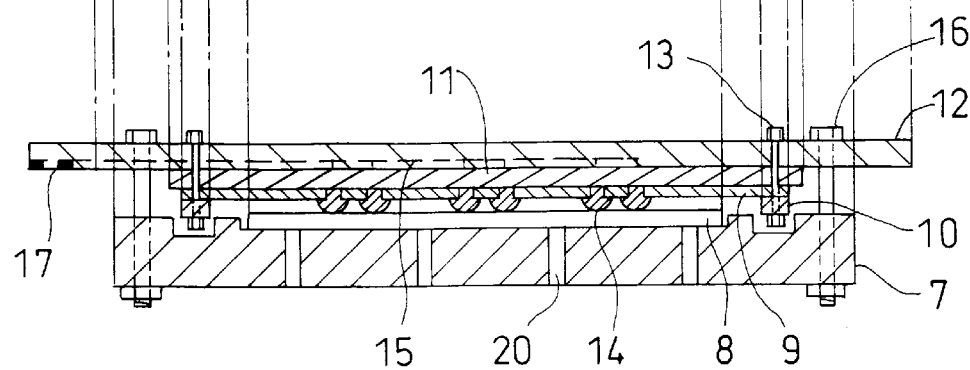
FIG. 1(b) is a cross-sectional view taken along a line I—I of FIG. 1(a)

FIG. 1(a) is a plan view showing a semiconductor wafer package in accordance with a first embodiment of the present invention, and FIG. 1(b) is a cross-sectional view taken along a line I—I of FIG. 1(a). In FIGS. 1(a) and 1(b), a reference numeral 7 represents a ceramic retainer board holding a semiconductor wafer 8. A reference numeral 20 represents a suction hole formed on the retainer board 7 for sucking the semiconductor wafer 8 from the outside to stick the semiconductor wafer 8 fast to the retainer board 7. A reference numeral 9 represents a probe sheet made of polyimide. A reference numeral 10 represents a ceramic ring fixing the probe sheet 9. A reference numeral 11 represents anisotropic conductive rubber having a thickness of approximately 0.5 mm. This anisotropic conductive rubber 11 is conductive only in a direction normal to its main surface. Furthermore, in FIGS. 1(a) and 1(b), a reference numeral 12 represents a wiring substrate made of ceramic, a reference numeral 13 represents a fixing screw fastening the ceramic ring 10 and the wiring substrate 12, and a reference numeral 14 represents a bump serving as a probe terminal which is formed on the probe sheet 9.

The bump 14 is made of Ni and formed into a semispherical shape having a height of approximately 20 μm. The surface of Ni bump is coated by Au layer of 1 μm thickness. The bump 14 is connected to an IC terminal (not shown) used for test of the semiconductor wafer 8. The bump 14 is connected to a wiring pattern 15 formed in the wiring substrate 12 through the anisotropic conductive rubber 11. The wiring pattern 15 is connected to an external connector 17. A reference numeral 16 represents a fixing screw clamping the semiconductor wafer 8 and the probe sheet 9 disposed between the wiring substrate 12 and the retainer board 7. With existence of the fixing screw 16 and the anisotropic conductive rubber 11, the bump 14 is surely brought into contact with the IC terminal of the semiconductor wafer 8. Thus, it becomes possible to reduce the contact resistance between the bump 14 and the IC terminal.

Next explained is a method of executing a burn-in screening using a semiconductor wafer package in accordance with the first embodiment.

First of all, the probe sheet 9 and the anisotropic conductive rubber 11 are fixed together on the wiring substrate 12 by means of the fixing screws 13. The semiconductor wafer 8, mounted on the retainer board 7, is sucked through suction holes 20 and stuck fast to the retainer board 7. With this suction, not only the semiconductor wafer 8 is firmly fixed to the retainer board 7 but the deflection of semiconductor wafer 8 is eliminated.

Next, a CCD camera takes in an image of the semiconductor wafer 8 and the probe sheet 9 to execute a positioning operation of the semiconductor wafer 8 and the probe sheet 9 using the conventional alignment technology, thereby bring the bumps 14 of the probe sheet 9 into contact with IC terminals of the semiconductor wafer 8. Thereafter, the fixing screw 16 is fastened so that the wiring substrate 12 and the retainer board 7 approach to each other thereby surely establishing electrical connection between the bumps 14 and the IC terminals.

Figure 2A:
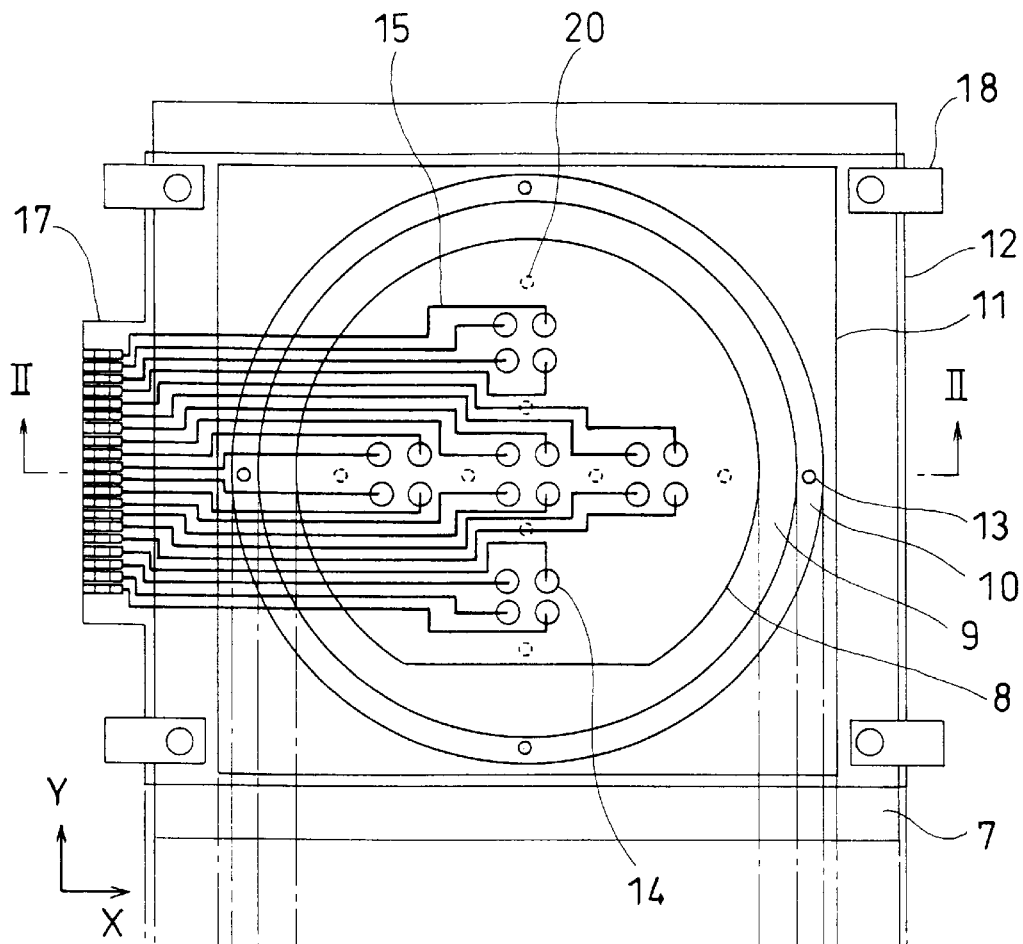
FIG. 2(a) is a plan view showing a semiconductor wafer package in accordance with a second embodiment of the present invention.
Figure 2B:
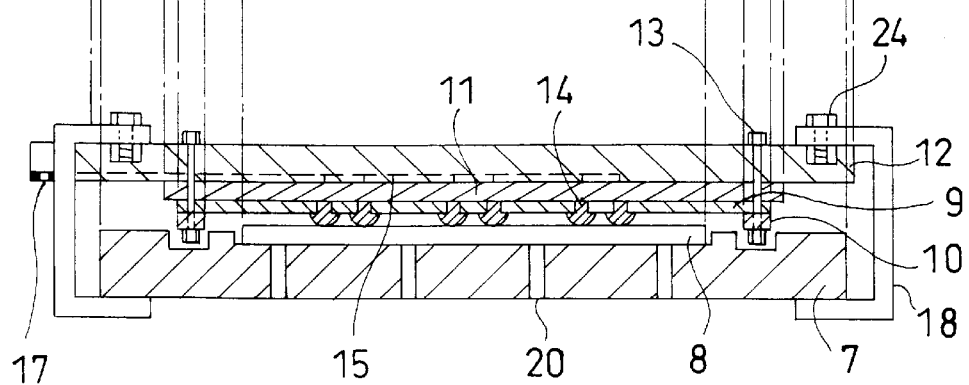
FIG. 2(b) is a cross-sectional view taken along a line II—II of FIG. 2(a)

According to the semiconductor wafer package in accordance with the first embodiment, the anisotropic conductive rubber 11 absorbs dispersion of the height of bump 14. Thus, a pressing force added between the wiring substrate 12 and the retainer board 7 is evenly applied between each bump 14 and the IC terminal of the semiconductor wafer 8. With this arrangement, a uniform contact resistance is obtained between each bump 14 and the IC terminal of semiconductor wafer 8. Accordingly, imperfect contact is eliminated between the bumps 14 and the IC terminals and substantially the same input waveform can be supplied to each integrated circuit in the semiconductor wafer 8, bringing increase of testing accuracy. The isotropic conductive rubber 11 acts as cushioning member preventing the semiconductor wafer 8 from being damaged in the event that a pressing force is localized at a certain portion due to difference of parallelism caused when the wiring substrate 12 is mounted on the semiconductor wafer 8. FIG. 2(a) is a plan view showing a semiconductor wafer package in accordance with a second embodiment of the present invention, and FIG. 2(b) is a cross-sectional view taken along a line II—II of FIG. 2(a). The identical parts having the same function as those of the first embodiment are denoted by the same reference numerals throughout views.

The second embodiment has an arrangement similar to the first embodiment, but is characterized by a fixing method between the wiring substrate 12 and the retaining board 7. More specifically, according to the second embodiment, the wiring substrate 12 and the retaining board 7 are clamped by means of a fixing jig 18, and a fixing screw 24 presses the wiring substrate 12 toward the retainer board 7. The fixing screw 24 is a type that does not penetrate the wiring substrate 12 or the retainer board 7 but pushes the wiring substrate 12 toward the retainer board 7.

The second embodiment requires no positioning operation between the retainer board 7 and the wiring substrate 12 when the wiring substrate 12 is disposed. For example, a dislocation may be caused between the wiring substrate 12 and the semiconductor wafer 8 mounted on the retainer board 7 in an X or Y direction of FIG. 2(a). But all thing necessary to do is to dispose the wiring substrate 12 to fit to the position of semiconductor wafer 8 so as to bring the bumps 14 into contact with the IC terminals of the semiconductor wafer 8, and thereafter to press the wiring substrate 12 toward the semiconductor wafer 8 by fastening the fixing screw 24.

Figure 3A:
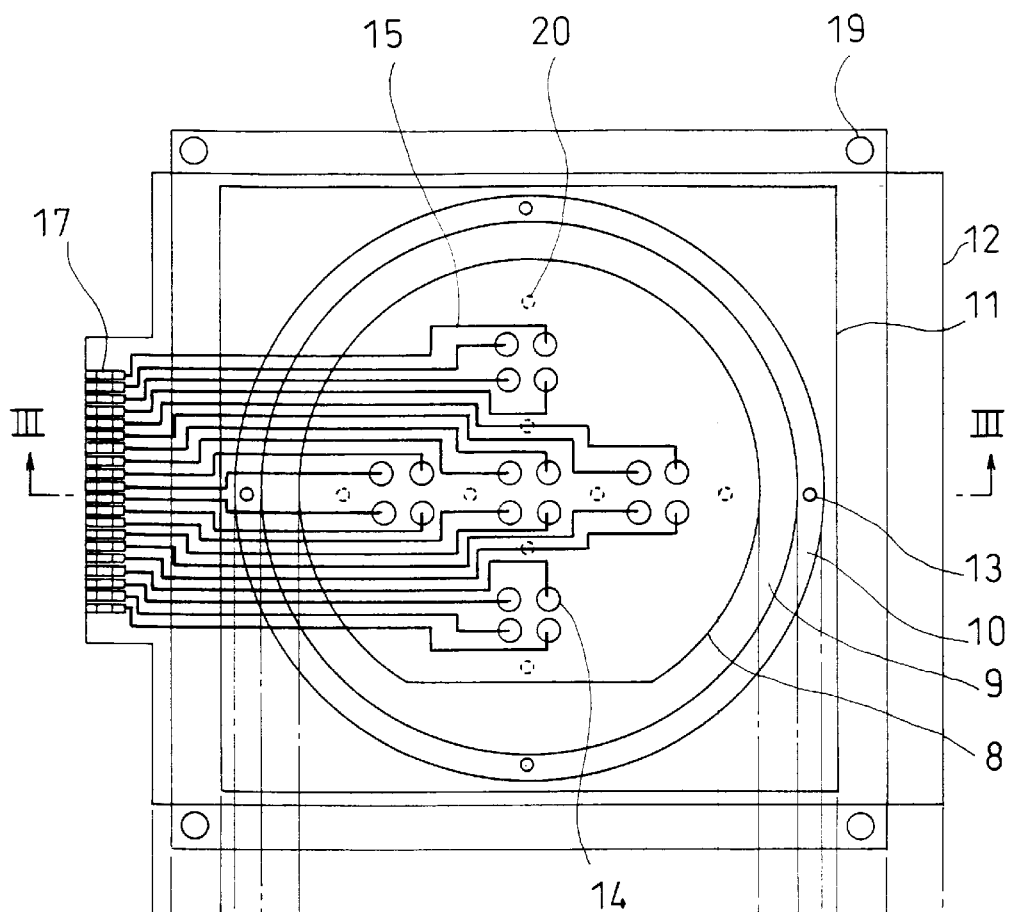
FIG. 3(a) is a plan view showing a semiconductor wafer package in accordance with a third embodiment of the present invention.
Figure 3B:
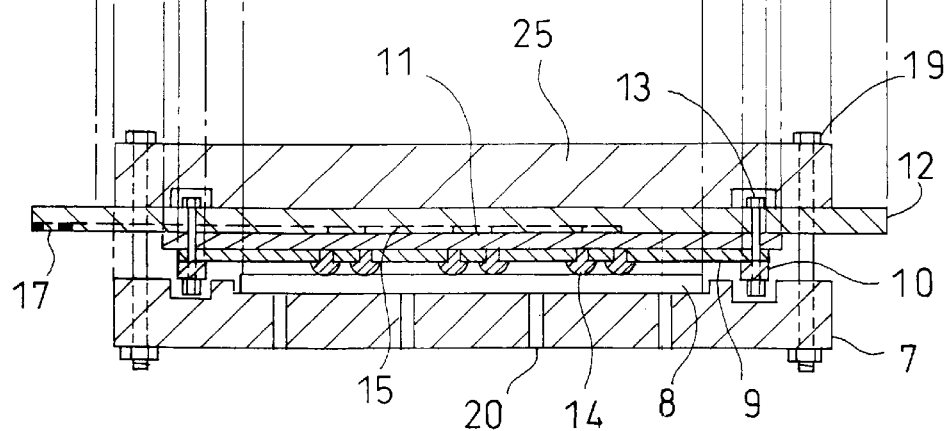
FIG. 3(b) is a cross-sectional view taken along a line III—III of FIG. 3(a)

FIG. 3(a) is a plan view showing a semiconductor wafer package in accordance with a third embodiment of the present invention, and FIG. 3(b) is a cross-sectional view taken along a line III—III of FIG. 3(a).

The third embodiment has an arrangement similar to the first embodiment, but is characterized in that a ceramic pressing board 25 and a retainer board 7 are fixed with each other by means of a fixing screw 19 while semiconductor wafer 8, probe sheet 9, isotropic conductive rubber 11 and wiring substrate 12 are sandwiched between the ceramic pressing board 25 and the retainer board 7.

According to the third embodiment, what is fixed to the retainer board 7 by means of the fixing screw 19 is the pressing board 25. Therefore, the positioning operation between the bumps 14 and the IC terminals of semiconductor wafer 8 is accomplished by positioning the wiring substrate 12 with respect to the semiconductor wafer 8 mounted on the retainer board 7. Furthermore, provision of the pressing board 25 makes it possible to manufacture the wiring substrate 12 by non-expensive material such as glass although the pressing board 25 itself may be rigid and expensive. This is advantageous in that numerous kinds of semiconductor wafer packages can be fabricated by simply exchanging the wiring substrate 12 in accordance with the type of integrated circuit to be formed on the semiconductor wafer 8; thus, cost of the semiconductor wafer package can be reduced.

Figure 4A:
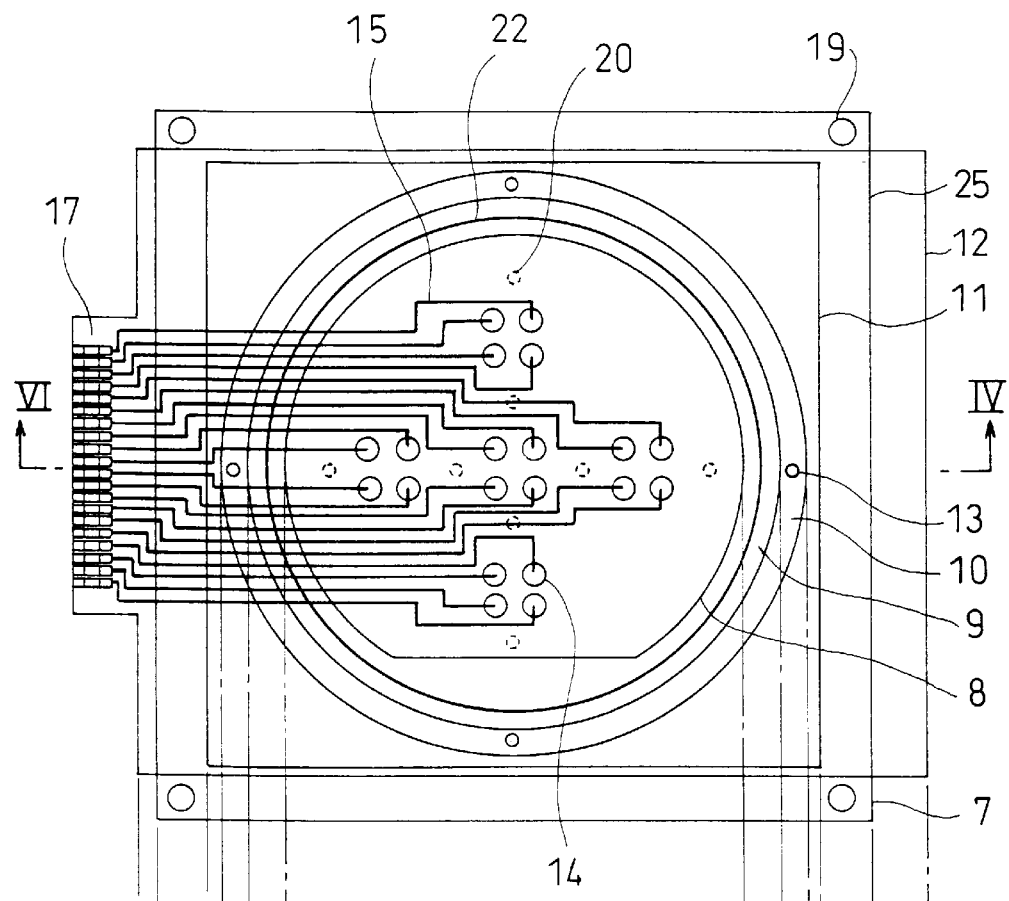
FIG. 4(a) is a plan view showing a semiconductor wafer package in accordance with a fourth embodiment of the present invention.
Figure 4B:
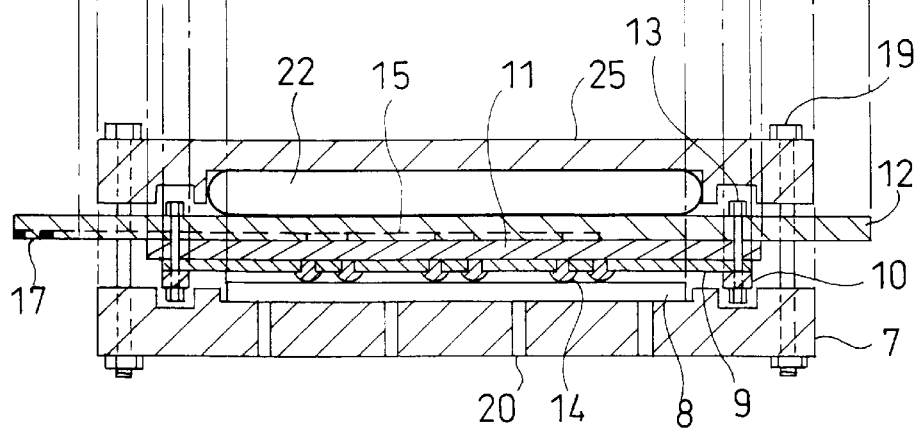
FIG. 4(b) is a cross-sectional view taken along a line IV—IV of FIG. 4(a)

FIG. 4(a) is a plan view showing a semiconductor wafer package in accordance with a fourth embodiment of the present invention, and FIG. 4(b) is a cross-sectional view taken along a line IV—IV of FIG. 4(a).

The fourth embodiment comprises, in addition to the arrangement of the third embodiment, a pressing bag 22 interposed between the wiring substrate 12 and the pressing board 25. This pressing bag 22 is made of expandable material such as rubber and filled with gas such as air.

According to the fourth embodiment, air inflates in the pressing bag 22 with increasing temperature of the semiconductor wafer package. As the pressing board 25 and the retainer board 7 are fixed to each other by means of the fixing screw 19, inflation of the pressing bag 22 causes a pressing force pressing the wiring substrate 12 against the semiconductor wafer 8. Accordingly, the electrical connection between the bumps 14 and the IC terminals of semiconductor water 8 is ensured. Hence, this arrangement realizes both establishment of sure electrical connection and reduction of contact resistance between the bumps 14 and the IC terminals of semiconductor wafer 8, avoiding imperfect connection and improving input signal characteristics.

By the way, instead of inflating the pressing bag 22 by heating the semiconductor wafer package, it will be preferable to control the gas pressure in the pressing bag 22 by charging gas from the outside into the pressing bag 22 or discharging gas from the pressing bag 22 to the outside. By doing this, temperature increase of the semiconductor wafer package is no longer required to press the wiring substrate 12 against the semiconductor wafer 8. Furthermore, gas filled in the pressing bag 22 can be replaced by fluid such as oil.

Figure 5A:
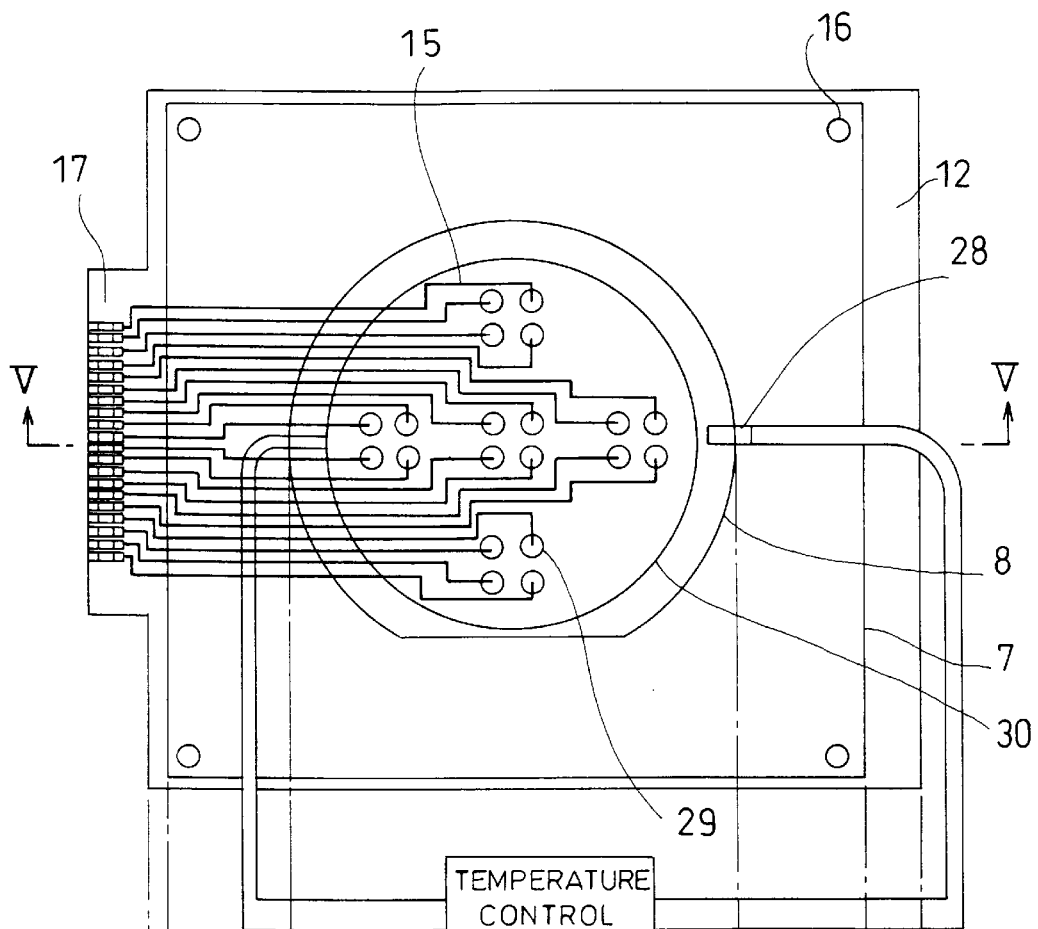
FIG. 5(a) is a plan view showing a semiconductor wafer package in accordance with a fifth embodiment of the present invention.
Figure 5B:
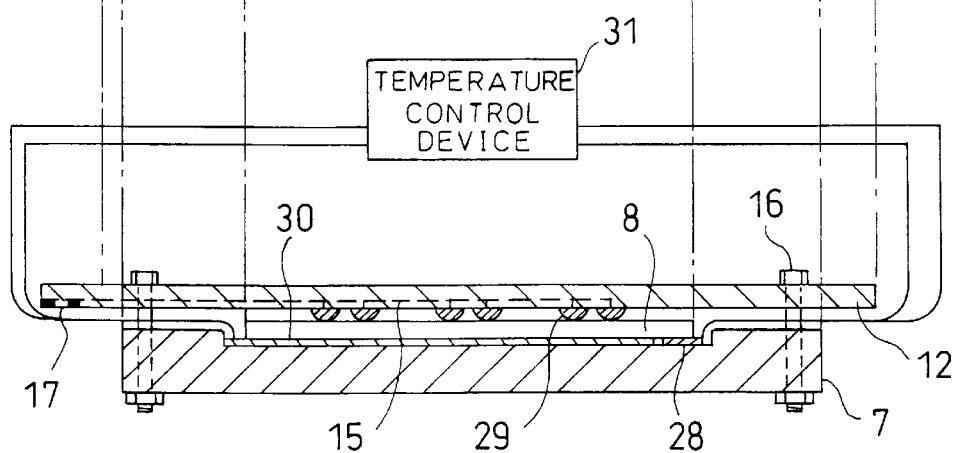
FIG. 5(b) is a cross-sectional view taken along a line V—V of FIG. 5(a)

FIG. 5(a) is a plan view showing a semiconductor wafer package in accordance with a fifth embodiment of the present invention, and FIG. 5(b) is a cross-sectional view taken along a line V—V of FIG. 5(a).

The fifth embodiment is characterized in that bumps 29 are directly provided on the wiring substrate 12, a temperature sensor 28 is provided on an upper surface of the retainer board 7 to detect the temperature of semiconductor wafer 8, a heater 30 is provided on the retainer board 7 to heat the semiconductor wafer 8, and a temperature control device 31 is provided to control the heater 30.

According to the fifth embodiment, the temperature sensor 28 detects the temperature of semiconductor wafer 8, and the temperature control device 31 controls the temperature of heater 30 and also the temperature of semiconductor wafer 8 on the basis of the temperature of semiconductor wafer 8 detected by the temperature sensor 28. Therefore, a testing of integrated circuits on the semiconductor wafer 8 can be carried out at a desired temperature.

Instead of the arrangement of the fifth embodiment, it will be preferable to provide the heater 30 under the retainer board 7 or to control the temperature of semiconductor wafer 8 by ambient atmosphere surrounding the semiconductor wafer package.

Moreover, it will be possible to provide a heat pipe releasing heat generated in response to operation of integrated circuits on the semiconductor wafer 8 in addition to the arrangement of the fifth embodiment.

Figure 6A:
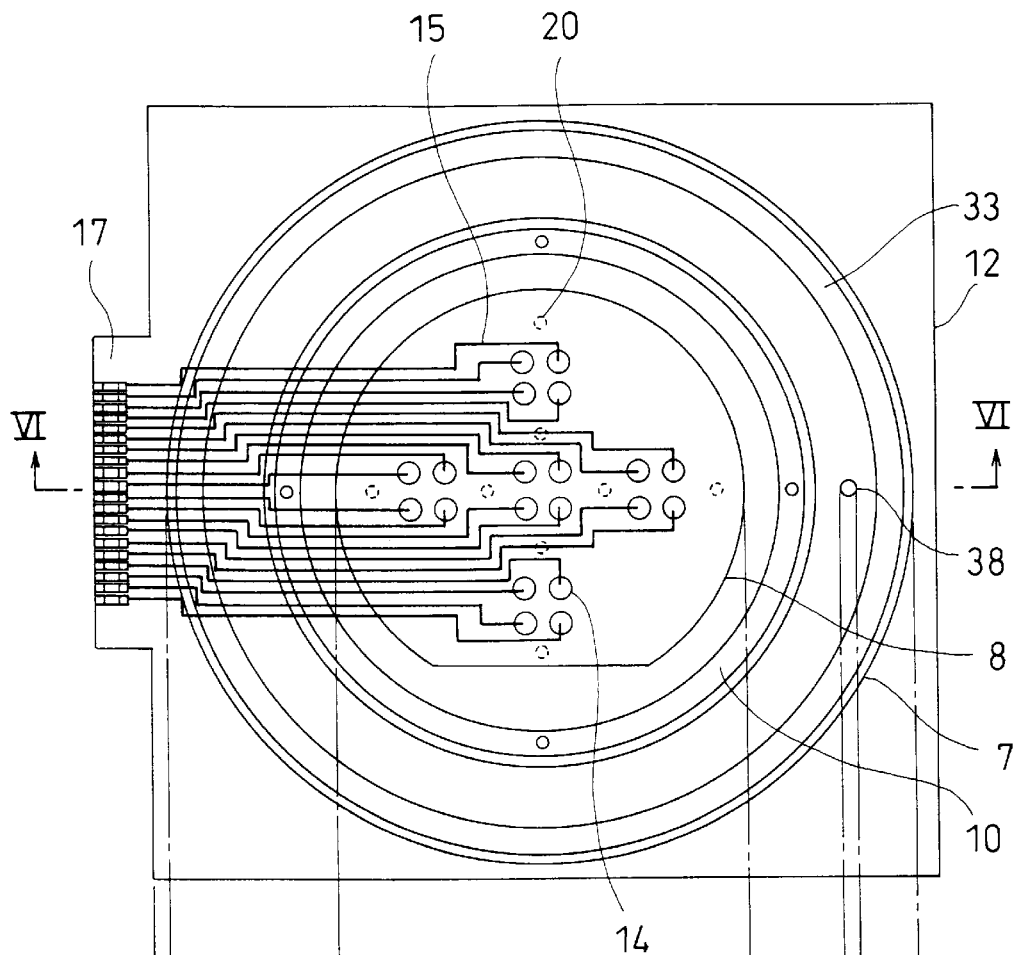
FIG. 6(a) is a plan view showing a semiconductor wafer package in accordance with a sixth embodiment of the present invention.
Figure 6B:
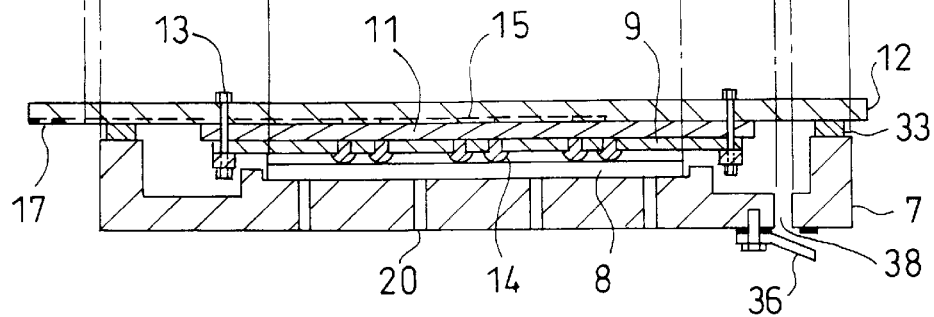
FIG. 6(b) is a cross-sectional view taken along a line VI—VI of FIG. 6(a)

FIG. 6(a) is a plan view showing a semiconductor wafer package in accordance with a sixth embodiment of the present invention, and FIG. 6(b) is a cross-sectional view taken along a line VI—VI of FIG. 6(a).

The sixth embodiment is different from the first embodiment in that a hermetically sealed space is defined between the wiring substrate 12 and the retainer board 7 and the pressure of this space is reduced to bring the wiring substrate 12 and the retainer board 7 into closer relationship, although the first embodiment uses the fixing screw 16 to bring the wiring substrate 12 and the retainer board 7 into closer relationship. More specifically, a seal member 33 of ring shape, made of silicone rubber or the like capable of causing a large elastic shrink when pressed, is disposed or bonded on the periphery of the retainer board 7. With existence of the seal member 33, a hermetically sealed space is defined between the wiring substrate 12 and the retainer board 7. A suction hole 38 is opened across the retainer board 7 and a valve 36 is provided on the retainer board 7 to open or close the suction hole 38 to reduce the pressure in the hermetical space.

In the sixth embodiment, a vacuum pump is used to realized a reduced pressure of, for example, 200 Torr or less in the hermetical space surrounded by the wiring substrate 12, the retainer board 7 and the seal member 33. For example, the semiconductor wafer 8 having size of 6 inches will receive a load of at least 130 kg due to pressure difference between the atmosphere having approximately 760 Torr and the hermetical space. As the seal member 33 made of silicone rubber or the like is shrinkable, most of the load of 130 kg or more is uniformly applied to the bumps 14 through the probe sheet 9. If the IC terminals of the semiconductor wafer 8 are made of Al, a stable contact resistance of 0.5 Ω or less will be obtained between the bump 14 and the IC terminal when a load per bump is approximately 10 g. It means that more than 10,000 bumps 14 can be surely connected with the IC terminals. Maintaining the above-described pressure reduction condition makes it possible to realize an arrangement of a semiconductor wafer package capable of ensuring electrical connections between numerous low-resistant bumps 14 and IC terminals. Hence, this arrangement not only eliminates imperfect connection between the bumps 14 and the IC terminals but provides uniform input waveform to each of the integrated circuits on the semiconductor wafer 8; thus, testing accuracy can be improved.

Besides the arrangement of the sixth embodiment, pressure reduction of the hermetical space can be realized by another method. For example, a pushing force is applied to the wiring substrate 12 or the retainer board 7 to bring the wiring substrate 12 and the retainer board 7 into closer relationship after the wiring substrate 12 is disposed on the semiconductor wafer 8 and the seal member 33, thus bringing the bumps 14 and IC terminals into contact with each other. While maintaining such a condition, the pressure is reduced in the hermetical space surrounded by the wiring substrate 12, retainer board 7 and seal member 33.

Moreover, instead of the arrangement of the sixth embodiment, the valve 36 can be provided on the wiring substrate 12 or the seal member 33 can be bonded to the wiring substrate 12.

Figure 7:
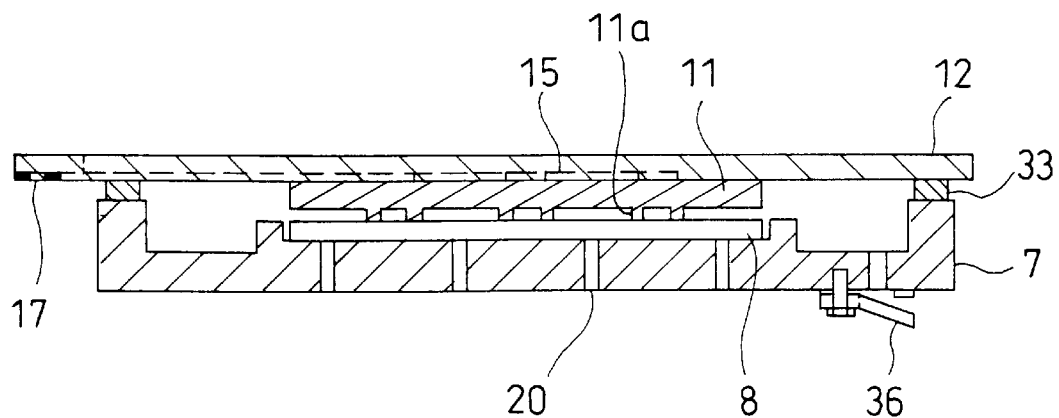
FIG. 7 is a cross-sectional view showing a semiconductor wafer package in accordance with a first modification of the sixth embodiment.

Furthermore, as shown in FIG. 7, projections 11a can be provided on the anisotropic conductive rubber 11 at positions where the bumps 14 were provided, so that these projections 11a can be used as probe terminals. In such a case, projections 11a of the anisotropic conductive rubber 11 are brought into direct contact with the IC terminals on the semiconductor wafer 8.

Figure 8:
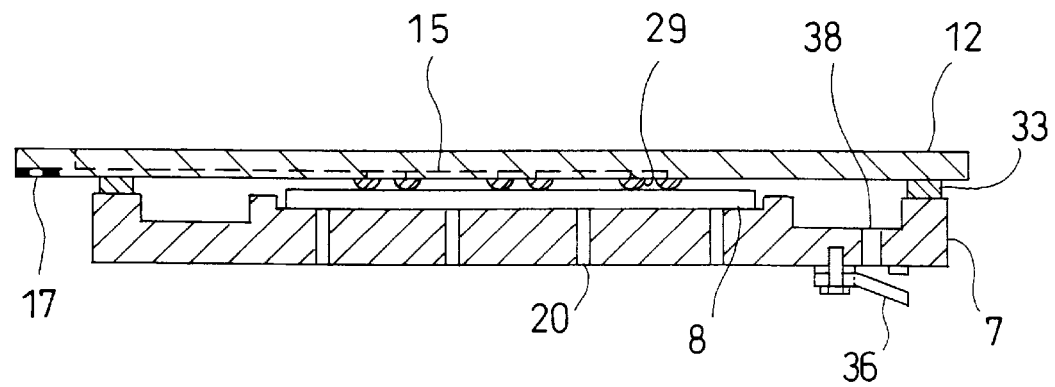
FIG. 8 is a cross-sectional view showing a semiconductor wafer package in accordance with a second modification of the sixth embodiment.

Still further, as shown in FIG. 8, the anisotropic conductive rubber 11 can be omitted and bumps 29 are provided on a wiring substrate 12 so that these bumps 29 can be electrically connected with the IC terminals on the semiconductor wafer 8.

Figure 9A:
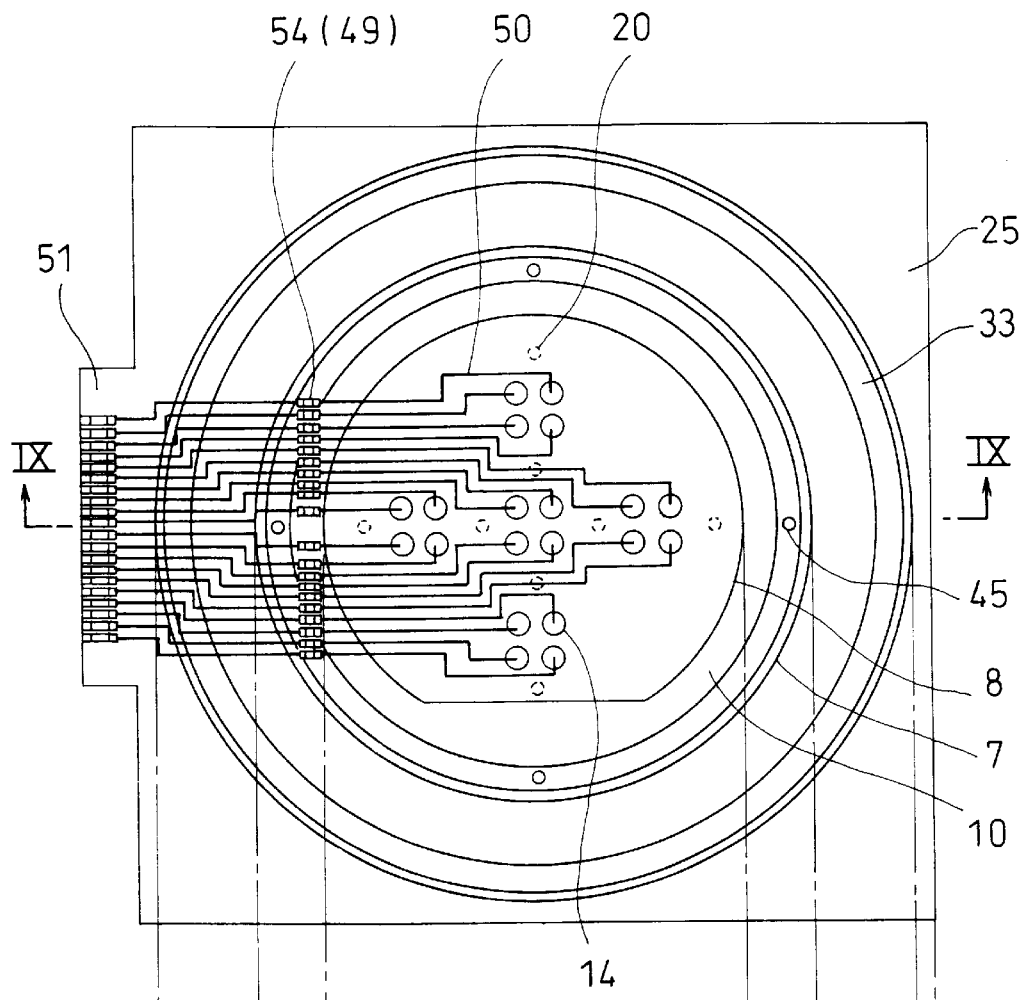
FIG. 9(a) is a plan view showing a semiconductor wafer package in accordance with a seventh embodiment of the present invention.
Figure 9B:
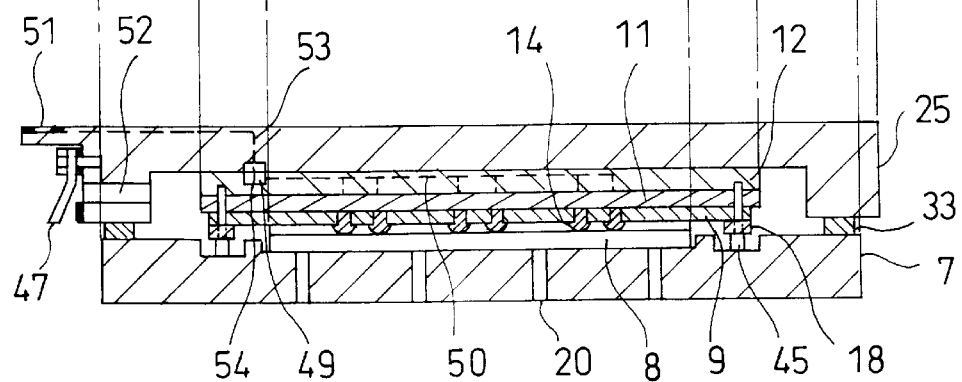
FIG. 9(b) is a cross-sectional view taken along a line IX—IX of FIG. 9(a)

FIG. 9(a) is a plan view showing a semiconductor wafer package in accordance with a seventh embodiment of the present invention, and FIG. 9(b) is a cross-sectional view taken along a line IX—IX of FIG. 9(a).

Although the sixth embodiment forms a hermetical space defined by the wiring substrate 12 and the retainer board 7, the seventh embodiment is characterized in that a pressing board 25 is provided on the wiring substrate 12 so that a hermetical space is provided between the pressing board 25 and the retainer board 7. More specifically, the probe sheet 9 and the anisotropic conductive rubber 11 are fixed to the wiring substrate 12 through the ceramic ring 10 by means of the fixing screw 45. Provided on the retainer board 7 is the seal member 33 similar to that of the sixth embodiment. The hermetical space, defined by the pressing board 25, retainer board 7 and seal member 33, is opened or closed by a valve 47 provided on the pressing board 25 though a suction hole 52 opened therethrough, thereby reducing the pressure of the hermetical space.

The bumps 14 provided on the probe sheet 9 are electrically connected with wiring patterns 50 in the wiring substrate 12 though the anisotropic conductive rubber 11. The wiring patterns 50 are electrically connected to wiring patterns 53 provided in the pressing board 25 by way of connectors 49 provided on the wiring substrate 12 and connectors 54 provided on the pressing board 25. The wiring patterns 53 are electrically connected to external connectors 51 provided on the pressing board 25.

According to the seventh embodiment, the semiconductor wafer 8 is fixed to the retainer board 7 and subsequently the wiring substrate 12 is positioned in such a manner that the bumps 14 are brought into contact with IC terminals (not shown) of the semiconductor wafer 8. Thereafter, the positioning of the pressing board 25 is carried out in such a manner that the connectors 49 of the wiring substrate 12 confront with the connectors 54 of the pressing board 25 in the up-and-down direction. Thus, a hermetical space is formed by the pressing board 25, the retainer board 7 and the seal member 33. By sucking inside air through the suction hole 52, the pressure of the hermetical space is reduced until the seal member 33 is so shrunk that the connectors 49 of the wiring substrate 12 are electrically connected to the connectors 54 of the pressing board 46 while the bumps 14 are electrically connected to the IC terminals of the semiconductor wafer 8. Thus, this arrangement realizes the low-resistant connection between numerous bumps 14 more than 10,000 and IC terminals of the semiconductor wafer 8.

According to the seventh embodiment, provision of the pressing board 25 on the wiring substrate 12 makes it possible to manufacture the wiring substrate 12 by non-expensive material such as glass although the pressing board 25 itself may be rigid and expensive. This is advantageous in that numerous kinds of semiconductor wafer packages can be fabricated by simply exchanging the wiring substrate 12 in accordance with the type of integrated circuit to be formed on the semiconductor wafer 8; thus, cost of the semiconductor wafer package can be reduced.

Instead of the arrangement of the seventh embodiment, the pressing board 25 and the wiring substrate 12 can be fixed to each other beforehand so that the pressing board 25 and the wiring substrate 12 thus assembled are simultaneously disposed on the semiconductor wafer 8 and the seal member 33.

Besides the arrangement of the seventh embodiment, pressure reduction of the hermetical space can be realized by another method. For example, a pushing force is applied to the pressing board 25 or the retainer board 7 to bring the pressing board 25 and the retainer board 7 into closer relationship after the pressing board 25 is disposed on the semiconductor wafer 8 and the seal member 33. While maintaining such a condition, the pressure is reduced in the hermetical space surrounded by the pressing board 25, retainer board 7 and seal member 33.

Moreover, instead of the arrangement of the seventh embodiment, the valve 47 can be provided on the retainer board 7 or the seal member 33 can be provided on the pressing board 25.

Figure 10:
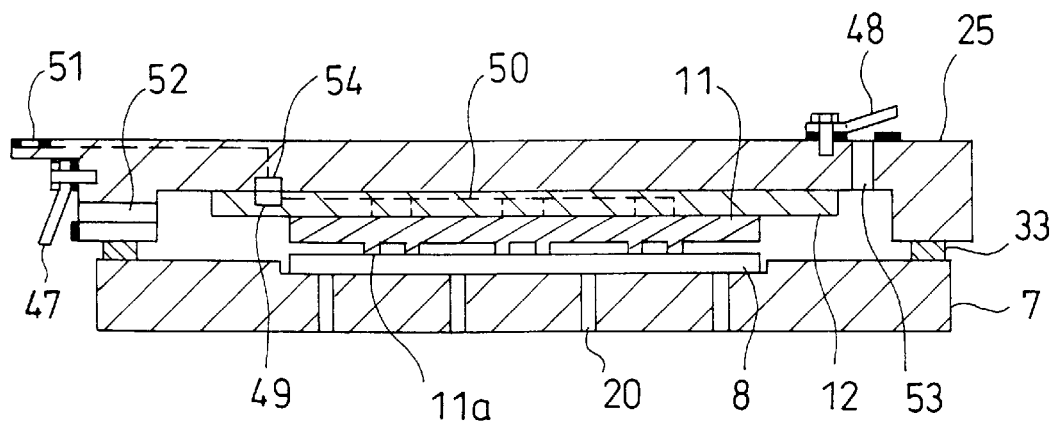
FIG. 10 is a cross-sectional view showing a semiconductor wafer package in accordance with a first modification of the seventh embodiment.

Furthermore, as shown in FIG. 10, projections 11a can be provided on the anisotropic conductive rubber 11 at positions where the bumps 14 were provided, so that these projections 11a can be used as probe terminals. In such a case, projections 11a of the anisotropic conductive rubber 11 are brought into direct contact with the IC terminals on the semiconductor wafer 8. Still further, in addition to the suction hole 52 provided on the side wall of the pressing board 25, it will be preferable to provide a suction hole 53 opening upward across the pressing board 25 so as to be opened or closed by a valve 48 as shown in FIG. 10.

Figure 11:
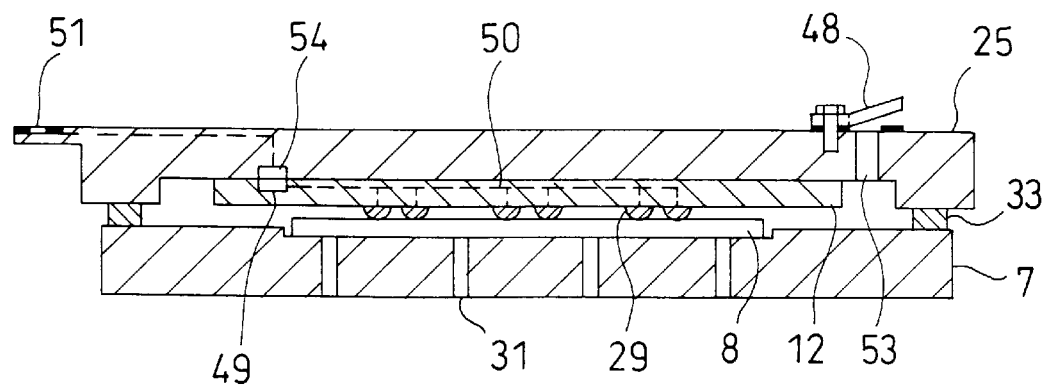
FIG. 11 is a cross-sectional view showing a semiconductor wafer package in accordance with a second modification of the seventh embodiment.

Yet further, as shown in FIG. 11, the anisotropic conductive rubber 11 can be omitted and bumps 29 are provided on the wiring substrate 12 so that these bumps 29 can be electrically connected with the IC terminals on the semiconductor wafer 8.

Figure 12:
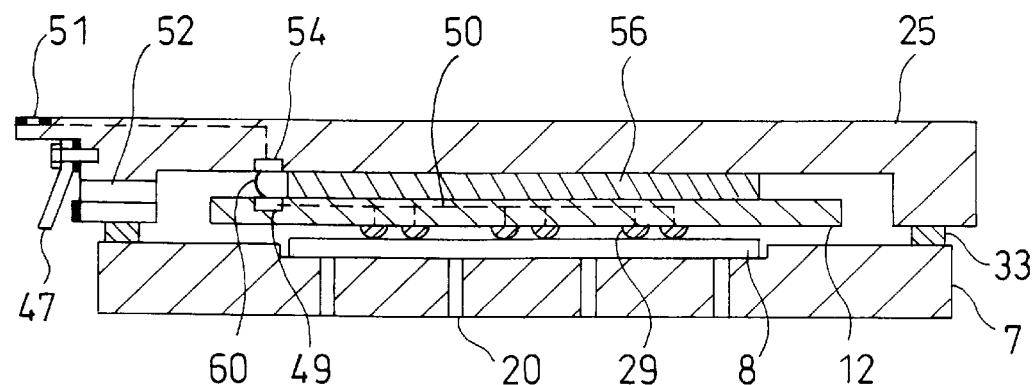
FIG. 12 is a cross-sectional view showing a semiconductor wafer package in accordance with a third modification of the seventh embodiment.

Moreover, as shown in FIG. 12, the anisotropic conductive rubber 11 can be omitted and an elastic member 56 made of rubber can be disposed instead between the pressing board 25 and the wiring substrate 12. In this case, the connectors 49 of the wiring substrate 12 and the connectors 54 of the pressing board 25 are connected by means of wires 60.

Figure 13A:
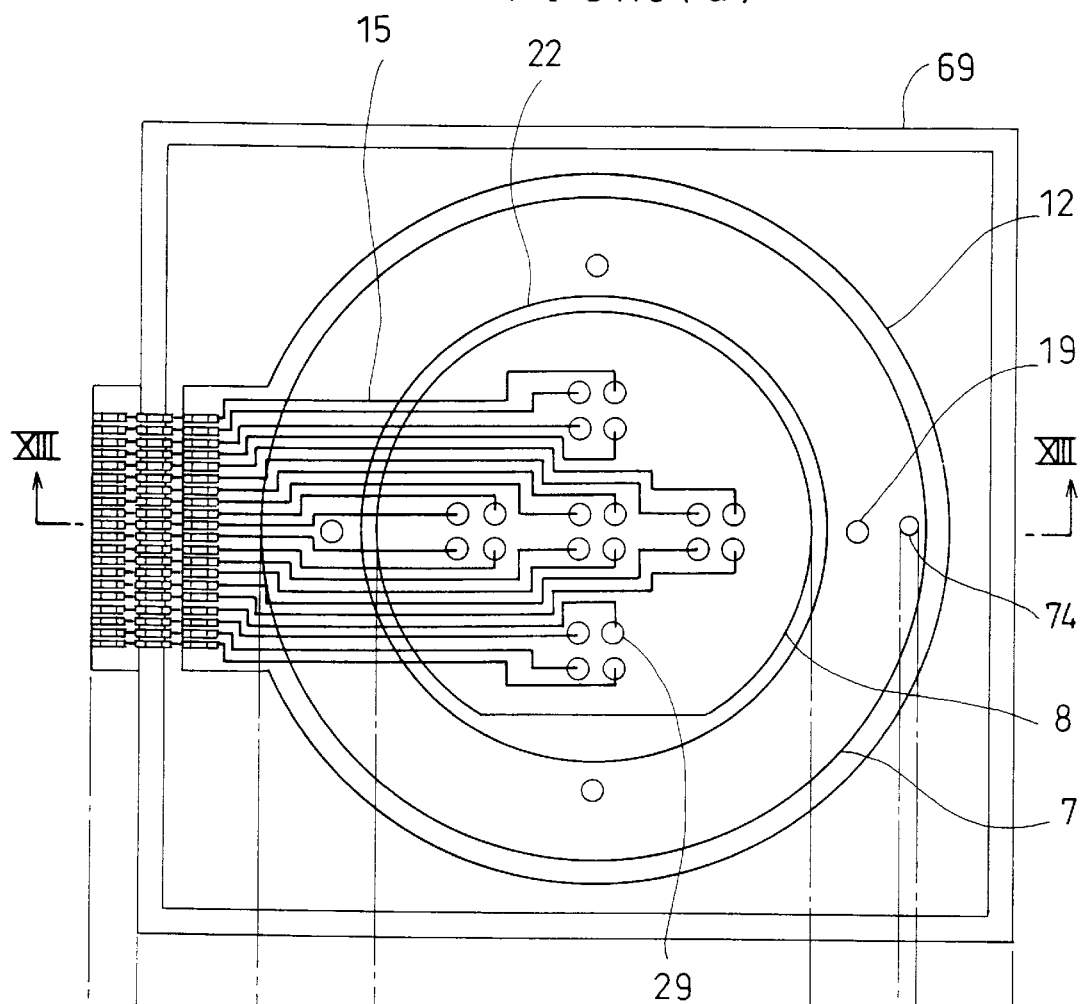
FIG. 13(a) is a plan view showing a semiconductor wafer package in accordance with an eighth embodiment of the present invention.
Figure 13B:
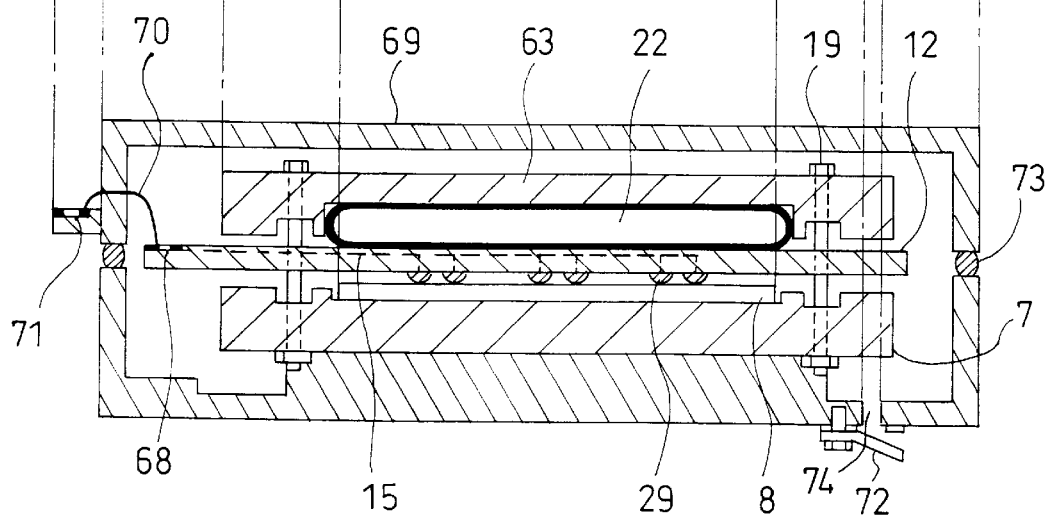
FIG. 13(b) is a cross-sectional view taken along a line XIII—XIII of FIG. 13(a)

FIG. 13(a) is a plan view showing a semiconductor wafer package in accordance with an eighth embodiment of the present invention, and FIG. 13(b) is a cross-sectional view taken along a line XIII—XIII of FIG. 13(a).

The eighth embodiment is different from the fourth embodiment in that the anisotropic conductive rubber 11 is removed and the package is housed in a casing 69. More specifically, the retainer board 7 and a rigid board 63 are fixed to each other by means of the fixing screw 19. A pressing bag 22, made of expandable rubber and filled with gas such as air, is disposed between the rigid board 63 and the wiring substrate 12. A seal member 73 made of rubber is interposed between the upper and lower parts of the casing 69, thereby maintaining the inside of the casing 69 in a hermetical condition. A valve 74 is provided on the casing 69 to open or close a suction hole 74 opened across the casing 69, thereby reducing the pressure inside the casing 69.

The bump 29 directly provided on the wiring substrate 12 are connected to IC terminals (not shown) of the semiconductor wafer 8, and are electrically connected to external terminals 71 provided outside the casing 69 by way of the wiring patterns 15 and connectors 68 provided on the wiring substrate 12 and wires 70.

According to the eighth embodiment, air inflates in the pressing bag 22 with reducing pressure in the casing 69 through the suction hole 74. As the pressing board 25 and the retainer board 7 are fixed to each other by means of the fixing screw 19, inflation of the pressing bag 22 causes a pressing force pressing the wiring substrate 12 against the semiconductor wafer 8. Accordingly, the electrical connection between the bumps 29 and the IC terminals of semiconductor wafer 8 is ensured. Hence, this arrangement realizes reduction of contact resistance between the bumps 29 and the IC terminals of semiconductor wafer 8, avoiding imperfect connection and improving input signal characteristics.

The inside pressure of the casing 69 is reduced using a vacuum pump or the like and then maintained at a reduced pressure by closing the suction hole 73 with the valve 72. During transportation of the semiconductor wafer package, air may enter inside the casing 69 through the suction hole 74. Thus, the pressure increases inside the casing 69 with elapsing time. It is however possible, regardless of time elapse, to maintain the casing 69 at pressures below a predetermined value by adequately setting the volume of the casing 69 and the pressure in the casing 69.

Instead of the arrangement of the eight embodiment, an air inlet of the pressing bag 22 can be placed out of the casing 69 so that the pressure of the pressing bag 22 can be controlled by means of external devices. With such an arrangement, the pressing force acting from the pressing bag 22 to the bumps 29 can be maintained at a constant value even if the inside pressure of the casing 69 increases with elapsing time. Thus, the contact resistance is maintained at a constant value between the bumps 29 and the IC terminals of semiconductor wafer 8.

According to the above-described first to eighth embodiments, a characteristic impedance ranging from the external terminal to the wiring substrate 12 can be easily suppressed at approximately 50 Ω. Furthermore, a distance from the wiring substrate 12 to the IC terminal of the semiconductor wafer 8 is not larger than 0.5 mm. Such a short distance realizes a semiconductor wafer package excellent in high-frequency characteristics.

Figure 14A:
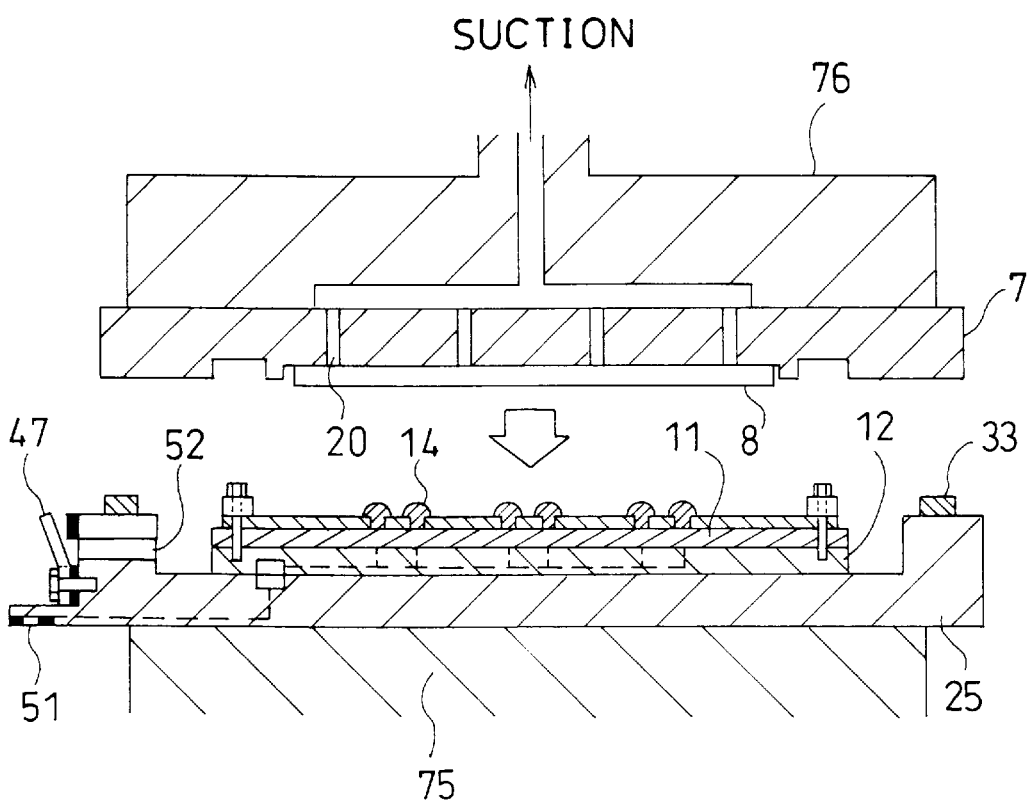
FIGS. 14(a) and 14(b) are views illustrating a testing method of a semiconductor integrated circuit using the semiconductor wafer package in accordance with any one of the first to eighth embodiments of the present invention.
Figure 14B:
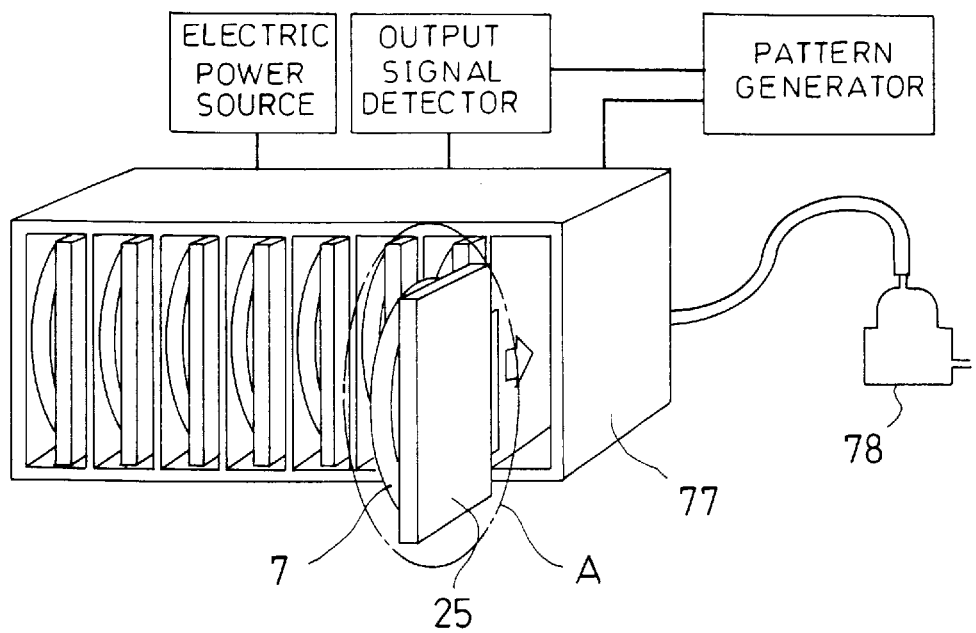

FIGS. 14(*a*) and 14(*b*) are views schematically illustrating a testing method of a semiconductor integrated circuit using the semiconductor wafer package in accordance with any one of the first to eighth embodiments of the present invention, wherein FIG. 14(*a*) shows a condition that uses the semiconductor wafer package in accordance with the seventh embodiment.

First of all, mounted on a wiring substrate side stage 75 is the pressing board 25 provided with the probe sheet 9 having bumps 14, the anisotropic conductive rubber 11, the wiring substrate 12 and the seal member 33. On the other hand, mounted on a wafer side stage 76 is the retainer board 7 on which the semiconductor wafer 8 is fixed.

Next, after finishing a positioning operation of the semiconductor wafer 8 and the probe sheet 9 based on the well-known alignment technology explained in the first embodiment, the wafer side stage 76 is shifted along a direction of an arrow, thereby bringing the IC terminals of the semiconductor wafer 8 into contact with the bumps 14 of the probe sheet 9.

Subsequently, the pressure of the hermetical space defined by the retainer board 7, pressing board 25 and seal member 33 is reduced through the suction hole 52 until the seal member 33 is compressed, so that the bumps 14 can be electrically connected to the IC terminals of the semiconductor wafer 8.

Then, a plurality of semiconductor wafer packages A are inserted in a rack 77 as shown in FIG. 14(*b*). In this condition, the suction hole 52 is closed by the valve 47 to maintain the inside of each semiconductor wafer package A in a reduced pressure condition. Furthermore, a vacuum pump 78 reduces the pressure of the inside space of rack 77; therefore, each semiconductor wafer package A is again subjected to pressure reduction.

The rack 77 is equipped with an electric power source, a pattern generator, and electrodes connected to an output signal detector. These electrodes are connected to the external electrodes of semiconductor wafer packages A accommodated in the rack 77. With this arrangement, electric power voltage and input signals are supplied to the integrated circuits on each semiconductor wafer 8. Meanwhile, output signals of integrated circuits are detected. Thus, numerous semiconductor wafers 8 are simultaneously tested.

Figure 15:
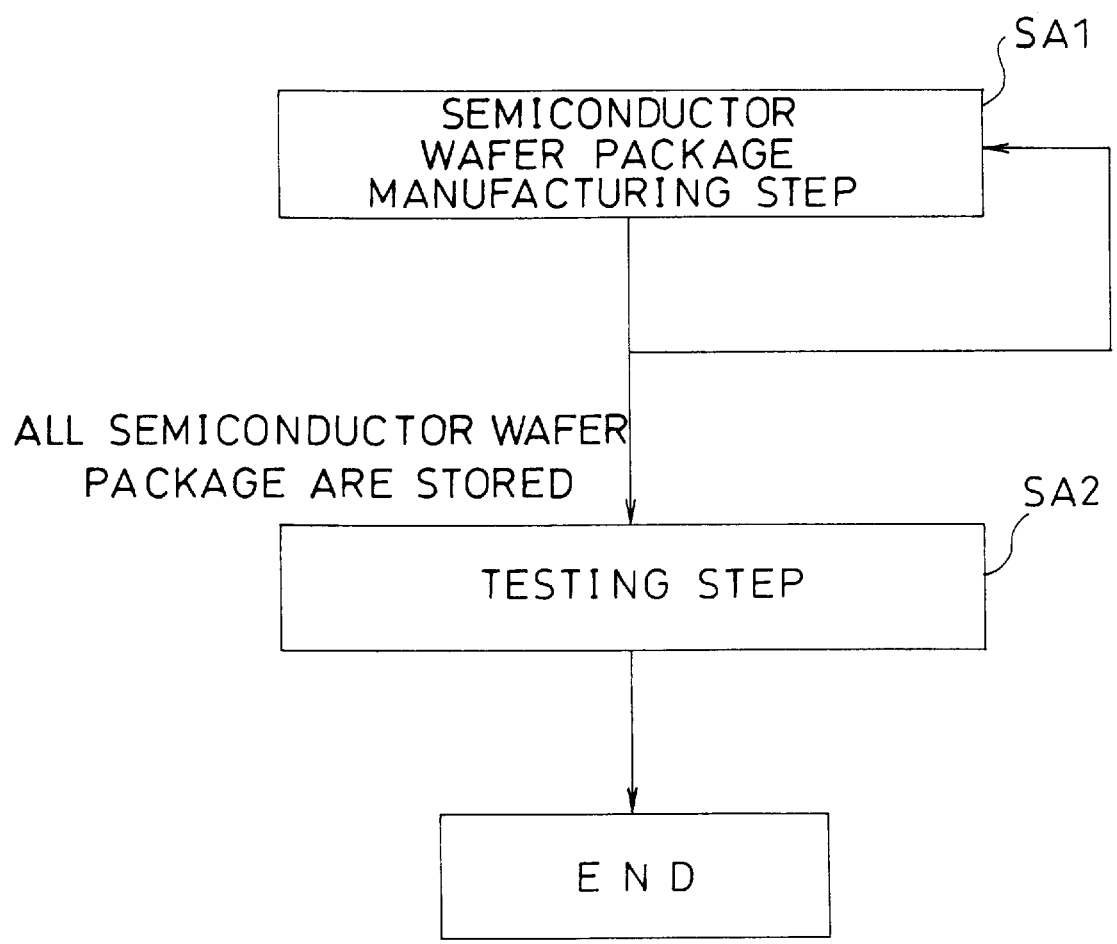
FIG. 15 is a flowchart showing the testing method of a semiconductor integrated circuit using the semiconductor wafer package in accordance with any one of the first to eighth embodiments of the present invention.

FIG. 15 is a flowchart used for testing plural semiconductor wafer 8 using above-described method.

First of all, in a step SA1, a predetermined number of semiconductor wafer packages A are manufactured by repeating steps of aligning the semiconductor wafer 8 and fabricating the semiconductor wafer package A. Next, after inserting or loading these plural semiconductor packages A into the rack 77, the inside pressure of the semiconductor wafer package A is reduced and an electric power voltage and signals are supplied to the integrated circuits of the semiconductor wafer 8 to test the semiconductor wafer 8. It will be preferable to increase the temperature of the semiconductor wafer 8 for executing burn-in screening in this testing step.

The burn-in screening processing generally takes several tens hours per chip. Executing the burn-in screening of all the semiconductor wafer 8 at a time in the step SA2 after manufacturing numerous semiconductor wafer packages A of semiconductor wafers 8 in the step SA1 is advantageous in that the alignment device is not occupied and a total burn-in screening time is greatly reduced, bringing reduction of testing cost.

By the way, when the temperature of semiconductor wafer 8 is increased in the test of step SA2, the alignment operation can be done under the condition that the semiconductor wafer 8 is heated up to a test temperature. By doing this, the alignment operation can take account of thermal expansion of the semiconductor wafers 8 and the semiconductor wafer packages A caused due to temperature increase.

Figure 16:
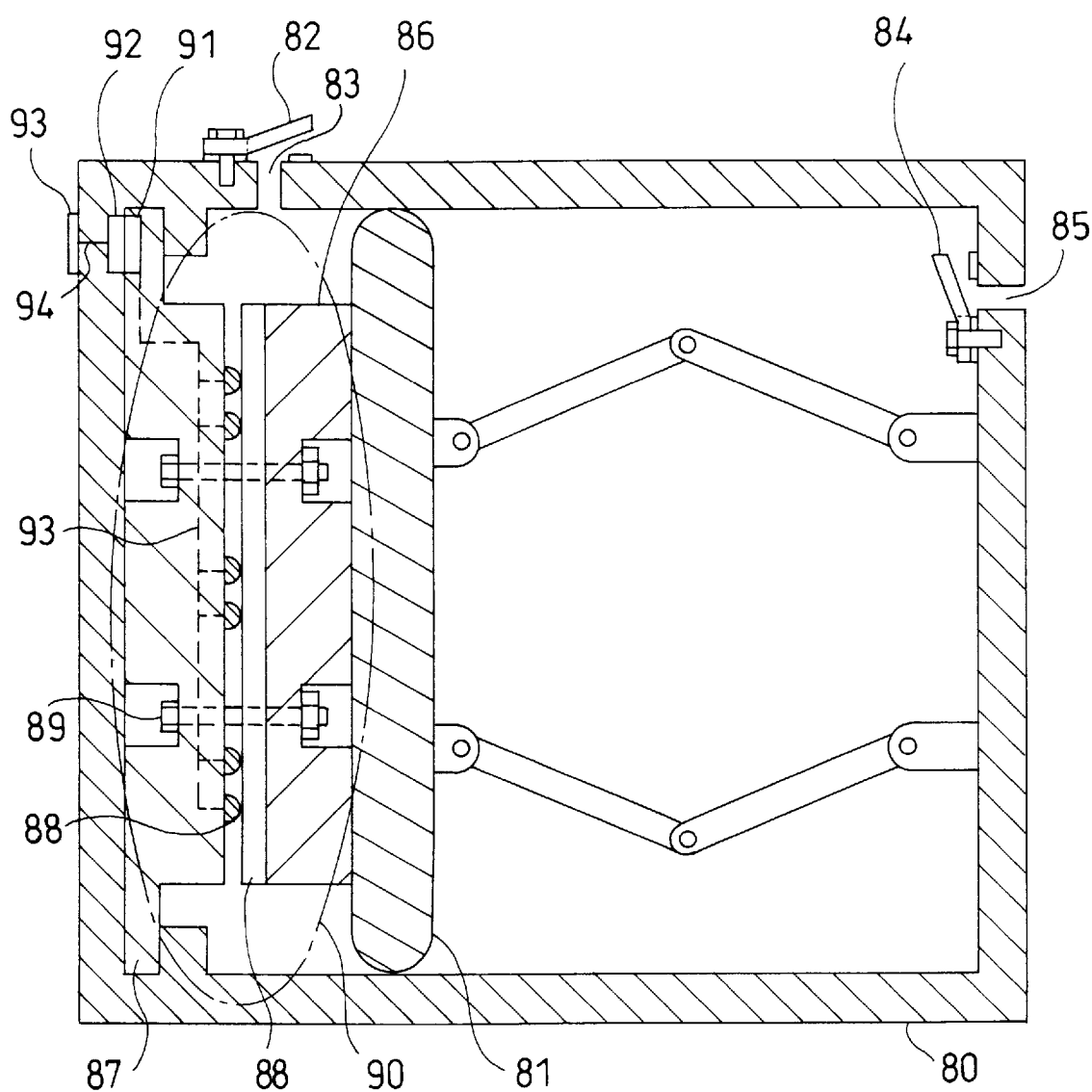
FIG. 16 is a cross-sectional view showing a connecting device connecting IC terminals of a semiconductor wafer and probe terminals in accordance with a ninth embodiment of the present invention.

FIG. 16 is a cross-sectional view showing a connecting device connecting IC terminals of the semiconductor wafer and probe terminals in accordance with a ninth embodiment of the present invention.

As illustrated in FIG. 16, a casing 80 accommodates a diaphragm 81 slidable in the right-and-left direction of FIG. 16. Namely, an inside space of the casing 80 is separated into first and second regions by the diaphragm 81. A first suction hole 83, opened or closed by a first valve 82, is provided in the first region of the casing 80. A second suction hole 85, opened or closed by a second valve 84, is provided in the second region of the casing 80.

The diaphragm 81 has a left surface on which a first ceramic board 86 is fixed, while the casing 80 has a left inside wall on which a second ceramic board 87 is fixed. The second ceramic board 87 is provided with bumps 88 serving as probe terminals. The first ceramic board 86 and the second ceramic board 87 sandwich the semiconductor wafer 88 therebetween and are fixed to each other by means of fixing screws 89. These first and second ceramic boards 86 and 87 constitute a semiconductor wafer package 90.

In the ninth embodiment, the diaphragm 81 moves left together with the first ceramic board 86 by reducing the pressure of the first region of the casing 80 through the first suction hole 83 and also increasing the pressure of the second region of the casing 80 through the second suction hole 85. With this shift movement of the diaphragm 81, the IC terminals of the semiconductor wafer 88 and the bumps 88 are electrically connected and the contact resistance can be reduced. Also external connectors 91 of the semiconductor wafer package 90 and the connectors 92 of the casing 80 are connected; therefore, the bumps 88 are connected to connectors 93 outside the casing 80 by way of the wiring patterns 93 of the second ceramic board 87 and the wiring patterns 94 of the casing 80.

Accordingly the ninth embodiment does not require the semiconductor wafer package 90 to include a pressing means for pressing the bumps 88 against the IC terminals of semiconductor wafer 88, since an independent pressing means is provided outside the semiconductor wafer package 90 to press the bumps 88 against the IC terminals of semiconductor wafer 88.

Figure 17A:
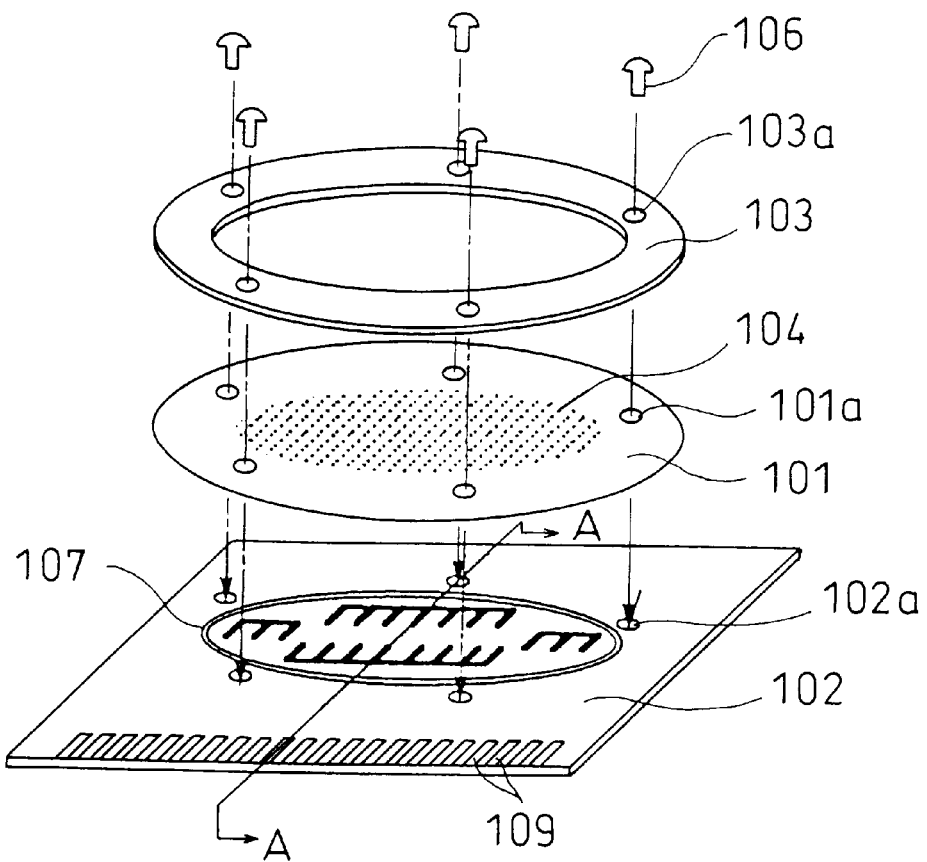
FIG. 17(a) is a perspective view showing a probe card in accordance with a tenth embodiment of the present invention.
Figure 17B:
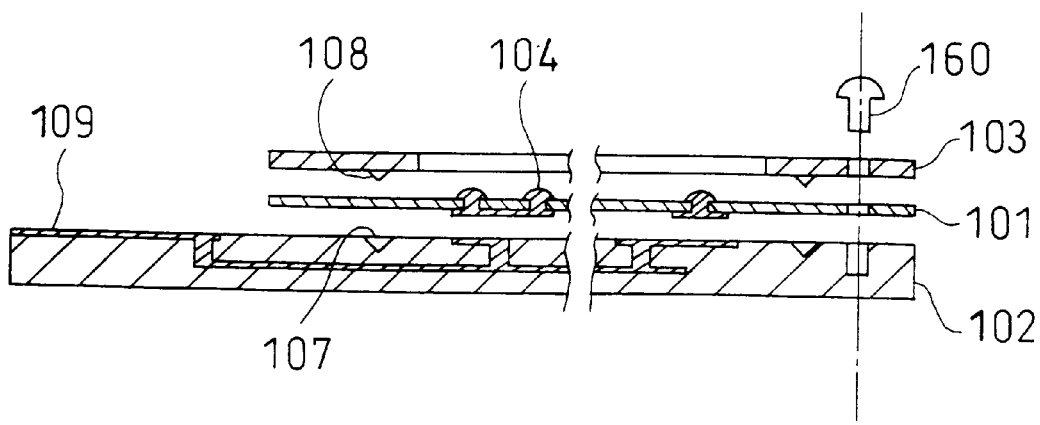
FIG. 17(b) is a cross-sectional view taken along a line A—A of FIG. 17(a)

FIGS. 17(a) and 17(b) are views showing a probe card in accordance with a tenth embodiment of the present invention, wherein FIG. 17(a) is a perspective view and FIG. 17(b) is a cross-sectional view taken along a line A—A of FIG. 17(a).

In FIGS. 17(a) and 17(b), a reference numeral 101 represents a flexible substrate having through holes 101a, a reference numeral 102 represents a wiring substrate 102 made of ceramics and having screw holes 102a, a reference numeral 103 represents a rigid ring made of ceramics and having through holes 103a, and a reference numeral 104 represents bumps acting as probe terminals formed on the flexible substrate 101. A reference numeral 106 represents screws inserted into the through holes 103a and 101a and fastened into the screw holes 102a so that the rigid ring 103 and the wiring substrate 102 can be securely fixed putting the flexible substrate 102 therebetween. A reference numeral 107 represents a ring-shaped groove formed on the wiring substrate 102, and a reference numeral 108 represents a ring-shaped ridge formed on the rigid ring 103. By coupling the ring-shaped ridge 108 with the ring-shaped groove 107, the flexible substrate 101 is surely fixed to the wiring substrate 103 and the rigid ring 103. A reference numeral 109 represents external electrodes formed on the wiring substrate 102.

The two-layer flexible printed substrate shown in the prior art can be used as the flexible substrate 101. Hereinafter, a method of forming the bumps 104 on the flexible substrate 101 will be explained with reference to FIGS. 20(a) to 20(c). The two-layer flexible printed substrate consists of a polyimide layer 111 and a copper foil 112.

Figure 20A:
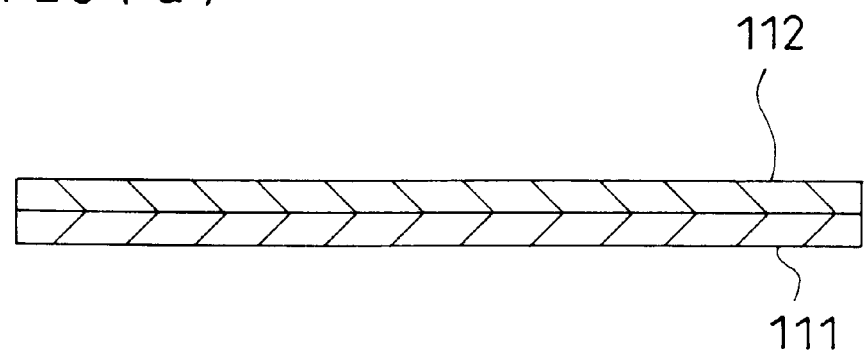
FIGS. 20(a) to 20(c) are cross-sectional views illustrating manufacturing steps of a flexible substrate of the probe card in accordance with the tenth embodiment of the present invention.

First of all, as shown in FIG. 20(a), polyimide (or polyimide precursor) casted on the copper foil 112 of approximately 18 μm thickness, is heated until it dries and cures for forming the polyimide layer 111. The thickness of the cured polyimide layer 111 is approximately 25 μm. The thermal expansion coefficient of polyimide is substantially the same as the thermal expansion coefficient of copper ($16 \times 10^{-6}/°$ C.); therefore, the two-layer flexible printed substrate causes no deflection due to thermal hysteresis.

Figure 20B:
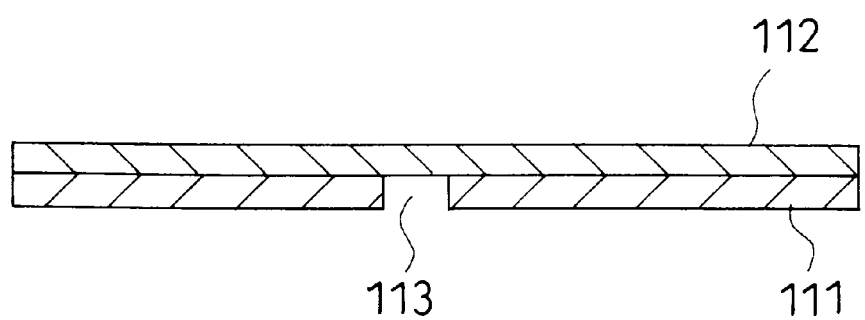

Next, as shown in FIG. 20(b), a thorough hole 113 having a diameter of approximately 30 μm is formed in the polyimide layer 11. Thereafter, a surface of copper foil 112 (i.e. a surface hot formed with the polyimide layer 111) is coated with resist. Then, electric galvanization is conducted using Ni by connecting the copper foil 112 to one of galvanization electrodes. Ni is not deposited on the surface of the copper foil 112 covered by resist. More specifically, the galvanization advances in such a manner that Ni deposition grows in the through hole 113 until the height of Ni deposition reaches the surface of the polyimide layer 111 and, thereafter, the Ni deposition spreads all directions on the polyimide surface, thereby forming a semi-spherical bump 104. The height of bump 104 obtained is approximately 25μm. After that, an electroplating layer 115 of approximately 2 μm Au is formed on the surface of the bump 104 to stabilize the contact resistance between the bump 104 and the pad of semiconductor chip. (Refer to FIG. 20(c))

Figure 20C:
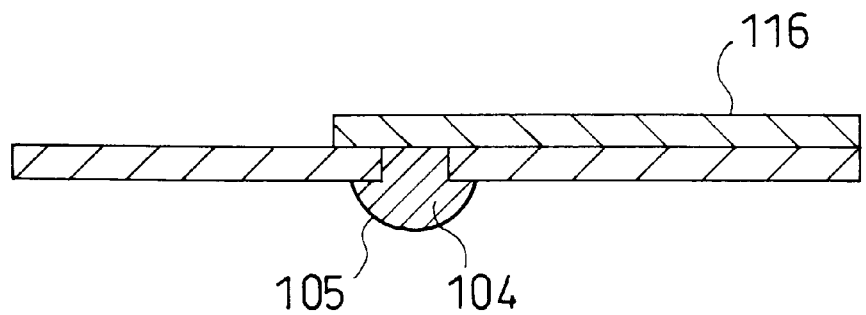

Then, after removing the resist coated on the copper foil 112, a circuit pattern 116 is formed by applying etching on the copper foil 112 based on a conventional method as shown in FIG. 20(c). The circuit pattern 116 is provided only in the vicinity of the bump 104 because, when a tension force is applied on the polyimide member to generate a uniform tensile distortion on the flexible substrate, too much extended circuit pattern 116 may make it impossible to unify the tensile distortion.

The characteristics of polyimide member used in the tenth embodiment is listed in the following table 1.

TABLE 1

| CHARACTERISTICS | VALUES |
|---|---|
| TENSILE STRENGTH | 21 kg/mm$^2$ |
| TENSILE ELASTIC MODULUS | 460 kg/mm$^2$ |
| GLASS TRANSITION TEMP. | 299° C. |
| THERMAL EXPANSION COEF. | 16 × 10$^{-6}$ cm/cm/° C. |

When the burn-in temperature is 125° C. and the alignment temperature is 25° C., a temperature difference T1 is 100° C. It is now assumed that the semiconductor wafer made of Si has a diameter L1 of 200 mm and the chip to be tested has a testing electrode (pad) having a side L2 of 100 μm. Considering the value of L2/(L1×T1) equaling to $5 \times 10^{-6}/°$ C., the thermal expansion coefficient of the wiring substrate 102 is selected so as to satisfy the requirement that the thermal expansion coefficient difference N1 between the wiring substrate 102 and the semiconductor wafer does not exceed $5 \times 10^{-6}/°$ C. On the other hand, the thermal expansion coefficient of the rigid ring 103 is equalized with the thermal expansion coefficient of the wiring substrate 102. As the thermal expansion coefficient of the semiconductor wafer is $3.5 \times 10^{-6}/°$ C., the thermal expansion coefficients of rigid ring 103 and wiring substrate 102 are somewhere between $-1.5 \times 10^{-6}/°$ C. and $8.5 \times 10^{-6}/°$ C.

In the tenth embodiment, to suppress dislocation between the pad and the bump, the wiring substrate 102 is made of mullite series ceramics (i.e. ceramics mainly containing $Al_2O_3$ and $SiO_2$) having the same thermal expansion coefficient $3.5 \times 10^{-6}/°$ C. as that of silicon. The wiring layer is formed on the wiring substrate 102 as shown in FIG. 17(a). The rigid ring 103 is also made of mullite series ceramics to coincide its thermal expansion coefficient.

Although the tenth embodiment uses mullite series ceramics (thermal expansion coefficient: $3.5 \times 10^{-6}/°$ C.) as material constituting the wiring substrate 102 and the rigid ring 103, the semiconductor wafer having a Si tested semiconductor substrate will allow the wiring substrate 102 and the rigid ring 103 to be made of another material such as silicon (thermal expansion coefficient: $3.5 \times 10^{-6}/°$ C.), glass ceramic (thermal expansion coefficient: 3.0 to $4.2 \times 10^{-6}/°$ C.), Aluminum nitride (thermal expansion coefficient: 4.3 to $4.5 \times 10^{-6}/°$ C.), and alumina (thermal expansion coefficient: $7.3 \times 10^{-6}/°$ C.).

Material for the tested semiconductor substrate and material for the rigid member (i.e. the wiring substrate 102 and the rigid ring 103) securely holding the flexible substrate

101 are selected from the material group satisfying a condition N1<N2/(L1×T1), where N1 represents a thermal expansion coefficient difference between the tested semiconductor substrate and the rigid member securely holding the flexible substrate, L1 represents a diametral length of the tested semiconductor substrate (i.e. a diameter for a circle or a diagonal for a rectangle), L2 represents a short side of the testing electrode provided on the tested semiconductor substrate (i.e. a short side for a rectangle or a side for square), and T1 represents a temperature difference between the test temperature and the alignment temperature.

Next, the flexible substrate 101 is mounted on the wiring substrate 102 to manufacture a probe card. A method of fixing the flexible substrate 101 on the wiring substrate 102 is selected from one of the following three methods.

Hereinafter, a first fixing method will be explained.

The flexible substrate 101 is evenly pulled outward along its periphery until the tensile distortion becomes 0.15%. Then, the flexible substrate 101 is clamped between the wiring substrate 102 and the rigid ring 103. The reason why the target tensile distortion is set to 0.15% is as follows. The thermal expansion coefficient difference $N=12.5 \times 10^{-6}/° C.$ is caused between the flexible substrate 101 and the wiring substrate 102, while the temperature difference T=100° C. is caused between the burn-in temperature and the alignment temperature, resulting in T×N=0.125%. Thus, the target tensile distortion is selected to be larger than the above value T×N.

Figure 21A:
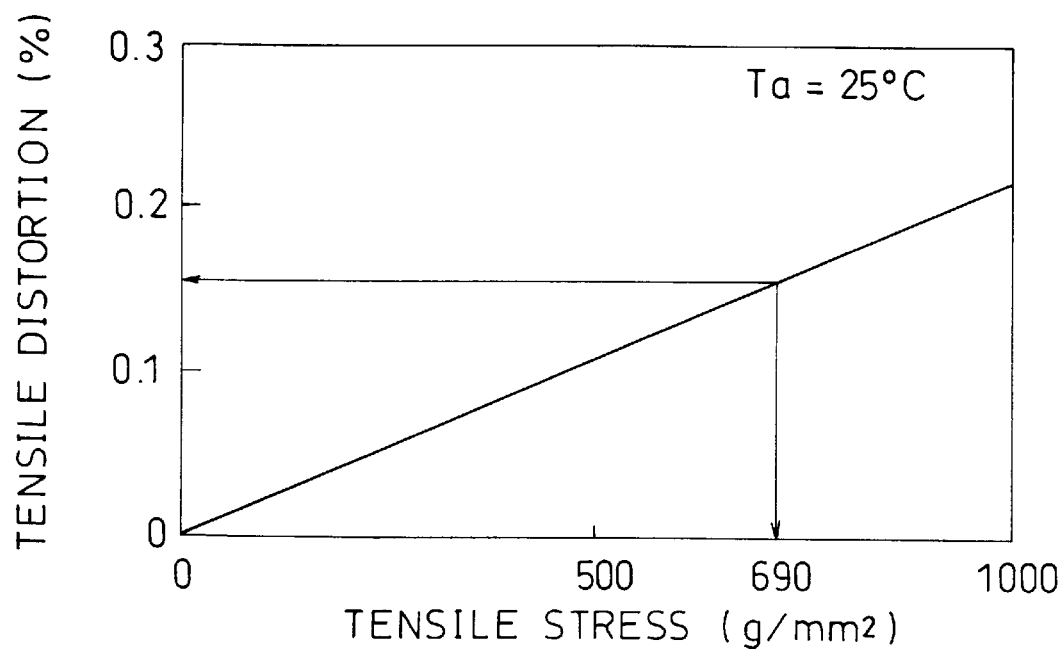
FIG. 21(a) is a graph showing a relationship between tensile stress and tensile distortion in the flexible substrate of the probe card in accordance with the tenth embodiment.
Figure 21B:
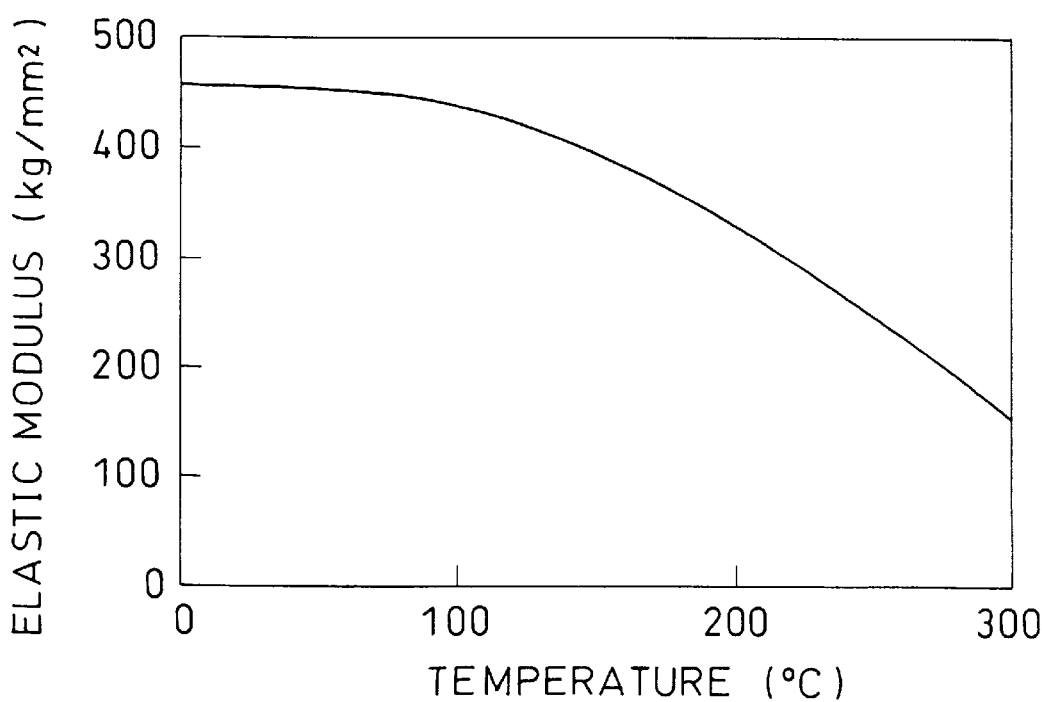
FIG. 21(b) is a graph showing a relationship between temperature and elastic modulus in the flexible substrate of the probe card in accordance with the tenth embodiment.

FIG. 21 shows a relationship between tensile stress and tensile distortion, and FIG. 21(b) shows a relationship between temperature and elastic modulus.

The wiring patterns and bumps on the flexible substrate 101 are formed at an approximately 0.15% reduced scale taking account of tensile distortion generated due to pulling operation. The flexible substrate 101, wiring substrate 102 and rigid ring 103 are fixed together by bonding material or by means of screws 106 as shown in FIG. 1.

Next, a second fixing method will be explained.

The flexible substrate 101, the wiring substrate 102 and the rigid ring 103 are heated up to 175° C. and then fastened by means of the screws 106 under such a heated condition. In this condition, the flexible substrate 101 having polyimide base material expands 0.24% while the wiring substrate 102 and the rigid ring 103 expand 0.05% compared with conditions at the room temperature (25° C.). Accordingly, if the flexible substrate 101, wiring substrate 102 and rigid ring 103 are cooled down to the room temperature after they are fixed together, contraction of the flexible substrate 101 is controlled by the wiring substrate 102 and the rigid ring 103 having strong rigidity. In short, the flexible substrate 101 is pulled at its periphery by the rigid ring 103 so that the tensile distortion increases up to 0.19%. FIG. 22 is a graph showing temperature dependency of the thermal expansion coefficients of polyimide constituting the flexible substrate 101 and ceramic constituting the wiring substrate 102 and the rigid ring 103.

The wiring patterns and bumps on the flexible substrate 101 are formed at an approximately 0.19% reduced scale taking account of tensile distortion generated due to pulling mechanism. To suppress heating contraction in a minimum level, it is preferable to finish the fixing and cooling operations within a short time. This second fixing method is advantageous compared with the first fixing method in that it does not require a complicated pulling operation that uniformly pulls the flexible substrate 101 along the periphery to generate a uniform tensile distortion.

Although the flexible substrate 101, wiring substrate 102 and rigid ring 103 are heated to 175° C. to fix the flexible substrate 101, the heating temperature can be varied in such a manner that the tensile distortion of flexible substrate 101 uniformly exceeds T×N along its surface at the alignment temperature, where N represents a difference between the thermal expansion coefficient of flexible substrate 101 and the thermal expansion coefficient of wiring substrate 102 and rigid ring 103 at the room temperature while T represents a difference between the alignment temperature for aligning the probe card with respect to the semiconductor wafer and the testing temperature for testing the semiconductor wafer. Accordingly, if the heating temperature is not less than 125° C., it will be sufficient for this embodiment. Regarding an upper limit of the heating temperature, a preferable upper limit would be not larger than the glass transition temperature 299° C. of polyimide material. An upper limit not larger than 200° C. would be more preferable since heating contraction does not occur in the polyimide material.

Hereinafter, a third fixing method will be explained.

Figure 23:
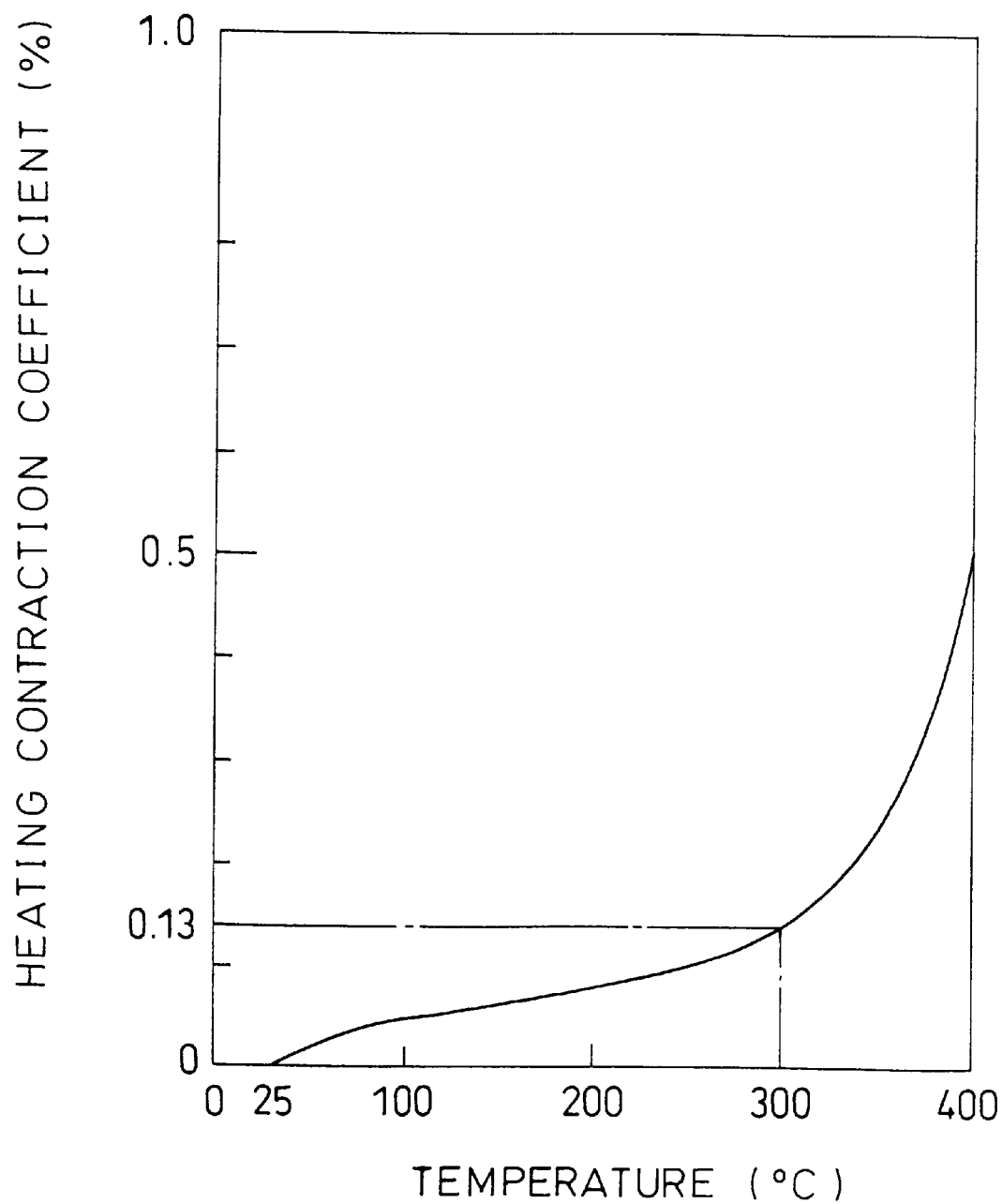
FIG. 23 is a graph showing a relationship between temperature and heating contraction coefficient in the flexible substrate of the probe card in accordance with the tenth embodiment.

First of all, the flexible substrate 101, wiring substrate 102 and rigid ring 103 are assembled together at the room temperature and, then, heated up to 300° C. After leaving them in such a heating condition for 30 minutes, these components are cooled down to the room temperature. With this thermal operation, polyimide substrate constituting the flexible substrate 101 causes heating contraction at degree of 0.13%. This heating contraction occurs under the condition that the periphery of the polyimide substrate is fixed by the wiring substrate 102 and the rigid ring 103; therefore, size reduction is not found within the surface after cooling down to the room temperature. Thus, the tensile distortion of 0.13% is immanent in the polyimide substrate. FIG. 23 is a graph showing a relationship between heating temperature and heating contraction coefficient in the polyimide material.

The third fixing method makes the flexible substrate 101 cause heating contraction after the flexible substrate 101 is assembled with the wiring substrate 102 and the rigid ring 103. Therefore, compared with the first and second fixing methods, size shift is so small that the wiring patterns and bumps need not be formed in a contracted or enlarged size taking account of thermal deformation of the flexible substrate 101.

When bonding material is used to fix the flexible substrate 101, the rigid ring 103 is omitted and the flexible substrate 101 can be directly bonded to the wiring substrate 102.

A testing method using the above-described probe card will be explained hereinafter.

Figure 18A:
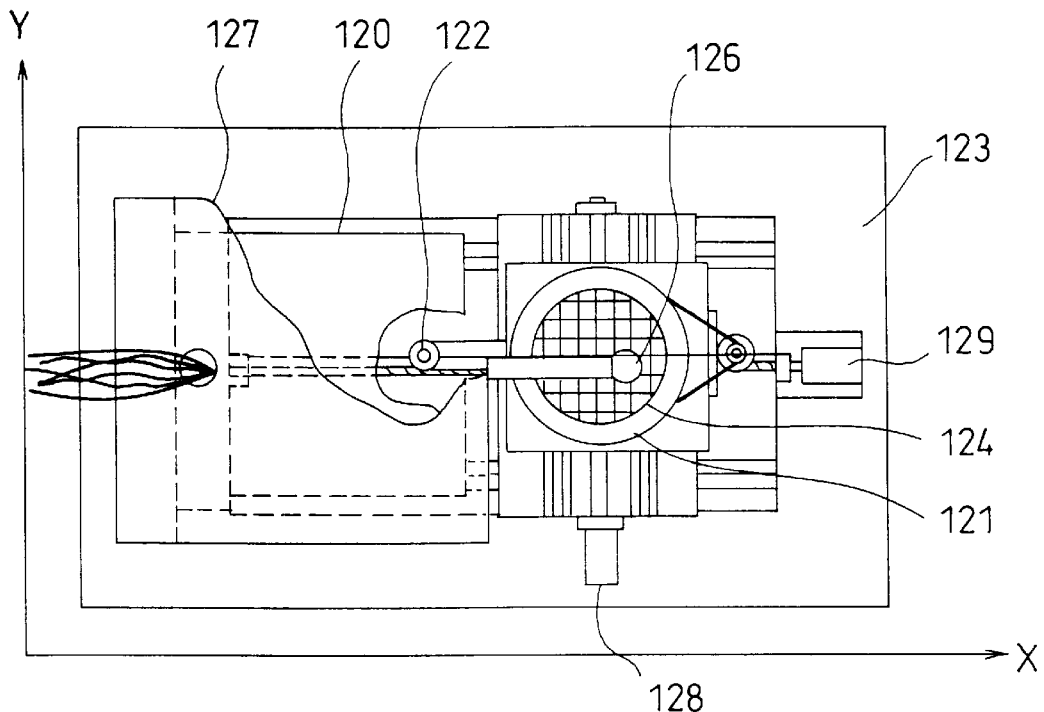
Figure 18B:
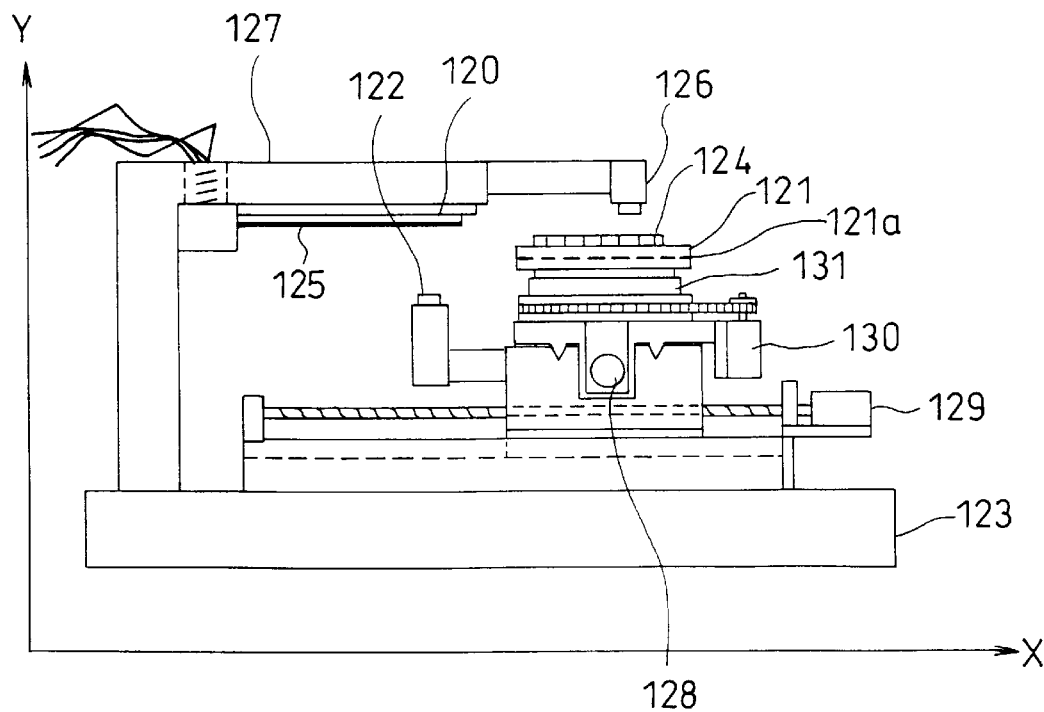

FIGS. 18(a) and 18(b) are views showing an alignment device executing an alignment for a probe card 120 and a semiconductor wafer 124, wherein FIG. 18(a) is a plan view and FIG. 18(b) is a cross-sectional view. In FIGS. 18(a) and 18(b), a reference numeral 121 represents a vacuum chuck on which a semiconductor wafer 124 is mounted. The vacuum chuck 121 has a plurality of holes opened thereon for use of vacuum suction to fix the semiconductor wafer 124. Furthermore, the vacuum chuck 121 houses a heater 121*a* and a temperature sensing device (not shown) to control the temperature of semiconductor wafer 124.

In FIGS. 18(a) and 18(b), a reference numeral 122 represents a probe card alignment camera fixed on the wafer stage 123 together with the chuck 121. The camera 122 takes images of the bumps 125 on the probe card 120. A reference numeral 126 represents a wafer alignment camera installed on the probe card stage 127 together with the probe card 120. The camera 126 is used for alignment of the semiconductor wafer 124 and detection of pad position.

First of all, the probe card alignment camera 122 and an image analysis device (not shown) cooperatively recognize the position and height of bump 125 on the probe card 120. When the probe card 120 is not parallel to the upper surface of vacuum chuck 121, the probe card 120 is automatically adjusted to be positioned parallel to the upper surface of vacuum chuck 121.

Using the wafer alignment camera 126, X-axis control motor 129, Y-axis control motor 128 and θ-axis control motor 130 execute alignment of three axes, X axis, Y axis and θ axis, of the semiconductor wafer 124 transported on the vacuum chuck 121 so that the semiconductor wafer 124 is shifted just beneath the probe card 120. When the alignment is finished, Z-axis control mechanism 131 elevates the vacuum chuck 121 until the semiconductor wafer 124 is brought into contact with the probe card 120. Usually, a measurement of electric characteristics of the semiconductor wafer 124 is executed in this condition. When the measurement of electric characteristics of the semiconductor wafer 124 is executed at high temperatures, the heater 121a of the vacuum chuck 121 is activated to heat the vacuum chuck 121 and the semiconductor wafer 114. The probe card 120 is also heated by heat transferred from the semiconductor wafer 124. However, the flexible circuit substrate 101 constituting the probe card 120 is fixed to the rigid ring 103 with tensile distortion at a room temperature as described previously. Accordingly, thermal expansion of the probe card 120 may moderate the tensile distortion of the flexible circuit substrate 101 but is not so large that the flexible circuit substrate 101 is too much expanded and loosened. Therefore, it is free from the problem of the conventional probe card that the bumps cause dislocation on the pad or go out of the pad.

According to the probe card 120 of the tenth embodiment, the flexible substrate 101 having a relatively large thermal expansion coefficient is fixed by the wiring substrate 102 and rigid ring 103 having thermal expansion coefficients similar to that of the semiconductor wafer in such a manner that tensile distortion is uniformly produced at a room temperature. Therefore, even if the probe card 120 is heated, looseness of the probe card 120 or dislocation between the bumps and the pad is not found.

Figure 19A:
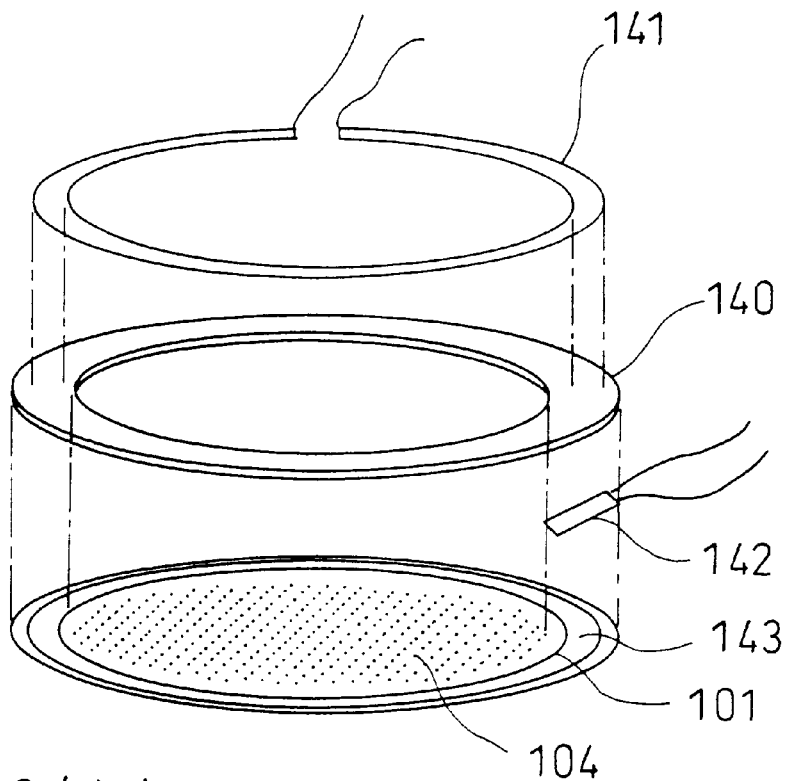
FIGS. 19(a) and 19(b) are perspective views showing a probe card in accordance with an eleventh embodiment of the present invention.
Figure 19B:
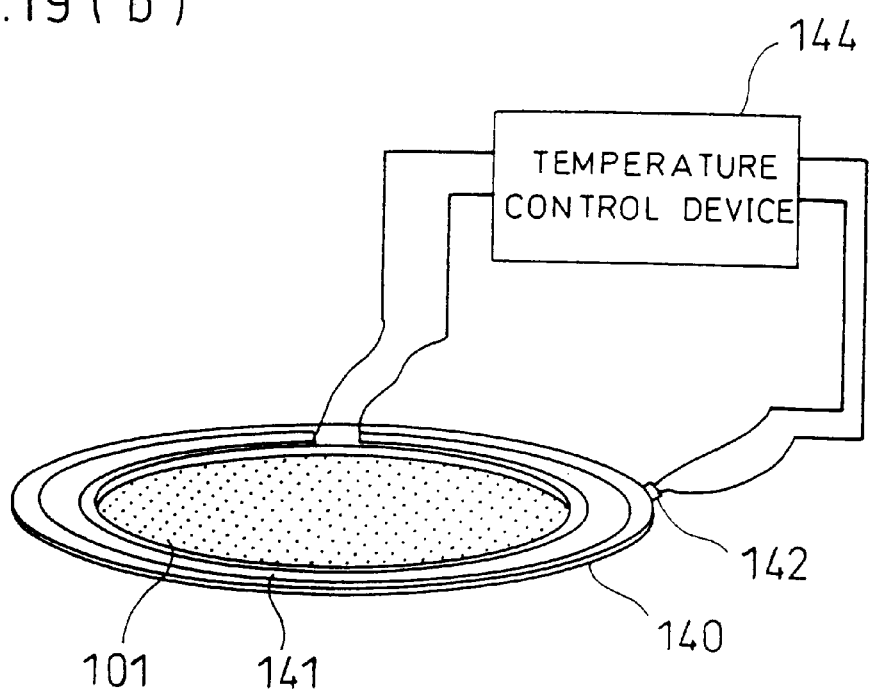

FIGS. 19(a) and 19(b) are perspective views showing a probe card in accordance with an eleventh embodiment of the present invention.

In the eleventh embodiment, the flexible substrate 101 is similar to that of the tenth embodiment. The eleventh embodiment is characterized in that the thermal expansion coefficient of a rigid ring 140 holding the flexible substrate 101 is larger than that of the flexible substrate 101, and a heater 141 is provided in the rigid ring 140. The heater 141 can be housed in the rigid ring 140 or can be attached on the surface of the rigid ring 140. According to the probe card of the eleventh embodiment, the flexible substrate 101 is fixed to the rigid ring 140 by bonding material 143.

Material constituting the rigid ring 140 is aluminum. Aluminum has a thermal expansion coefficient of $23.5 \times 10^{-6}/°$ C. which is larger than the thermal expansion coefficient $16 \times 10^{-6}/°$ C. of polyimide constituting the flexible substrate 101.

Besides aluminum, any rigid material having a thermal expansion coefficient larger than that of the flexible substrate 101, such as copper (thermal expansion coefficient: $17.0 \times 10^{-6}/°$ C.), would be used as the material constituting the rigid ring 140.

A manufacturing method of the probe card in accordance with the eleventh embodiment will be explained hereinafter.

First of all, after the flexible substrate 101 is fixed to the rigid ring 140, the heater 141 is activated to heat the rigid ring 140 up to a predetermined temperature with thermal expansion. The temperature of the rigid ring 140 is detected by a temperature sensor 142 such as a thermocouple interposed between the rigid ring 140 and the flexible substrate 101. A temperature control device 144 controls current flowing through the heater 141 on the basis of the temperature detected by the temperature sensor 142, thereby adjusting the temperature of the rigid ring 140. Thermal expansion of the rigid ring 140 pulls the flexible substrate 101 outward; thus, the flexible substrate 101 causes analogous expansion.

When the rigid ring 140 is heated up to 125° C., the rigid ring 140 causes an expansion of 0.235% due to a temperature difference 100° C. between the room temperature and heated temperature. Thus, the flexible substrate 101 is pulled 0.235% as a whole. It means that the flexible substrate 101 maintains 0.235% tensile distortion. Thus, in the case that a measurement of a semiconductor wafer is conducted at 125° C., the flexible substrate 101 is formed in a 0.2% reduced size based on a thermal expansion coefficient difference between the flexible substrate 101 and the semiconductor wafer (i.e. 0.234%–0.035%) since the semiconductor wafer causes a 0.035% expansion. Alignment of bump height and positional detection of the probe card are executed in this condition in the same manner as in the tenth embodiment.

Next, an alignment of the semiconductor wafer is executed to electrically connect the probe card and the semiconductor wafer. Thereafter, even if the semiconductor wafer is heated up to 125° C., the flexible substrate 101 causes neither expansion nor looseness. Because, the flexible substrate 101 maintains 0.235% tensile distortion, although the flexible substrate 101 normally causes approximately 0.16% expansion due to its thermal expansion coefficient. Thus, relaxation of tensile distortion is solely found unless the thermal expansion coefficient exceeds the value of the tensile distortion. Hence, no dislocation occurs between the pad and the bump.

According to the probe card in accordance with the eleventh embodiment, the flexible substrate 101 having a relatively large thermal expansion coefficient is fixed to the rigid ring 140 having a thermal expansion coefficient larger than that of the flexible substrate 101, while the flexible substrate 101 is pulled outward by heating the rigid ring 140. Thus, even in a condition that the probe card is heated, probing is feasible without causing deflection.

Regarding the rigid ring 140 holding the flexible substrate 101, any configuration will be allowed as long as it maintains sufficient strength. A circular shape is, however, preferable in view of reduction of thickness and weight. As a circular shape is advantageous in uniformly distributing a given force to everywhere in the rigid ring 140, no distortion is caused in the rigid ring 140.

Figure 24:
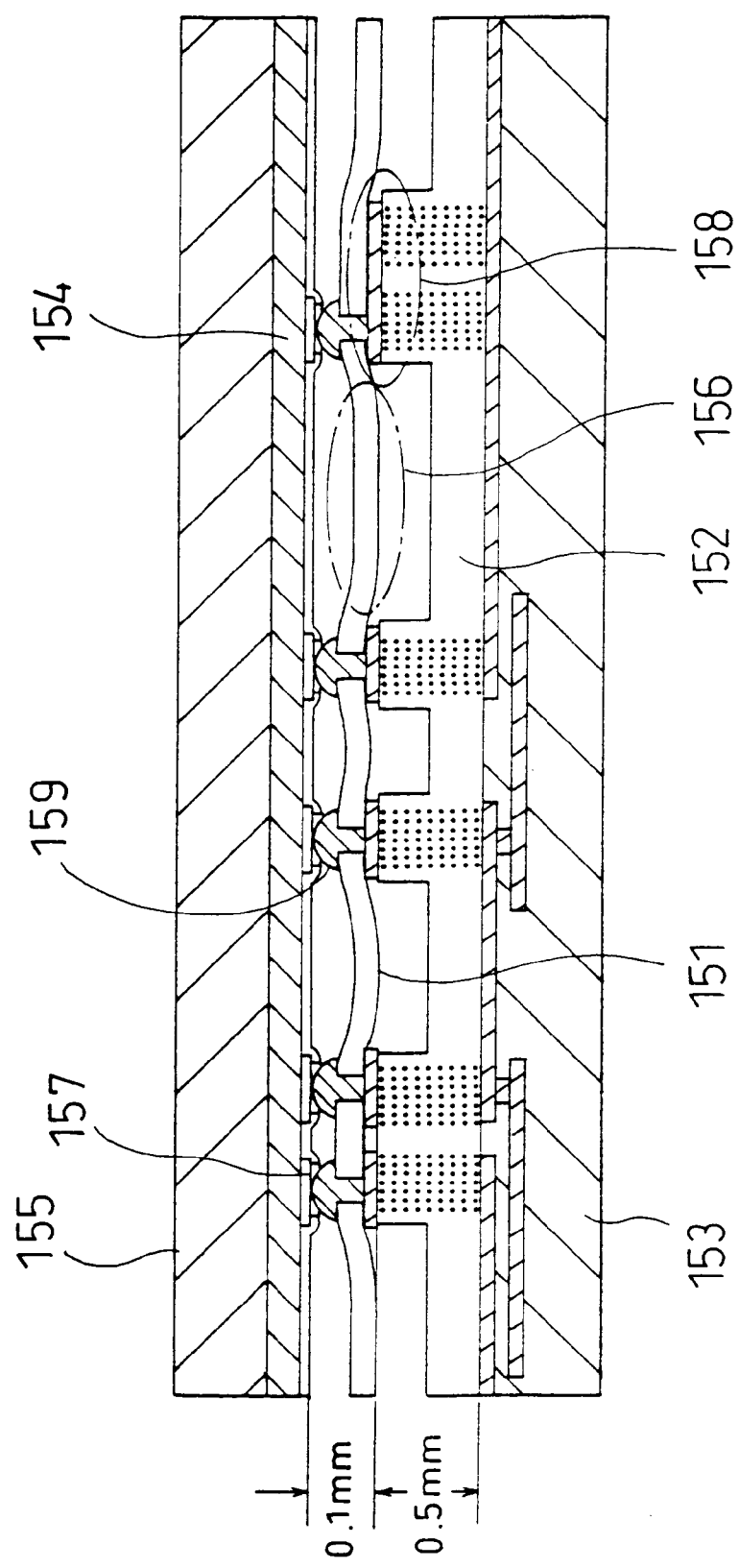
FIG. 24 is a cross-sectional view showing a probe card in accordance with a twelfth embodiment of the present invention.

FIG. 24 is a cross-sectional view showing a probe card in accordance with a twelfth embodiment of the present invention.

In FIG. 24, a reference numeral 151 represents a flexible substrate, a reference numeral 152 represents an maldistributed anisotropic conductive rubber sheet, a reference numeral 153 represents a wiring substrate made of ceramics, a reference numeral 154 represents a semiconductor wafer made of Si, a reference numeral 155 represents a rigid retainer board holding the semiconductor wafer 154, a reference numeral 156 represents deflection of the anisotropic conductive rubber sheet 152, a reference numeral 157 represents a pad formed on the semiconductor wafer 154, and a reference numeral 159 represents bumps formed on the flexible substrate 151.

Figure 25A:
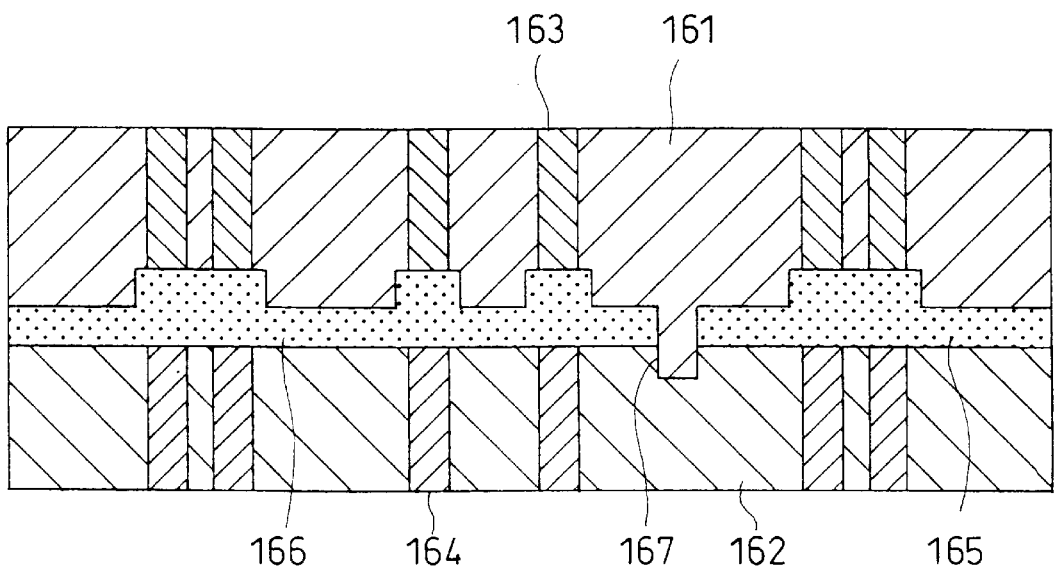
FIGS. 25(a) and 25(b) are cross-sectional views illustrating manufacturing steps of the probe card in accordance with the twelfth embodiment of the present invention.
Figure 25B:
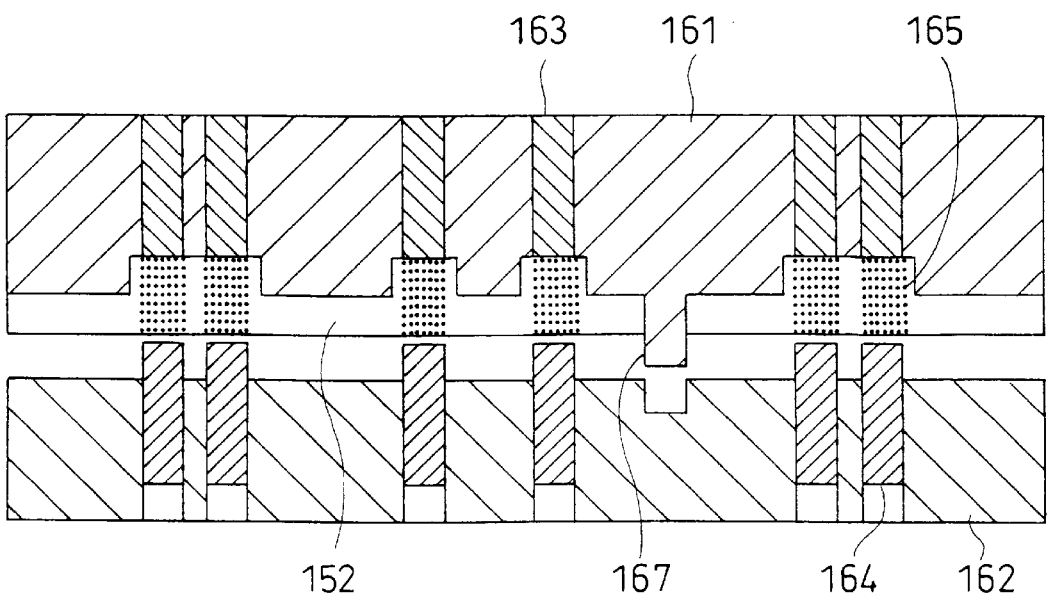

FIGS. 25(a) and 25(b) are cross-sectional views illustrating manufacturing steps of the probe card in accordance with the twelfth embodiment of the present invention. In FIGS. 25(a) and 25(b), a reference numeral 161 represents an upper die, a reference numeral 162 represents a lower die, a reference numeral 163 represents a magnetic member buried in the upper die 161, a reference numeral 164 represents a magnetic member buried in the lower die 162, a reference numeral 165 represents Au/Ni balls, a reference numeral 166 represents a silicone rubber filled with Au/Ni balls 165, a reference numeral 167 represents a protrusion provided on the upper die 161 for adjusting the position and height.

Hereinafter, a manufacturing method of the maldistributed anisotropic conductive rubber sheet 152 shown in FIG. 24 will be explained.

As shown in FIG. 25(a), the upper die 161 and the lower die 162 are prepared to form a rubber sheet. These dies are made of non-magnetic and resin material. Holes for burying magnetic member therein are opened in the upper and lower dies 161 and 162 so as to confront to each other. Then, magnetic member 163, 164 are buried in these holes. In the upper die 161, the vicinity of each hole for burying the magnetic member 163 is recessed compared with another region. A clearance between the upper die 161 and the lower die 162 is designed to be 500 μm in the vicinity of the magnetic member 163 and 200 μm in another region.

Subsequently, a non-cured silicone rubber 166 containing a predetermined amount of dispersed Au/Ni balls 165 serving as conductive particles is sandwiched between the upper and lower dies 161 and 162. Each Au/Ni ball 165 is a Ni ball having a 10 μm diameter covered with Au plating of approximately 1 μm. Under this condition, magnetic field is given around the upper and lower dies 161 and 162. With such an application of magnetic field, Au/Ni balls 165 dispersed in the silicone rubber 166 are relocated locally due to magnetic field generated from the magnetic members 163, 164 in such a manner that chain-like disposed consecutive Au/Ni balls 165 bridge from the magnetic member 163 to the confronting magnetic member 164. If supersonic wave vibration is applied to the upper and lower dies 161 and 162, Au/Ni balls 165 will be more effectively relocated. After the Au/Ni balls 165 are relocated at predetermined positions, the silicone rubber 166 is thermally cured to form the anisotropic conductive rubber sheet 152.

Thereafter, the anisotropic conductive rubber sheet 152 is released from the lower die 162 by pushing the magnetic members 164 of the lower die 162 upward as shown in FIG. 25(b).

Next, the protrusion 167 of the upper die 161 is coupled into a positioning recess formed on the wiring substrate 153 made of ceramics, and the wiring substrate 153 is aligned with respect to the upper die 161. Thus, the anisotropic conductive rubber sheet 152 is assembled on the wiring substrate 153. After that, the anisotropic conductive rubber sheet 152 and the wiring substrate 153 are released from the upper die 161 by lowering the magnetic members 163.

Subsequently, the flexible substrate 151 fabricated according to the above-described conventional method is aligned on and assembled with the anisotropic conductive rubber sheet 152 and the wiring substrate 153, thereby accomplishing a probe card.

Next, a testing method using the probe card in accordance with the twelfth embodiment will be explained with reference to FIG. 24.

First, a predetermined electric power source (not shown) and signal source are connected to an electrode (not shown) taken out of the wiring substrate 153 of the probe card.

Next, the flexible substrate 151 and the semiconductor wafer 154 held the rigid retainer board 155 are aligned, and the bumps 159 of the flexible substrate 151 are connected to the pad 157 of the semiconductor wafer 154. More specifically, each bump 159 is imparted approximately 20 g load by pressing the retainer board 155 against the wiring substrate 153. A pressing force applied on the retainer board 155 and wiring substrate 153 is effectively acted on the bumps 159 only by virtue of irregular configuration of the anisotropic conductive rubber sheet 152. Thus, the anisotropic conductive rubber sheet 152 receives approximately 20% distortion in a longitudinal direction at a projected portion where Au/Ni balls 165 are buried. To ensure the contact between bumps 159 and pad 157, supersonic wave vibration is given from the semiconductor wafer 154 side or the wiring substrate 153 side. Thus, engagement between bumps 159 and pad 157 is ensured.

Next, the semiconductor wafer 154 or all the system is heated up to the testing temperature of 125° C. With this heating operation, each material causes thermal expansion. An expansion ratio of heating temperature to room temperature (25° C.) is 0.16% for the flexible substrate 151 made of polyimide, and 0.035% for the wiring substrate 153 made of ceramics and the semiconductor wafer 154 made of Si. From this fact, an eight-inch semiconductor wafer 154 will cause a thermal expansion difference of 125μ between its center and periphery with respect to the flexible substrate 151.

However, the flexible substrate 151 is in a condition that it is pressed against the semiconductor wafer 154 by bumps 159. Therefore, the thermal expansion difference between the flexible substrate 151 and the semiconductor wafer 154 is absorbed by deflection 156 caused between bumps 159 on the flexible substrate 151. Hence, no dislocation is found between the pad 157 and bumps 159 even in the periphery of the semiconductor wafer 154.

Next, a high-temperature test is carried out under the condition that the probe card and the semiconductor wafer connected as described above are supplied with an electric power voltage and a signal from the electric power source and the signal source connected to the wiring layer of the wiring substrate. In this test, the anisotropic conductive rubber sheet 152 expands approximately 1%. However, the anisotropic conductive rubber sheet 152 is fixed to the wiring substrate 153 having so small tensile (compression) elastic modulus of 0.14 kg/mm² that can be regarded as a rigid member. Thus, deformation of the anisotropic conductive rubber sheet 152 due to thermal expansion can be sufficiently suppressed by the wiring substrate 153.

As explained above, the probe card in accordance with the twelfth embodiment comprises the flexible substrate 151 having bumps 159, the anisotropic conductive rubber sheet 152 having irregular surface, and the wiring substrate 153 having wiring. Therefore, even if temperature is changed, a probing is feasible without causing dislocation between the bumps 159 and the pad 157. Provision of elastic silicone rubber at a pressing portion makes it possible to absorb unevenness of semiconductor wafer surface or bump height. Furthermore, an irregular surface of the silicon rubber is useful to effectively apply a pressing force between the bumps 159 and the pad 157. Thus, an overall pressing force can be reduced, and arrangement of the probing device can be simplified as a whole.

Although, the twelfth embodiment adopts an maldistributed anisotropic conductive rubber (i.e. an anisotropic conductive rubber containing conductive particles locally distributed at predetermined places) as the anisotropic conductive rubber sheet 152, a non-maldistributed type is usable for electrically connecting the multi-layer wiring substrate 153 made of ceramics and the flexible substrate 151. For example, a dispersion type anisotropic conductive rubber would be used as long as an unwanted electrical connection is surely avoided between the multi-layer wiring substrate 153 and the terminal electrode of the flexible substrate 151 at portions other than predesignated portions by providing a countermeasure such as an insulating later covering at least either one of these two substrates. Or, a pressing type anisotropic conductive rubber (i.e. an anisotropic conductive rubber allowing current to flow at only a portion where a pressure is applied) would be used if the protrusion of the terminal electrode is utilized.

In the case where the anisotropic conductive rubber sheet 152 has an allowable current density smaller than that of the flexible substrate 151, a pitch conversion 158 is provided as shown in FIG. 24 and an area of the wiring layer (i.e. the circuit pattern 116 in FIG. 20) of the flexible substrate 151 is enlarged in order to bring the wiring layer of flexible substrate 151 into electrical contact with the anisotropic conductive rubber sheet 152 at a wider area. Thus, a large electric current is supplied to the semiconductor wafer with a smaller pitch.

Figure 26A:
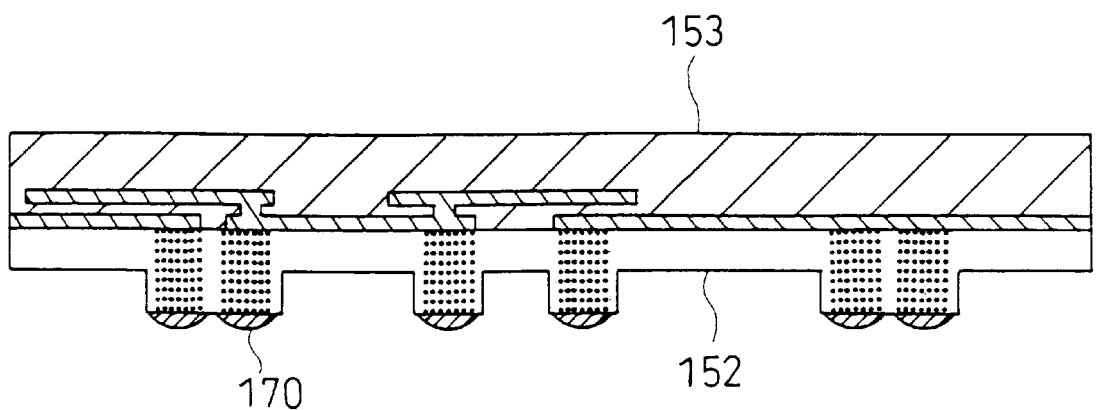
FIGS. 26(a) and 26(b) are cross-sectional views showing a probe card in accordance with a thirteenth embodiment of the present invention.
Figure 26B:
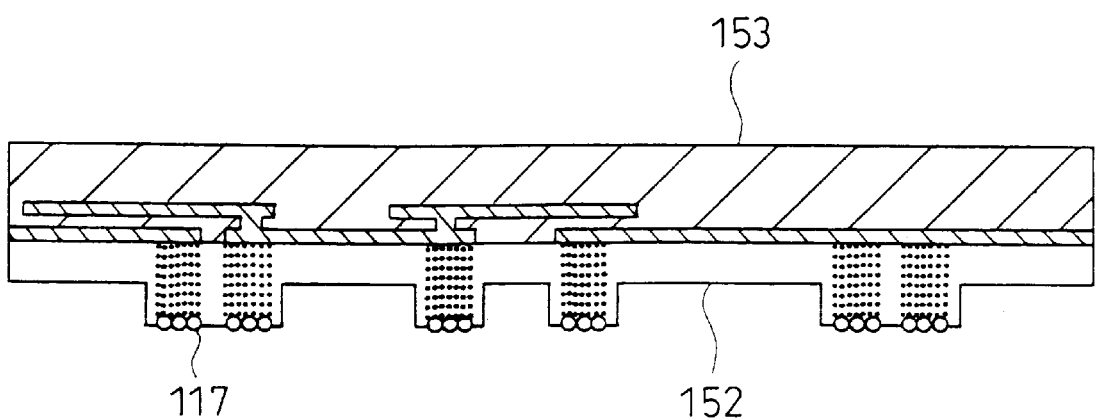

FIG. 26(*a*) is a cross-sectional view showing a probe card in accordance with a thirteenth embodiment of the present invention.

In FIG. 26(*a*), a wiring substrate 153 made of ceramics and an anisotropic conductive rubber sheet 152 are substantially the same as those of the twelfth embodiment. Manufacturing method of the wiring substrate 153 and the anisotropic conductive rubber sheet 152 and connecting method between the semiconductor wafer and the wiring substrate are also similar to those of the twelfth embodiment.

The thirteenth embodiment is characterized in that bumps 170 are directly provided on the anisotropic conductive rubber sheet 152. The bumps 170 of the anisotropic conductive rubber sheet 152 are formed by electroless plating of Cu applied only on the Au plating layer of Au/Ni ball. Thus formed anisotropic conductive rubber sheet 152 can easily break a protecting layer of alumina film formed on the pad surface, realizing excellent contact characteristics.

A testing method of semiconductor wafer is similar to that of the twelfth embodiment.

As explained above, the thirteenth embodiment providing the bumps 170 directly on the anisotropic conductive rubber sheet 152 makes it possible to execute a high-temperature probing in the wafer condition with a simplified arrangement.

Formation of the bumps 170 on the anisotropic conductive rubber sheet 152 can be done by electric field plating instead of above-described electroless plating. Besides Cu, various material such as Ni, Au, Ag, Ph or their combination would be used for the plating.

Furthermore, a method shown in FIG. 26(*b*) can be used for forming the bumps 170 on the anisotropic conductive rubber sheet 152 without using plating. More specifically, metallic balls (or balls covered by metallic plating layer) 171 having a relatively large particle size (10 μm–several tens μm) are buried within a region where the bumps 170 are formed on the anisotropic conductive rubber sheet 152. In this case, it is preferable that more than half of each metallic ball 171 is buried in the anisotropic conductive rubber sheet 152 to prevent the ball 171 from falling.

Figure 27A:
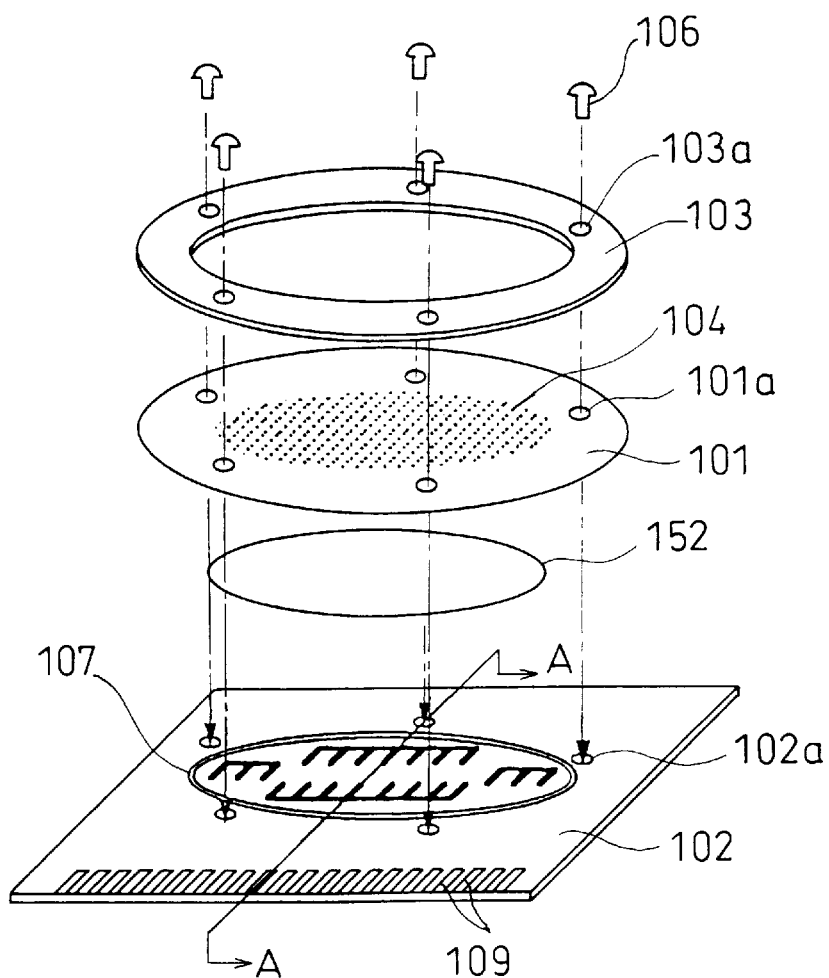
Figure 27B:
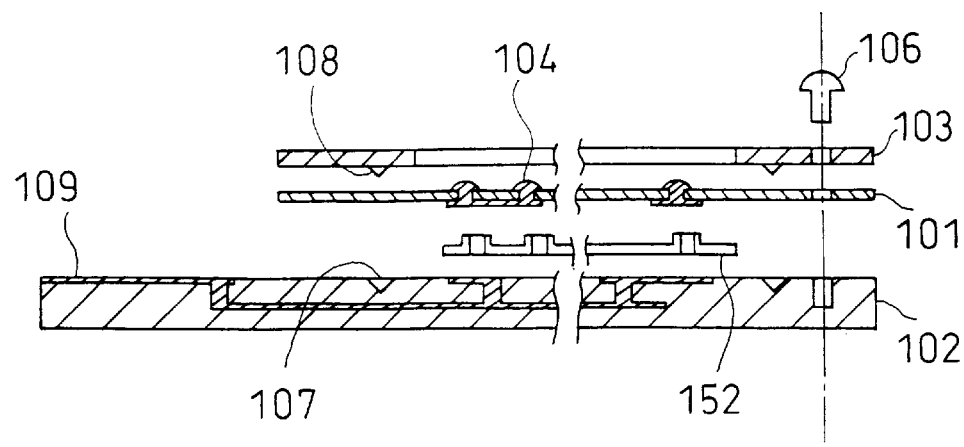

FIGS. 27(*a*) and 27(*b*) are views showing a probe card in accordance with a fourteenth embodiment which is a combination of the tenth embodiment and the twelfth embodiment.

By designating identical parts by the same reference numerals as the tenth or twelfth embodiment, the explanation of the fourteenth embodiment (FIGS. 27(*a*) and 27(*b*)) is omitted.

Providing the anisotropic conductive rubber sheet 152 of the twelfth embodiment between the flexible substrate 101 and the wiring substrate 102 of the tenth embodiment can eliminate dislocation between the pad and the bumps due to thermal expansion of the flexible substrate 1. Furthermore, unevenness of bump height or contact resistance between the bumps and the pad due to deflection or the like of the semiconductor wafer can be reduced, and it becomes possible to effectively apply a pressing force on the bumps.

FIGS. 28 through 31(*b*) are views showing a testing method of a semiconductor integrated circuit in accordance with a fifteenth embodiment of the present invention.

Figure 28:
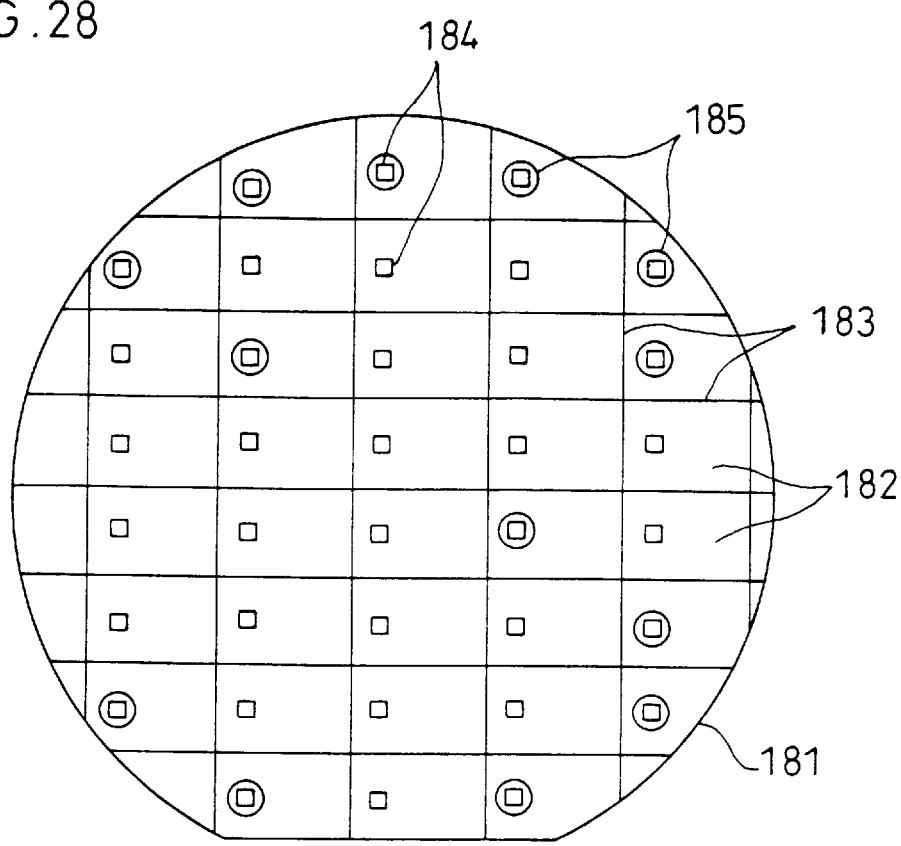
FIG. 28 is a plan view showing a semiconductor wafer to be tested in a testing method of a semiconductor integrated circuit in accordance with a fifteenth embodiment of the present invention.

FIG. 28 shows a semiconductor wafer to be tested in the test. In FIG. 28, a reference numeral 181 represents a semiconductor wafer, a reference numeral 182 represents chips formed on the semiconductor wafer 181, a reference numeral 183 represents a scribe line, a reference numeral 184 represents an electric power source pad, and a reference numeral 185 represents a non-conductive resin layer coated on the electric power source pad 184 corresponding to the chip 182 being judged as defective as a result of the test.

Figure 29:
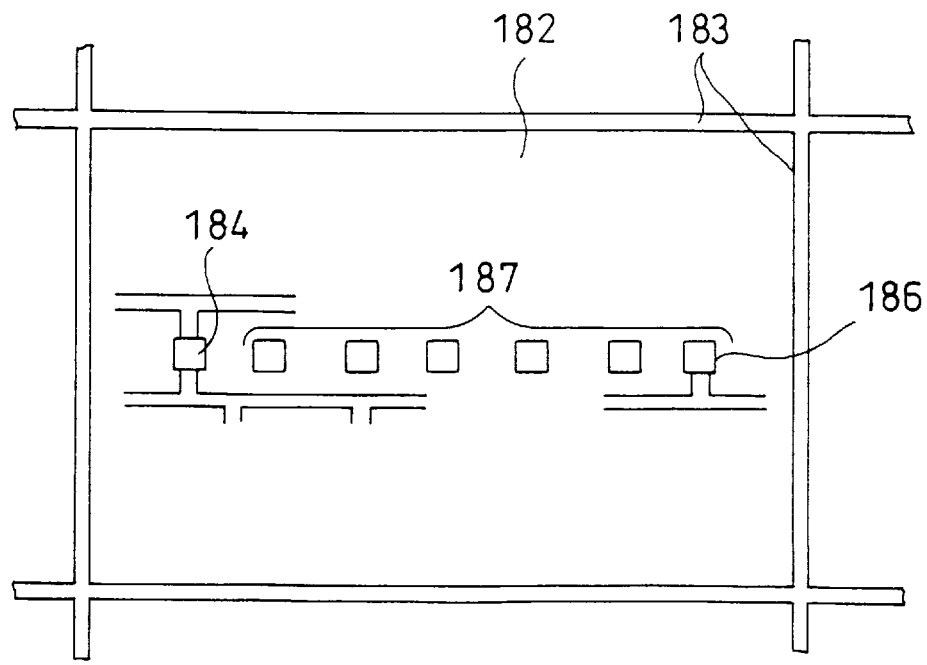
FIG. 29 is a partially enlarged view showing the semiconductor wafer shown in FIG. 28.

FIG. 29 is a partially enlarged view showing the semiconductor wafer shown in FIG. 28. In FIG. 29, a reference numeral 186 represents a GND pad and a reference numeral 187 represents a signal line pad.

FIGS. 30(*a*) and 30(*b*) are cross-sectional views showing the connecting condition between the electric power source pad 184 and the bump 188 of the probe card 187. FIG. 30(*a*) represents a connecting condition of a non-defective chip, while FIG. 30(*b*) represents a defective chip having an opened connection. In FIGS. 30(*a*) and 30(*b*), a reference numeral 189 represents a polyimide substrate constituting the probe card 187, a reference numeral 190 represents a wiring pattern formed on the polyimide substrate 189, and a reference numeral 191 represents a surface protecting film formed on the semiconductor wafer 181.

First of all, a wafer test prior to a burn-in screening will be explained.

A stationary probe needle (not shown) connected to an external measuring device (not shown) is brought into contact with the electric power source pad 184 and the signal line pad 10 of the chip 182, thereby executing a predetermined wafer test prior to the burn-in screening which includes simple operation tests such as check of short-circuit between the electric power source pad 184 and the GND pad 186 or check of short-circuit between each pad (not shown) and the electric power source pad 184 or the GND pad 186. When the chip 182 comprises a self-testing circuit (BIST circuit) therein to execute the burn-in screening, a test of the self-testing circuit is also carried out.

If the test result shows that a chip 182 is a defective, its electric power source pad 184 is completely coated by non-conductive resin to form the non-conductive resin layer 185. A preferable non-conductive resin would be soluble in non-volatile solvent and capable of causing large volume contraction when it is dried after coating. Because, it is advantageous in reducing the film thickness of the non-conductive resin layer 185.

A marker putting a marking on a defective chip is normally used to coat the non-conductive resin. When a single chip 182 needs to be applied the coating of non-conductive resin at a plurality of portions thereon, the coating is executed by using a plurality of markers or by shifting either the semiconductor wafer 181 or the marker. If the non-conductive resin is colored in red, it will be useful to find a defective chip in the same manner as in the conventional marking for defective chips.

Next, the burn-in screening will be explained.

In the burn-in screening, to probe the entire surface of the semiconductor wafer 181, the probe card having the previously described arrangement is used.

Figure 30A:
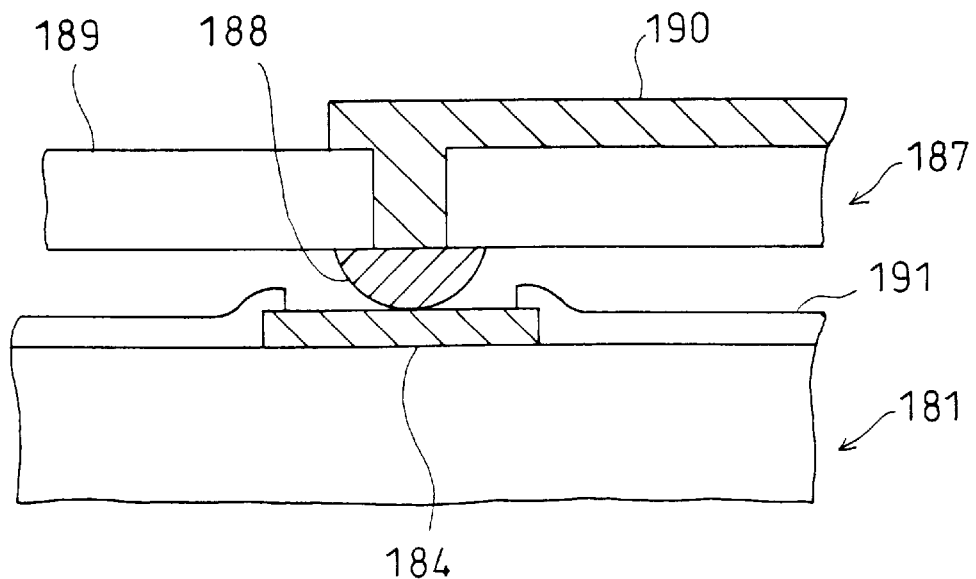
FIGS. 30(a) and 30(b) are cross-sectional views showing the testing method of a semiconductor integrated circuit in accordance with the fifteenth embodiment of the present invention.
Figure 30B:
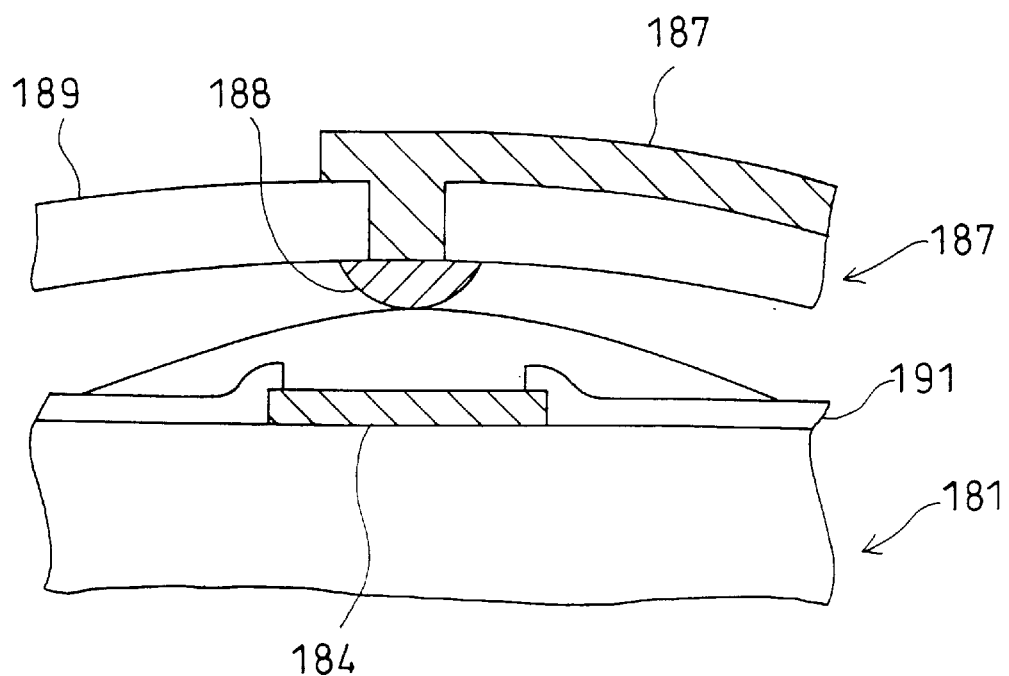
Figure 31A:
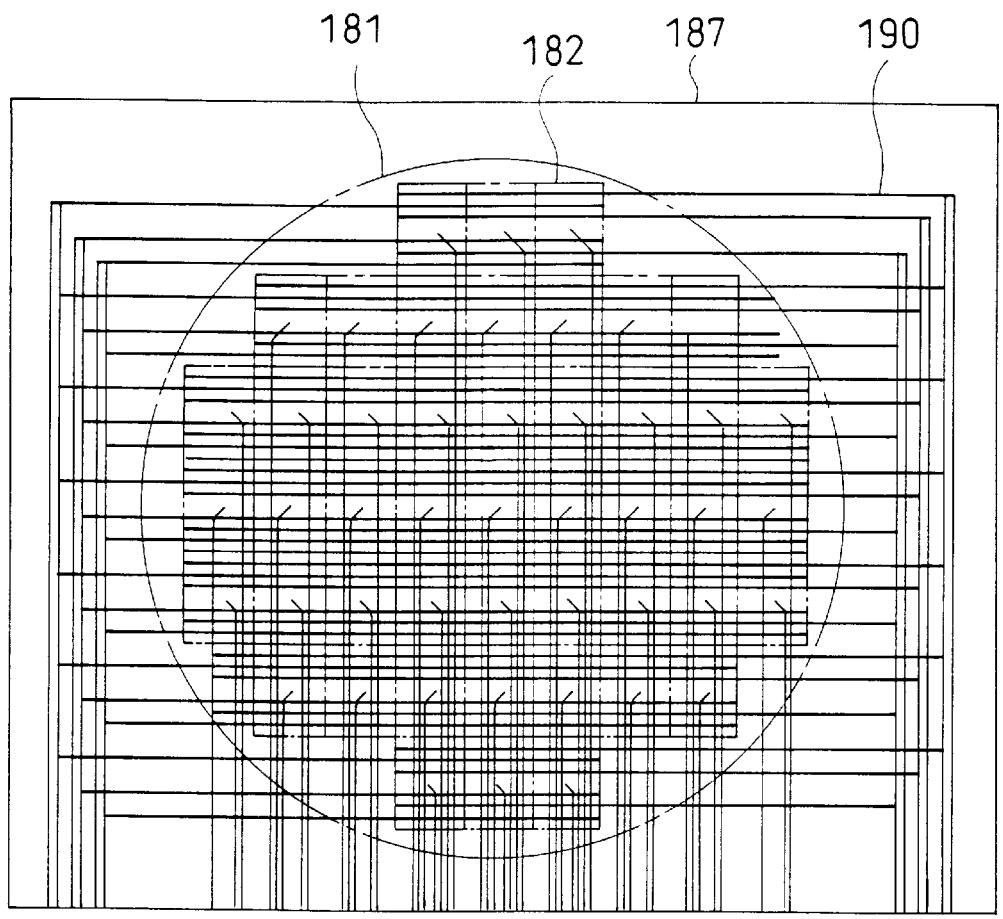
Figure 31B:
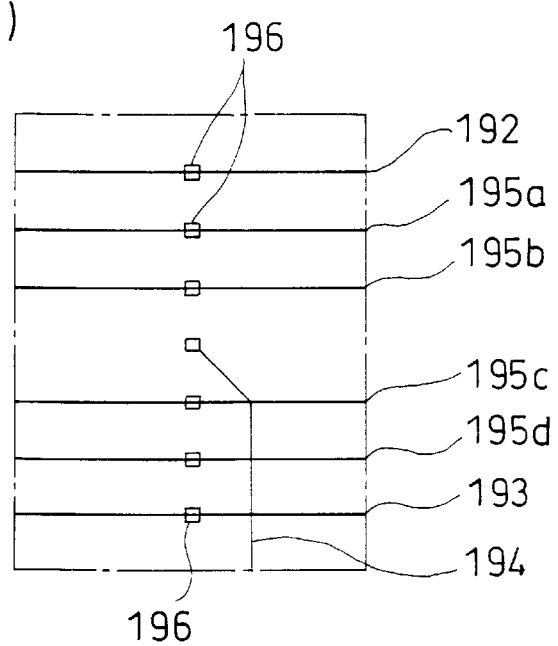
Figure 32:
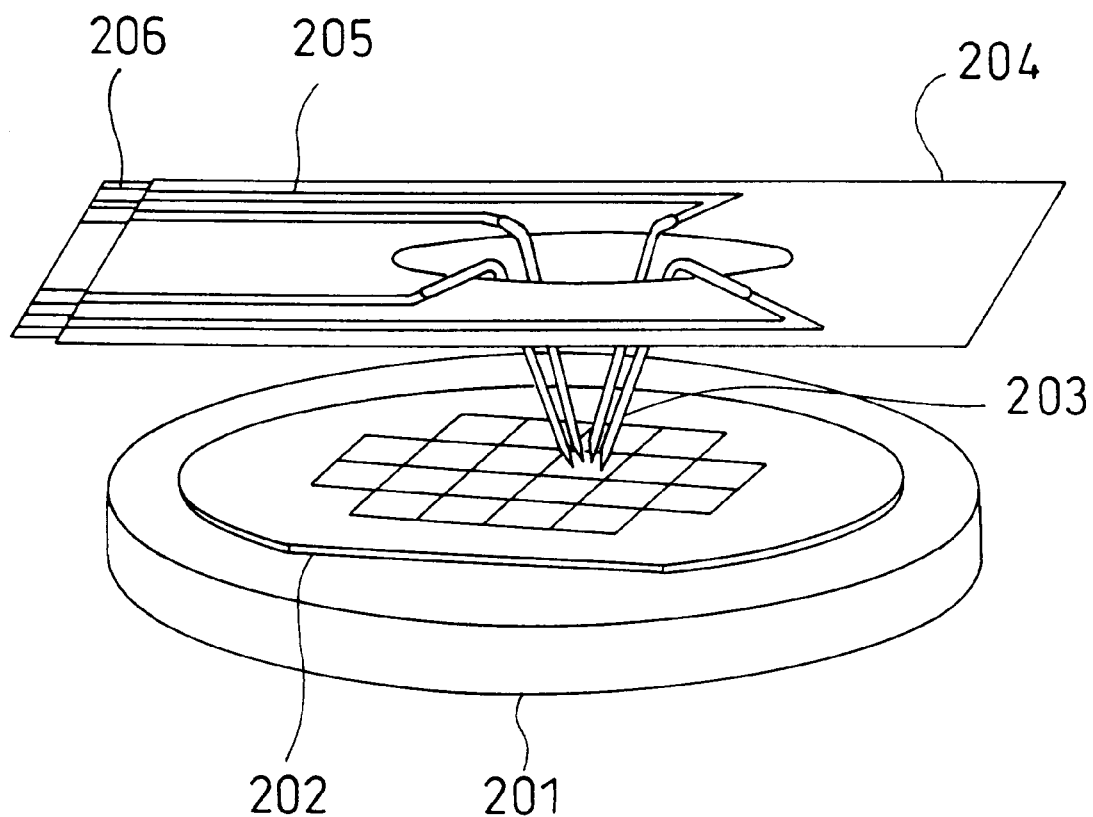
FIG. 32 is a perspective view showing a testing method of a first conventional semiconductor integrated circuit.
Figure 33:
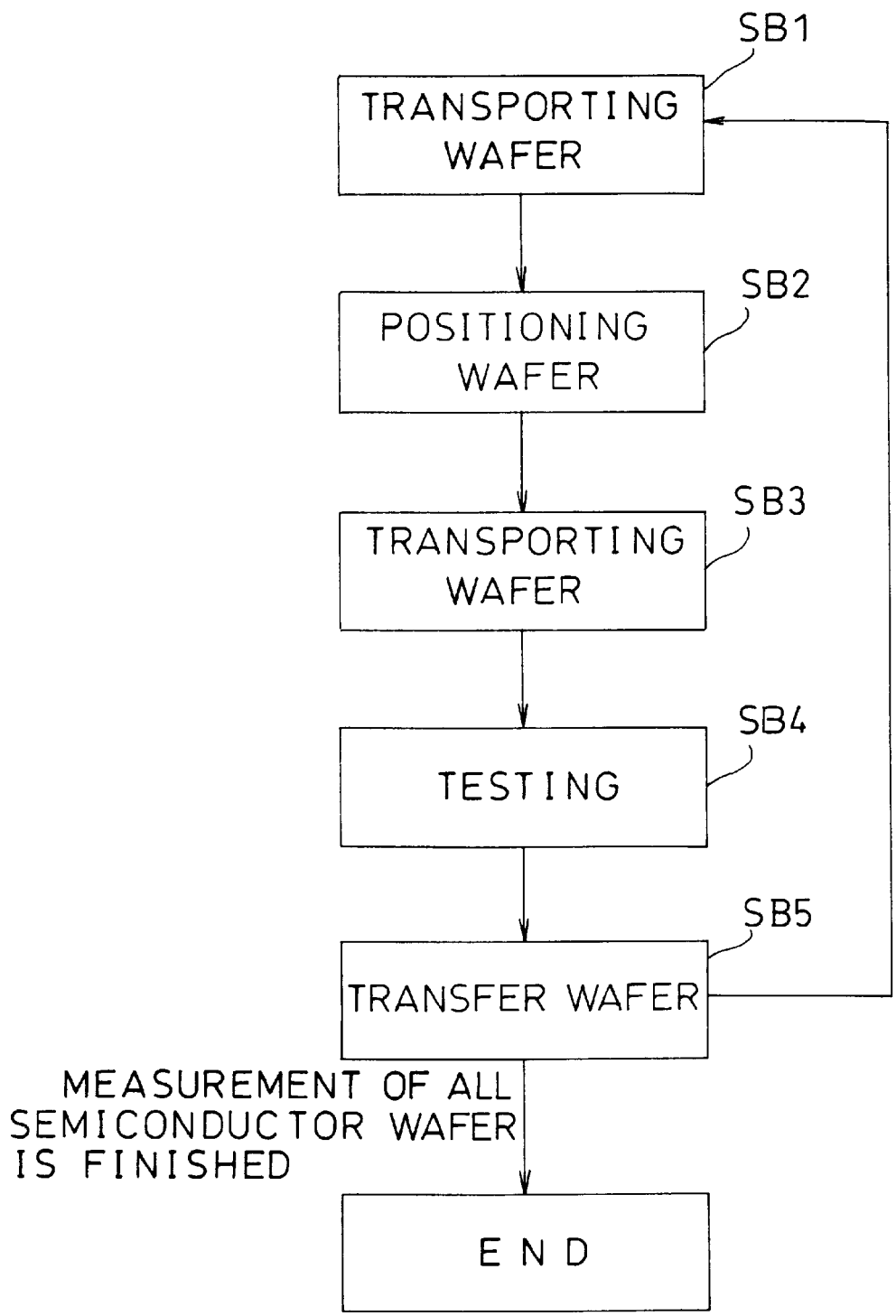
FIG. 33 is a flowchart showing the testing method of the first conventional semiconductor integrated circuit.
Figure 34A:
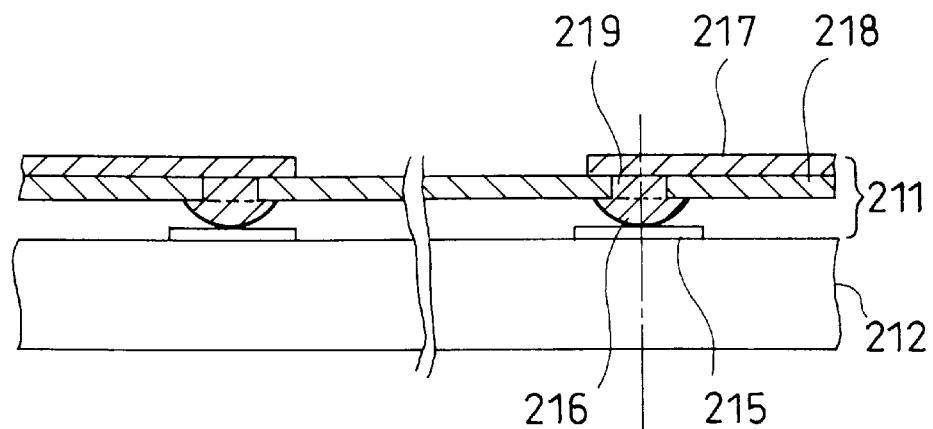
FIGS. 34(a) and 34(b) are cross-sectional views showing a testing method of a second conventional semiconductor integrated circuit.
Figure 34B:
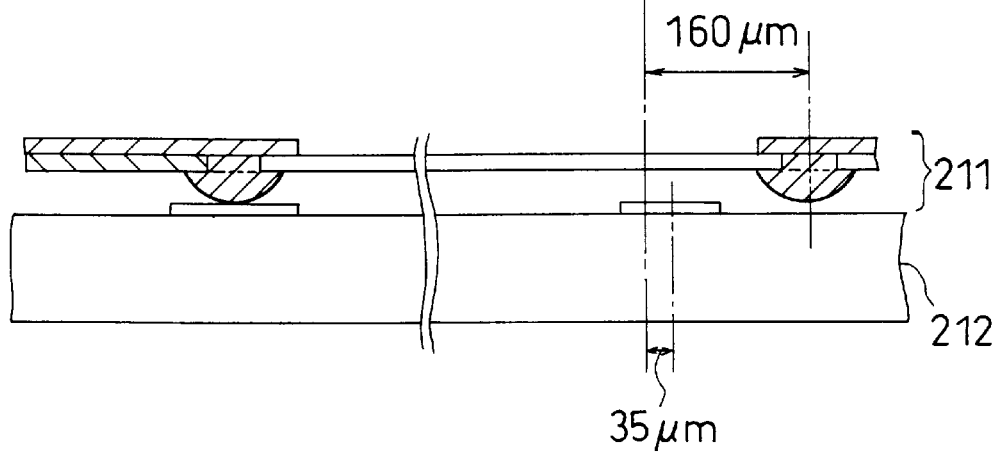
Figure 35:
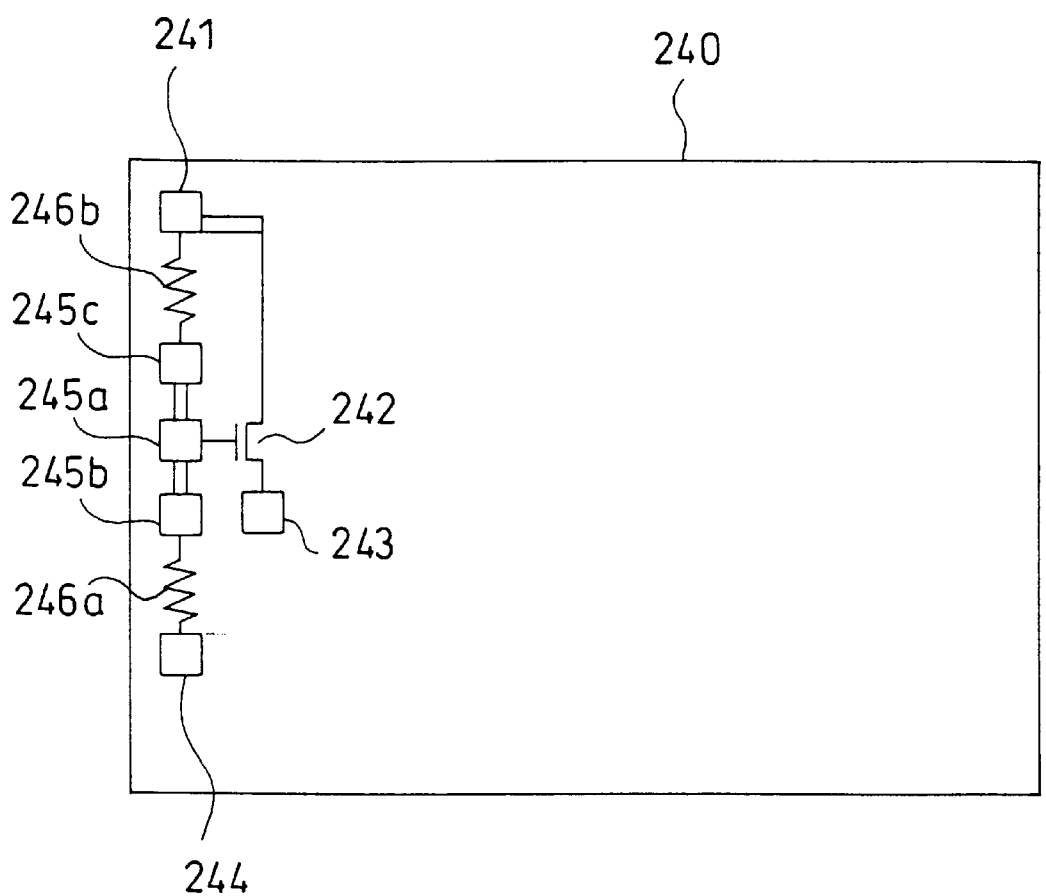
FIG. 35 is a plan view showing a testing method of a third conventional semiconductor integrated circuit.

FIG. 31(a) shows one example of the probe card. In FIG. 31(a), identical parts are denoted by the same reference numerals as those of FIG. 29 or FIGS. 30(a) and 30(b) are will be no more explained. FIG. 31(b) is a partially enlarged view showing a portion corresponding to one chip 182 in the probe card. In FIG. 31(b), a reference numeral 192 represents an electric power source wiring pattern, a reference numeral 193 represents a GND wiring pattern, a reference numeral 194 represents an exclusive signal line of each chip, reference numerals 195a–195d represent common signal lines of respective chips, and a reference numeral 196 represents bumps for connection to the semiconductor wafer 181.

The entire surface of semiconductor wafer 181 is probed simultaneously by pushing the probe card 187 against the semiconductor wafer 181 by the previously described method. In this case, as shown in FIG. 30(b), the non-conductive resin layer 185 is formed on the electric power source pad 184 of the defective chip 182 found in the previously-described wafer test prior to the burn-in screening. Thus, the bump 196 is no longer connected to the electric power source pad 184. Meanwhile, as shown in FIG. 30(a), the non-conductive resin layer 185 is not formed on the electric power source pad 184 of the non-defective chip 182. Hence, the bump 196 is connected to the electric power source pad 184, thereby supplying electric power to the chip 182. In this manner, even if the semiconductor wafer 181 comprises both defective and non-defective chips 182 mixed with each other, the burn-in screening can be applied to the non-defective chips 182 only.

As described in the foregoing description, before the burn-in screening is applied simultaneously to a plurality of chips formed on one semiconductor wafer using a probe means equipped with the common electric power source lines or signal lines of respective chips, the non-conductive resin layer is formed on the electric power source pad or the signal line pad of each defective chip found in the wafer test prior to the burn-in screening. Thus, it becomes possible to surely supply the non-defective chips with electric power source voltage or signal while isolating the defective chips from the electric power source voltage and signals.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A probe card for testing electrical characteristics of a plurality of semiconductor chips each including a testing electrode, said probe card comprising:

a flexible substrate comprising an elastic material and including a plurality of probe terminals formed on a face thereof which are to be electrically connected correspondingly to the respective testing electrodes of said plurality of semiconductor chips; and a rigid member comprising a material having a thermal expansion coefficient which is smaller than that of the flexible substrate, for fixing a periphery of the flexible substrate;

wherein the flexible substrate is fixed by the rigid member in such a state that the flexible substrate always remains flat and maintains almost uniform tensile distortion over the whole surface thereof within a temperature range from a room temperature to a testing temperature which is higher than the room temperature.

2. A probe card according to claim 1, wherein:

the rigid member includes a first terminal which is connected to an electrode for external connection via a wiring;

the flexible substrate includes a second terminal which is formed on a different face thereof from the face on which the probe terminals are formed and is electrically connected to the probe terminals; and wherein the flexible substrate is fixed by the rigid member so that the first terminal and the second terminal are electrically connected to each other.

3. A probe card according to claim 1, wherein a relation $N_1 < L_2/(L_1 \times T_1)$ is satisfied, where $N_1$ represents a difference between a thermal expansion coefficient of the semiconductor wafer and the thermal expansion coefficient of the rigid member, $L_1$ represents a diameter of the semiconductor wafer, $L_2$ represents a shorter diameter of the testing electrode and T represents a difference between the room temperature and the testing temperature.

4. A probe card according to claim 1, wherein the tensile distortion of the flexible substrate is not smaller than $T \times N_2$, where $N_2$ represents a difference between the thermal expansion coefficient of the flexible substrate and the thermal expansion coefficient of the rigid member and T represents a difference between the room temperature and the testing temperature.

5. A probe card according to claim 1, wherein the flexible substrate is fixed by the rigid member by bonding the flexible substrate to a bonding region in shape of a ring having an inner periphery of circle of the rigid member.

6. A probe card according to claim 1, wherein said rigid member comprises a wiring substrate.

7. A probe card according to claim 1, wherein said rigid member comprises a rigid ring.

8. A probe card according to claim 1, wherein said rigid member comprises a wiring substrate and a rigid ring.

* * * * *